(12) United States Patent
Cheng et al.

(10) Patent No.: US 12,300,723 B2
(45) Date of Patent: May 13, 2025

(54) TRANSISTOR INCLUDING DOWNWARD EXTENDING SILICIDE

(71) Applicant: Taiwan Semiconductor Manufacturing Co., Ltd., Hsinchu (TW)

(72) Inventors: Jung-Chien Cheng, Hsinchu (TW); Kuo-Cheng Chiang, Hsinchu (TW); Shi Ning Ju, Hsinchu (TW); Guan-Lin Chen, Hsinchu (TW); Bo-Rong Lin, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 441 days.

(21) Appl. No.: 17/704,882

(22) Filed: Mar. 25, 2022

(65) Prior Publication Data

US 2023/0134161 A1    May 4, 2023

Related U.S. Application Data

(60) Provisional application No. 63/275,347, filed on Nov. 3, 2021.

(51) Int. Cl.
*H01L 29/08*     (2006.01)
*H01L 29/06*     (2006.01)
*H01L 29/66*     (2006.01)

(52) U.S. Cl.
CPC ...... *H01L 29/0847* (2013.01); *H01L 29/0649* (2013.01); *H01L 29/0665* (2013.01); *H01L 29/665* (2013.01)

(58) Field of Classification Search
CPC ....... H01L 21/02603; H01L 21/823431; H01L 21/823821; H01L 21/845; H01L 27/0886; H01L 27/0924; H01L 27/1211; H01L 29/0649; H01L 29/0665; H01L 29/0669; H01L 29/0847; H01L 29/41791; H01L 29/66439; H01L 29/665; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2016/0276449 A1* | 9/2016 | Bae | H01L 29/42392 |

(Continued)

*Primary Examiner* — David C Spalla
(74) *Attorney, Agent, or Firm* — Seed IP Law Group

(57) ABSTRACT

An integrated circuit includes a transistor having a plurality of semiconductor nanostructures arranged in a stack and corresponding to channel regions of the transistor. The transistor includes a source/drain region in contact with the channel regions. The transistor includes a silicide that extends downward along a side of the source/drain region.

20 Claims, 35 Drawing Sheets

(56) References Cited

U.S. PATENT DOCUMENTS

2019/0074362 A1* 3/2019 Lee ................. H01L 29/775
2020/0279918 A1* 9/2020 Wu .................. H01L 21/02603
2022/0406938 A1* 12/2022 Paydavosi ............. H01L 29/775

* cited by examiner

TRANSISTOR INCLUDING DOWNWARD EXTENDING SILICIDE

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
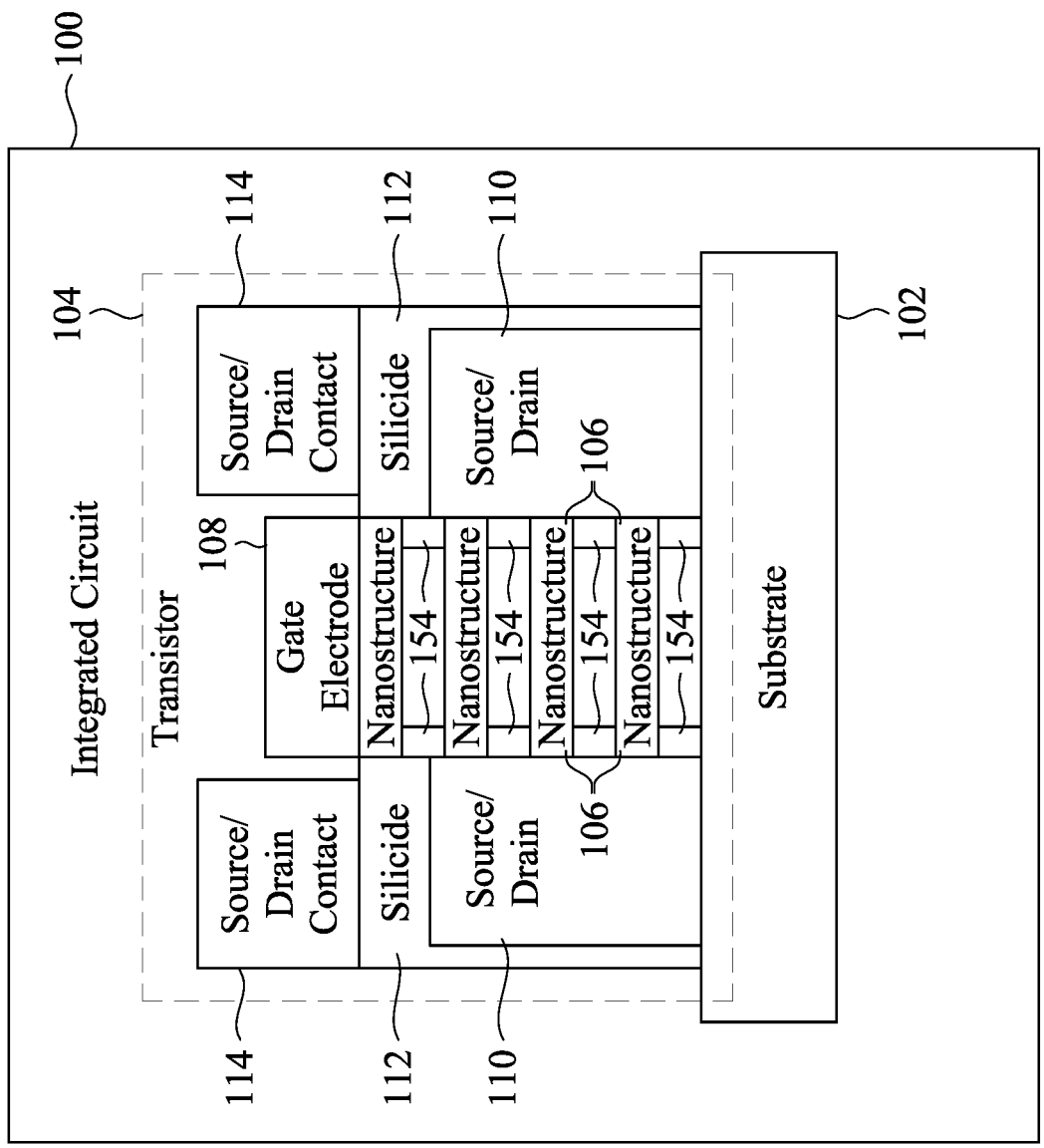
FIG. 1 is a block diagram of an integrated circuit 100, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions in contact with the nanostructures. A silicide is formed on the source/drain regions. Source/drain metallizations contact the silicide. The silicide extends downward along the lateral surfaces of the source/drain regions, rather than being positioned only on the top of the source/drain regions. Because the silicide extends downward along the source/drain regions, there is a relatively small distance between each nanostructure and the silicide.

The configuration of the source/drain regions and the silicide provides several benefits. First, the electrical resistance between the lowest nanostructures and the silicide is greatly reduced with respect to configurations in which the silicide is formed only at the top of the source/drain regions, resulting in reduced power consumption. Second, a large number of nanostructures can be formed without negatively impacting the electrical resistance between lower nanostructures and the silicide. With larger numbers of nanostructures, currents can be conducted through nanostructure transistors without generating excessive amounts of heat. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

FIG. 1 is a block diagram of an integrated circuit 100, in accordance with some embodiments. The integrated circuit 100 includes a semiconductor substrate 102. The integrated circuit also includes a transistor 104 above the semiconductor substrate 102. As set forth in more detail below, the integrated circuit 100 utilizes silicides that extend downward alongside source/drain regions to improve the performance of the transistor 104.

The transistor 104 includes semiconductor nanostructures 106, a gate electrode 108, and source/drain regions 110. A silicide 112 is in contact with the source/drain regions 110. Source/drain contacts 114 are in contact with the silicide 112. The semiconductor nanostructures 106 act as channel regions of the transistor 104. The transistor 104 can be operated by applying voltages to the gate electrode 108 and the source/drain contacts 114 in order to enable or prevent current flowing through the semiconductor nanostructures 106 between the source/drain regions 110.

The semiconductor nanostructures 106 each extend between the source/drain regions 110. The semiconductor nanostructures 106 may also be termed semiconductor nanosheets 106, though other types of semiconductor nanostructures can be utilized without departing from the scope of the present disclosure. The semiconductor nanostructures 106 can include a monocrystalline semiconductor material such as silicon, silicon germanium, or other semiconductor materials. The semiconductor nanostructures 106 may be an intrinsic semiconductor material or may be a doped semiconductor material. The semiconductor nanostructures may include nanosheets, nanowires, or other types of nanostructures. The semiconductor nanostructures 106 are stacked channels of the transistor 104.

The gate electrode 108 includes one or more conductive materials. The gate electrode 108 can include one or more of tungsten, aluminum, titanium, tantalum, copper, gold, or other conductive materials. The gate electrode 108 can surround the nanostructures 106 such that each semiconductor nanostructure 106 extends through the gate electrode 108 between the source/drain regions 110. Though not shown in FIG. 1, a gate dielectric surrounds the nanostructures 106 and acts as a dielectric sheath between the nanostructures 106 and the gate electrode 108. Accordingly, the transistor 104 may be considered nanostructure transistor, such as gate all around transistor, nanosheet transistor, nanowire transistor, multi bridge channel transistor, nanoribbon transistor, etc. While examples illustrated herein primarily utilized nanostructure transistors, other types of transistors can be utilized without departing from the scope of the present disclosure.

The transistor 104 includes source/drain regions 110. There is a respective source/drain region 110 on each end of the semiconductor nanostructures 106. The left source/drain region 110 physically connects to the left ends of the semiconductor nanostructures 106. The right source/drain region 110 physically connects to the right ends of the semiconductor nanostructures 106. The source/drain regions 110 can include semiconductor material such as silicon or silicon germanium doped with N-type dopants species or P-type dopant species depending on the type of the transistor 104.

The transistor 104 includes inner spacers 154. The inner spacers 154 are dielectric regions that physically separate the gate electrode 108 from the source/drain regions 110. In this way, the source/drain regions 110 cannot become shorted with the gate electrode 108. The inner spacers 154 can include silicon nitride, SiCN, SiOCN, or other suitable dielectric materials.

The silicide 112 acts as an interface between the semiconductor material of the source/drain region 110, and the metal of the source/drain contacts 114. The silicide 112 includes both the semiconductor material of the source/drain region 110 and a metal. As such, the silicide 112 may include nickel silicide, titanium silicide, cobalt silicide, or other types of silicide. The silicide 112 is highly conductive compared to the source/drain regions 110. Further details of the silicide 112 will be discussed below.

The source/drain contacts 114 are metal plugs or conductive vias by which voltages are applied to the source/drain regions 110. The source/drain contacts 114 can include tungsten, aluminum, titanium, copper, or other suitable conductive materials. The source/drain contacts 114 are positioned above the source/drain regions 110. The source/drain contacts 114 are in direct contact with the silicide 112. Accordingly, the source/drain contacts 114 apply voltages to the source/drain regions 110 via the silicide 112. Similarly, currents flow between the source/drain contacts 114 and the source/drain regions 110 via the silicide 112.

The semiconductor nanostructures 106 are arranged in a vertical stack above the substrate 102. A vertically lowest nanostructure 106 corresponds to the semiconductor nanostructure 106 closest to the substrate 102. A vertically highest nanostructure 106 is closest to the source/drain contacts 114. In one example, when the transistor 104 is enabled, current flows from the source/drain contact 114 on the right, through the silicide 112 on the right, through the source/drain region 110 on the right, through each of the semiconductor nanostructures 106, through the source/drain region 110 on the left, through the silicide 112 on the left, to the source/drain contact 114 on the left.

Current that flows through the bottom semiconductor nanostructure 106 has a longer path than current that flows to the top semiconductor nanostructure 106. In a situation in which the silicide 112 does not extend downward along the lateral edge of the source/drain regions 110, then current that flows through the bottom semiconductor nanostructure 106 will take a relatively long path through the source/drain regions 110. The source/drain regions 110 are not as conductive as the silicide 112. Accordingly, a longer path through the source/drain regions 106 corresponds to a larger electrical resistance, greater power dissipation, and greater heat generation. However, the transistor 104 of FIG. 1 includes silicide 112 that extends downward along the lateral edge of the source/drain regions 110. The result is that there is a relatively small distance between the lowest semiconductor nanostructures 106 and the silicide 112. Because the silicide 112 is highly conductive compared to the source/drain regions 110, current that flows through the lowest nanostructures 106 will primarily flow through the path of least resistance downward through the silicide 112 and then laterally to the lowest nanostructures 106. This reduces the overall resistance, power dissipation, and heat generation in comparison to a situation in which the silicide 112 is positioned only and the tops of the source/drain regions 110.

FIG. 1 illustrates four semiconductor nanostructures 106. However, the configuration of the silicide 112 enables the use of more semiconductor nanostructures 106 without undue electrical resistance and corresponding power dissipation and heat generation. Accordingly, the transistor 104 can include larger numbers of semiconductor nanostructures 106 than shown in FIG. 1. However, the transistor 104 can include fewer or more semiconductor nanostructures 106 than shown in FIG. 1 without departing from the scope of the present disclosure.

In some embodiments, the source/drain regions 110 are each formed in a trench with a conformal epitaxial growth process. The conformal growth process grows the source/drain regions 110 on the sidewalls of the trenches in contact with either side of the semiconductor nanostructures 106. The timing of the conformal growth process is carefully selected to ensure that the source/drain regions 110 do not entirely fill the trenches. After the conformal growth process of the source/drain regions 110, the silicide 112 is formed on the exposed surfaces of the source/drain regions 110. Because the source/drain regions 110 do not entirely fill their respective trenches, the silicide 112 can be formed within the trench on the lateral surfaces of the source/drain regions 110 extending downward into the trenches. The result is that the silicide 112 extends downward into the trenches so that the lower semiconductor nanostructures 106 are still relatively close to the silicide 112. Other processes can be utilized for forming the source/drain regions 110 and the silicide 112 without departing from the scope of the present disclosure.

FIGS. 2A-3I are cross-sectional views of an integrated circuit 100 at various stages of processing, according to some embodiments. FIGS. 2A-3I illustrate an exemplary process for producing an integrated circuit that includes nanostructure transistors. FIGS. 2A-3I illustrate how these transistors can be formed in a simple and effective process in accordance with principles of the present disclosure. Other process steps and combinations of process steps can be utilized without departing from the scope of the present disclosure. The transistors can include gate all around transistors, multi-bridge transistors, nanostructure transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIGS. 2A-3I also each include axes that indicate the orientation of the cross-sectional view of that figure. The axes include lateral axes X and Y, and vertical axis Z. All axes are mutually orthogonal with each other. Figures in which the X-axis goes from right to left will be referred to as "X-Views". Figures in which the Y-axis goes from right to left will be referred to as "Y-Views".

Figure 2B:
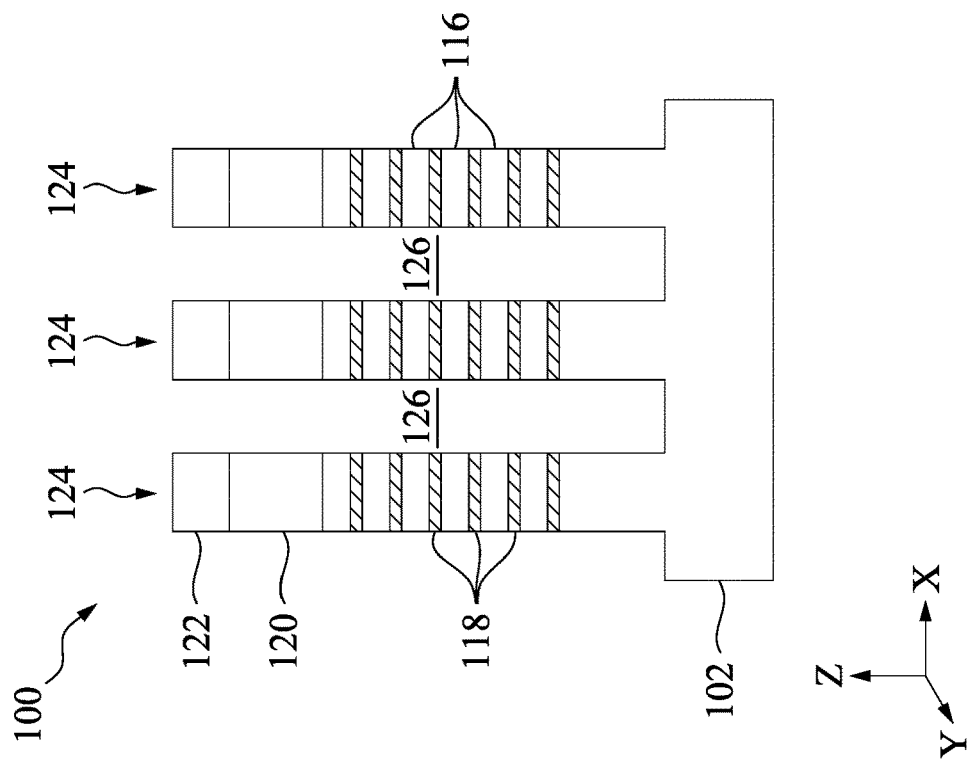
FIGS. 2A-3I are cross-sectional views of an integrated circuit, at various stages of processing, in accordance with some embodiments.
Figure 2A:
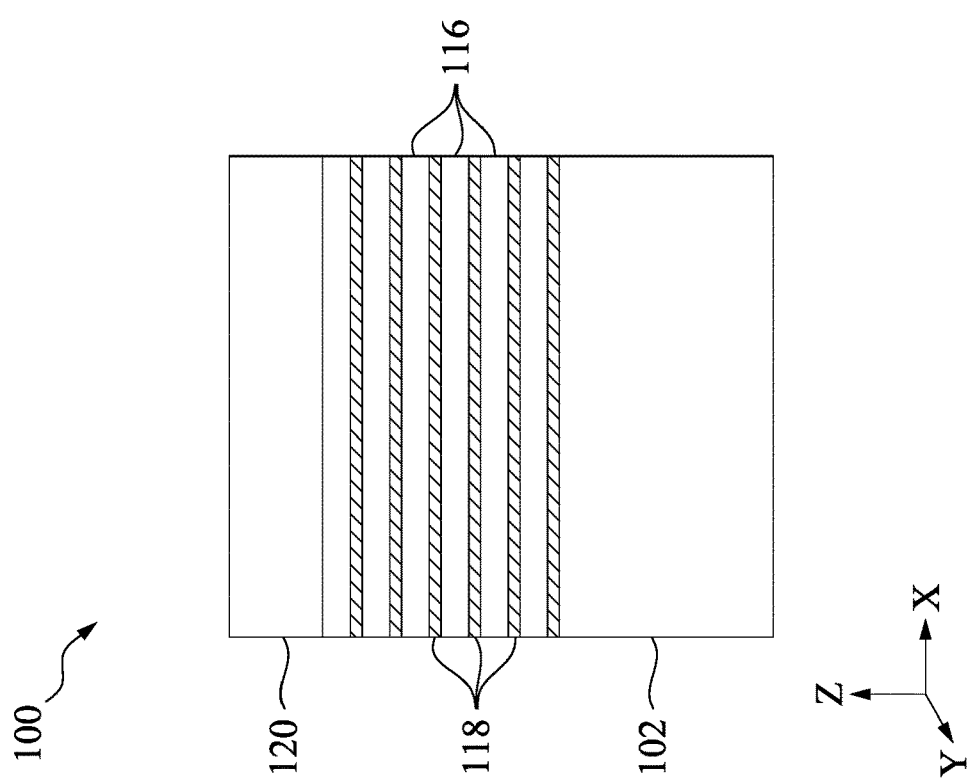

FIG. 2A is an X-view of the integrated circuit 100, in accordance with some embodiments. In FIG. 2A the integrated circuit 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The integrated circuit 100 includes a plurality of semiconductor layers 116. The semiconductor nanostructures 106 are layers of semiconductor material. The semiconductor layers 116 are formed over the substrate 102. The semiconductor layers 116 may include one or more layers of Si, Ge, SiGe, GaAs, InSb, GaP, GaSb, InAlAs, InGaAs, GaSbP, GaAsSb or InP. In some embodiments, the semiconductor layers 116 are the same semiconductor material as the substrate 102. Other semiconductor materials can be utilized for the semiconductor layers 116 without departing from the scope of the present disclosure. In a primary non-limiting example described herein, the semiconductor layers 116 and the substrate 102 are silicon.

The integrated circuit 100 includes a plurality of sacrificial semiconductor layers 118 positioned between the semiconductor layers 116. The sacrificial semiconductor layers 118 include a different semiconductor material than the semiconductor layers 116. In an example in which the semiconductor layers 116 include silicon, the sacrificial semiconductor layers 118 may include SiGe. In one example, the silicon germanium sacrificial semiconductor layers 118 may include between 20% and 30% germanium, though other concentrations of germanium can be utilized without departing from the scope of the present disclosure. The concentration of germanium in the silicon germanium sacrificial semiconductor layers 118 is selected to be different than the concentration of germanium in a subsequently formed SiGe sacrificial cladding. The compositions of the sacrificial semiconductor layers 118 and the sacrificial cladding are selected to result in different etching characteristics. The purpose and benefits of this will be described in further detail below.

In some embodiments, the semiconductor layers 116 and the sacrificial semiconductor layers 118 are formed by alternating epitaxial growth processes from the semiconductor substrate 102. For example, a first epitaxial growth process may result in the formation of the lowest sacrificial semiconductor nanostructure 106 on the top surface of the substrate 102. A second epitaxial growth process may result in the formation of the lowest semiconductor layer 116 on the top surface of the lowest sacrificial semiconductor nanostructure 106. A third epitaxial growth process results in the formation of the second lowest sacrificial semiconductor layer 118 on top of the lowest semiconductor layer 116. Alternating epitaxial growth processes are performed until a selected number of semiconductor layers 116 and sacrificial semiconductor layers 118 have been formed.

A layer 120 is formed on top of the uppermost semiconductor layer 116. The layer 120 can be a same semiconductor material as the sacrificial semiconductor layers 118. Alternatively, the layer 120 can include a dielectric material or other types of materials. In FIG. 2A, there are six semiconductor layers 116. However, in practice, there may be more or fewer semiconductor layers 116 than six.

The vertical thickness of the semiconductor layers 116 can be between 2 nm and 15 nm. The thickness of the sacrificial semiconductor layers 118 can be between 5 nm and 15 nm. Other thicknesses and materials can be utilized for the semiconductor layers 116 and the sacrificial semiconductor layers 118 without departing from the scope of the present disclosure.

In some embodiments, the sacrificial semiconductor layers 118 correspond to a first sacrificial epitaxial semiconductor region having a first semiconductor composition. In subsequent steps, the sacrificial semiconductor layers 118 will be removed and replaced with other materials and structures. For this reason, the layers 118 are described as sacrificial. As will be described further below, the semiconductor layers 116 will be patterned to form semiconductor nanostructures 106 of transistors 104.

FIG. 2B is an X-view of the integrated circuit 100, in accordance with some embodiments. In FIG. 2B, trenches 126 have been formed in the sacrificial semiconductor layers 118, the semiconductor layers 116, and in the substrate 102. The trenches 126 define three fins 124 stacks or semiconductor layers 116 and sacrificial semiconductor layers 118. The trenches 126 can be formed by depositing a hard mask layer 122 on the layer 120. The hard mask layer 122 is patterned and etched using standard photolithography processes. After the hard mask layer 122 has been patterned and etched, the sacrificial semiconductor layers 118, the semiconductor layers 116, and the substrate 102 are etched at the locations that are not covered by the hard mask layer 122. The etching process results in formation of the trenches 126. The etching process can include a single etching step. Alternatively, the etching process can include multiple etching steps. For example, a first etching step can etch the top sacrificial semiconductor nanostructure. A second etching step can etch the top semiconductor layer 116. These alternating etching steps can repeat until all of the sacrificial semiconductor layers 118 and semiconductor layers 116 and the etched at the exposed regions. The final etching step may etch the substrate 102.

The hard mask layer 122 can include one or more of aluminum, AlO, SiN, or other suitable materials. The hard mask layer 122 can have a thickness between 5 nm and 50 nm. The hard mask layer 122 can be deposited by a PVD process, an ALD process, a CVD process, or other suitable deposition processes. The hard mask layer 122 can have other thicknesses, materials, and deposition processes without departing from the scope of the present disclosure.

Figure 2D:
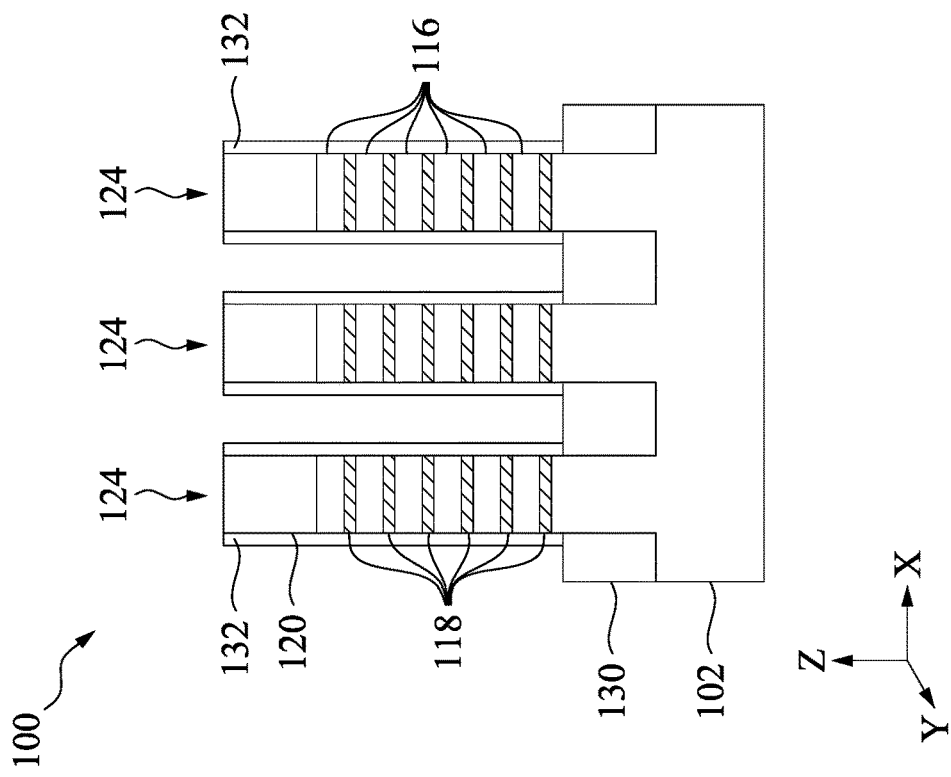
Figure 2C:
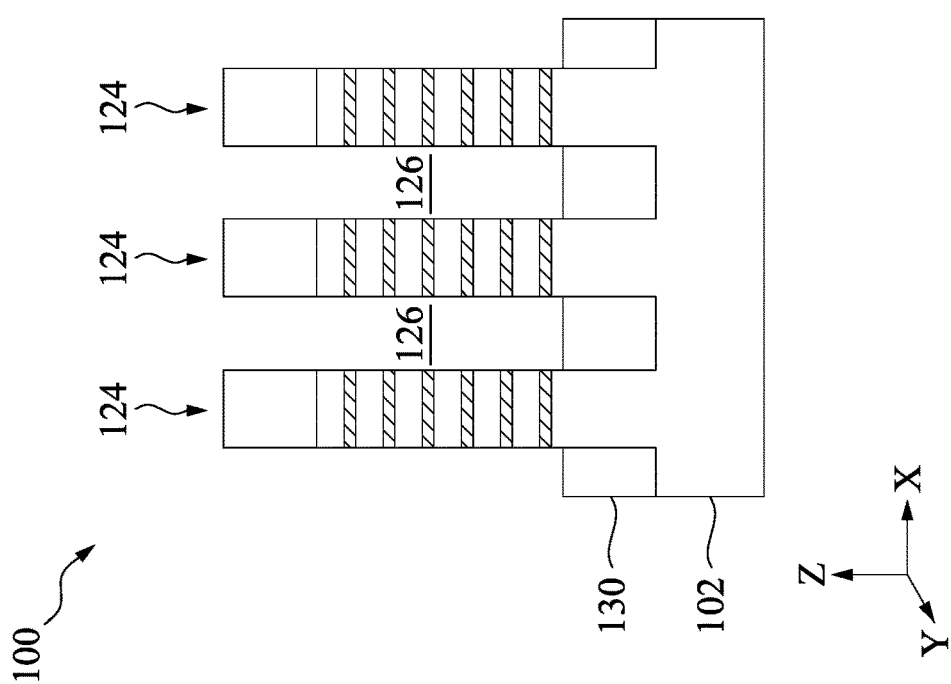

FIG. 2C is an X-view of the integrated circuit 100, in accordance with some embodiments. In FIG. 2C, shallow trench isolation regions 130 have been formed in the trenches 126. The shallow trench isolation regions can be formed by depositing a dielectric material in the trenches 126 and by recessing the deposited dielectric material so that a top surface of the dielectric material is lower than the lowest sacrificial semiconductor layer 118. The hard mask layer 122 has also been removed.

The shallow trench isolation regions 130 can be utilized to separate individual transistors or groups of transistors groups of transistors formed in conjunction with the semiconductor substrate 102. The dielectric material for the shallow trench isolation regions 130 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma enhanced-CVD or flowable CND. Other materials and structures can be utilized for the shallow trench isolation regions 130 without departing from the scope of the present disclosure.

FIG. 2D is an X-view of the integrated circuit 100, in accordance with some embodiments. In FIG. 2D, a cladding layer 132 has been deposited on the on the sides of the semiconductor layers 116 and the sacrificial semiconductor layers 118 and on the hard mask layer 122. The cladding layer 132 can be formed by an epitaxial growth from the semiconductor layers 116, the sacrificial semiconductor layers 118, and the hard mask layer 120. Alternatively, the cladding layer 132 can be deposited by a chemical vapor deposition (CVD) process. Other processes can be utilized for depositing the cladding layer 132 without departing from the scope of the present disclosure.

In some embodiments, the cladding layer 132 includes SiGe. In particular, the cladding layer 132 includes SiGe with a different concentration of germanium than the sacrificial semiconductor layers 118. The cladding layer 132 can include other concentrations, materials, or compositions without departing from the scope of the present disclosure.

Figure 2F:
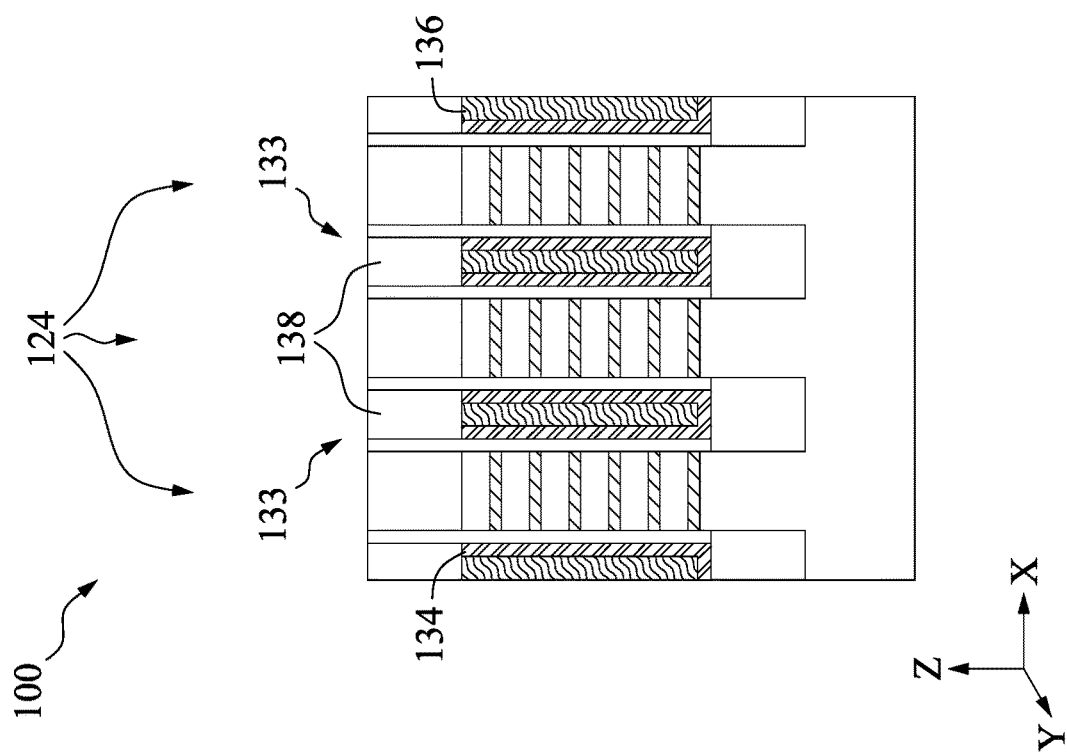
Figure 2E:
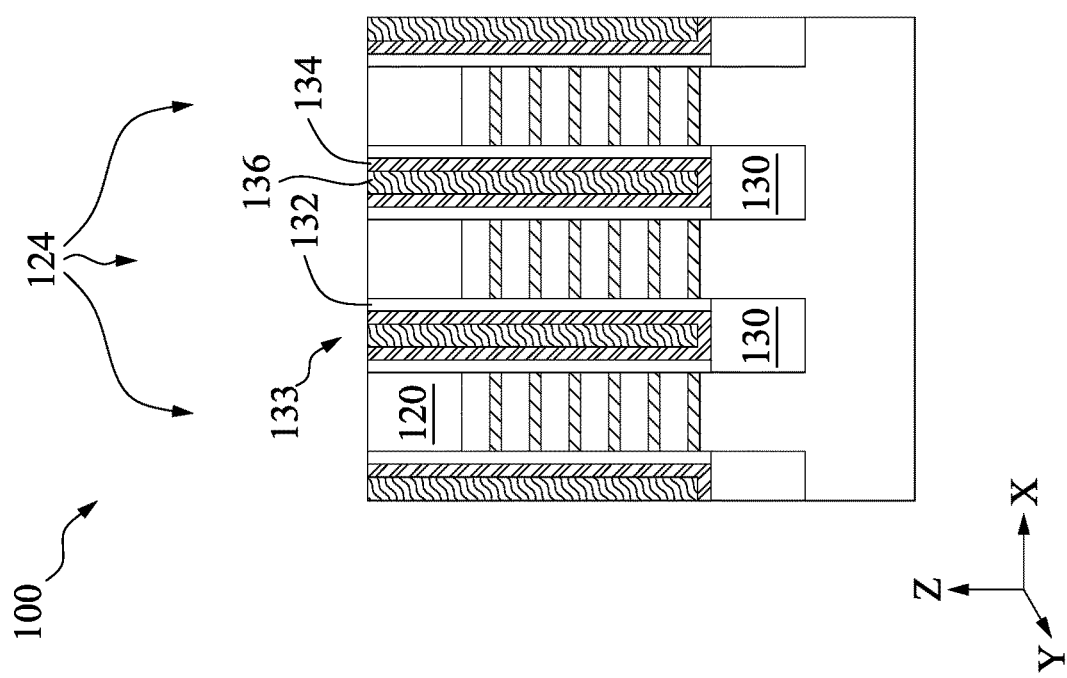

FIG. 2E is an X-view of the integrated circuit 100, in accordance with some embodiments. In FIG. 2E, hybrid fin structures 133 have been formed in the gaps between the cladding layers 132. The hybrid fin structures 133 include a dielectric layer 134 and a dielectric layer 136. In some embodiments, the dielectric layer 134 includes silicon nitride. In some embodiments, the dielectric layer 136 includes silicon oxide. The dielectric layer 134 can be deposited on the shallow trench isolation 130 and on the sidewalls of the cladding layer 132. The dielectric layer 136 can be deposited on the dielectric layer 134 in the trenches filling the remaining space between the fins 124. The dielectric layer 134 in the dielectric layer 136 can be deposited by CVD, by atomic layer deposition (ALD), or by other suitable deposition processes. After deposition of the dielectric layers 134 and 136, the hybrid fin structures 133 are planarized by a chemical mechanical planarization (CMP) process. Other materials and deposition processes can be utilized to form the hybrid fin structures 133 without departing from the scope of the present disclosure.

FIG. 2F is an X-view of the integrated circuit 100, in accordance with some embodiments. In FIG. 2F an etching process has been performed to recess the top surface of the hybrid fin structures 133. In particular, a timed etch is performed to reduce the top surface of the hybrid fin structures 133 to a level lower than the bottom of the layer 120. The second etching process can include a wet etch, dry etch, or any suitable etch for recessing the hybrid fin structures 133 to a selected depth.

In FIG. 2F, a dielectric layer 138 has been deposited on the hybrid fin structures 133. In one embodiment, the dielectric layer 138 can include a high-K dielectric material. The dielectric layer 138 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The dielectric layer 138 can include materials other than a high-K dielectric material. The dielectric layer 138 may be formed by CVD, ALD, or any suitable method. The planarization process, such as a CMP process, has been performed to planarize the top surface of the dielectric layer 138. The dielectric layer 138 may be termed a helmet layer for the hybrid fin structures 133. Other processes and materials can be utilized for the dielectric layer 138 without departing from the scope of the present disclosure.

Figure 2H:
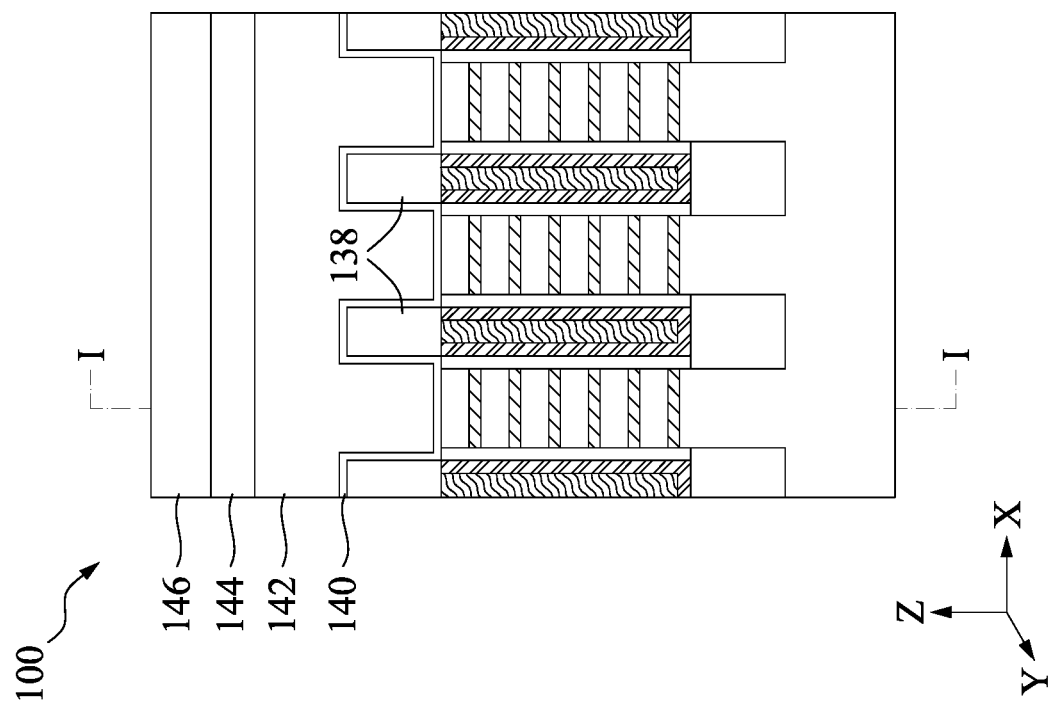
Figure 2G:
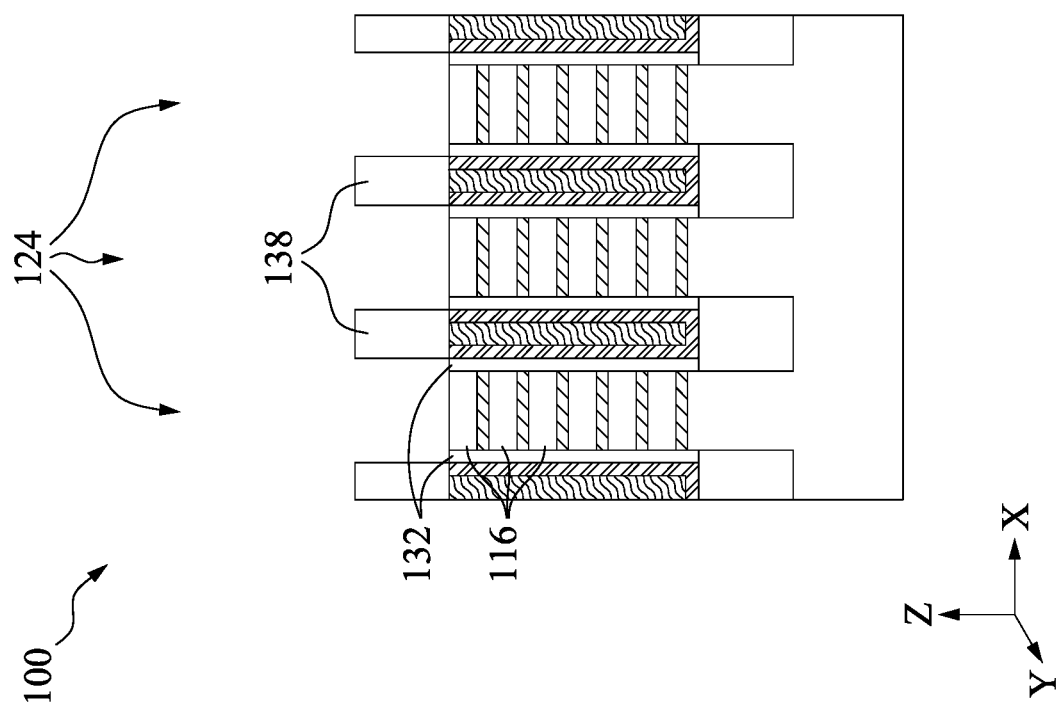

FIG. 2G is an X-view of the integrated circuit 100, in accordance with some embodiments. In FIG. 2G an etching process has been performed to remove the layer 120 and to recess the cladding layer 132. The etching process can be performed in one or more steps. The one or more steps selectively etch the layer 120 and the materials of the cladding layer 132 and the sacrificial semiconductor layers 118 with respect to the material of the dielectric layer 138. Accordingly, in FIG. 2G the dielectric layer 138 remains protruding above substantially unchanged while other layers have been recessed or removed. The one or more etching steps can include wet etches, dry etches, timed etches, or other types of etching processes.

FIG. 2H is an X-view of the integrated circuit 100, in accordance with some embodiments. In FIG. 2H a thin dielectric layer 140 has been deposited on the top surface of the cladding layer 132, the top semiconductor layer 116, and on the dielectric layer 138. The thin dielectric layer 140 can be between 1 nm and 5 nm in thickness. The thin dielectric layer 140 can include silicon oxide. Other materials, deposition processes, and thicknesses can be utilized for the thin dielectric layer 140 without departing from the scope of the present disclosure.

In FIG. 2H a layer of polysilicon 142 has been deposited on the dielectric layer 140. The layer of polysilicon 142 can have a thickness between 20 nm and 100 nm. The layer polysilicon 142 can be deposited by an epitaxial growth, a CVD process, a physical vapor deposition (PVD) process, or an ALD process. Other thicknesses and deposition processes can be used for depositing the layer polysilicon 142 without departing from the scope of the present disclosure.

In FIG. 2H a dielectric layer 144 has been deposited on the layer of polysilicon 142. A dielectric layer 146 has been formed on the dielectric layer 144. In one example, the dielectric layer 144 includes silicon nitride. In one example, the dielectric layer 146 includes silicon oxide. The dielectric layers 144 and 146 can be deposited by CVD. The dielectric layer 144 can have a thickness between 5 nm and 15 nm. The dielectric layer 146 can have a thickness between 15 nm and 50 nm. Other thicknesses, materials, and deposition processes can be utilized for the dielectric layers 144 and 146 without departing from the scope of the present disclosure.

The dielectric layers 144 and 146 have been patterned and etched to form a hard mask for the layer of polysilicon 142. The dielectric layers 144 and 146 can be patterned and etched using standard photolithography processes. After the dielectric layers 144 and 146 have been patterned and etched to form the hard mask, the layer polysilicon 142 is etched so that only the polysilicon directly below the dielectric layers 144 and 146 remains. The result is a polysilicon fin.

Figure 2I:
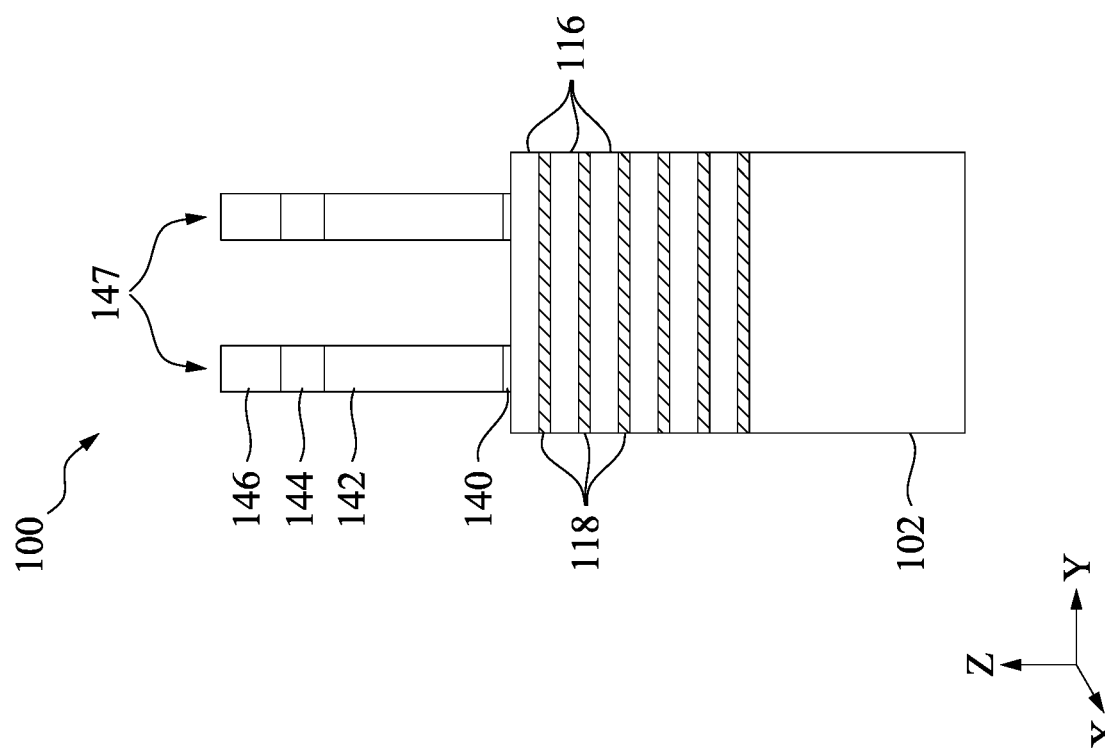

FIG. 2I is a Y-view of the integrated circuit 100, in accordance with some embodiments. The view of FIG. 2I is taken along cut lines I from FIG. 2H. In FIGS. 2A-2H the X-axis is the lateral axis going left to right on the drawing sheet, while the Y-axis goes in and out of the sheet. In FIG. 2J, the Y-axis is the lateral axis going left to right on the sheet, while the X-axis goes in and out of the sheet.

In FIG. 2I, the layers 146, 144, 142, and 140 have been patterned and etched to form dummy gate structures 147. Formation of the dummy gate structures 147 can be accomplished using standard photolithography processes including forming a photoresist mask in the desired pattern of the dummy gate structures 147 and then performing an etching process in the presence of the mask. The photolithography process can also include formation of a hard mask.

FIG. 2J is a Y-view of the integrated circuit 100, in accordance with some embodiments. In FIG. 2J, a gate spacer layer 148 has been deposited on the sidewalls of the layer of polysilicon 142 and the dielectric layers 144 and 146. In one example, the gate spacer layer 148 includes SiCON. The gate spacer layer 148 can be deposited by CVD, PVD, or ALD. Other materials and deposition processes can be utilized for the gate spacer layer 148 without departing from the scope of the present disclosure.

In FIG. 2J the semiconductor layers 116 and the sacrificial semiconductor layers 118 have been etched using the dummy gate structures 147 as a mask. In particular, a trench 150 has been formed through the semiconductor layers 116 and the sacrificial semiconductor layers 118. The trench 150 extends into the substrate 102. From this point forward, the remaining portions of the semiconductor layers 116 will be referred to as semiconductor nanostructures 106. The remaining portions of the sacrificial semiconductor layers 118 will be referred to as sacrificial semiconductor nanostructures 151.

Each dummy gate structure 147 corresponds to a position at which a transistor 104 will be formed. More particularly, gate electrodes 108 will eventually be formed in place of the dummy gate structures 147 and the sacrificial semiconductor nanostructures 151. Each stack of semiconductor nanostructures 106 will correspond to the channel regions of a respective transistor 104. The Y-view of FIG. 2J illustrates the locations of two transistors 104. The two transistors 104 will share a common source/drain region 110 as will be set forth in further detail below.

Figure 2K:
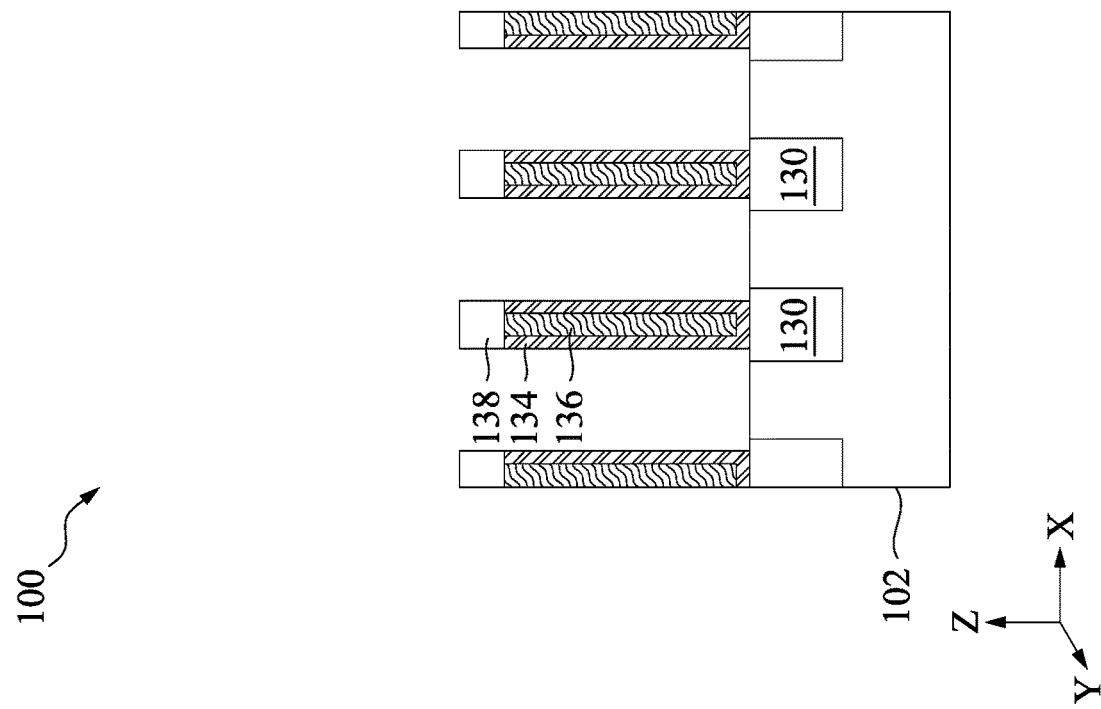
Figure 2J:
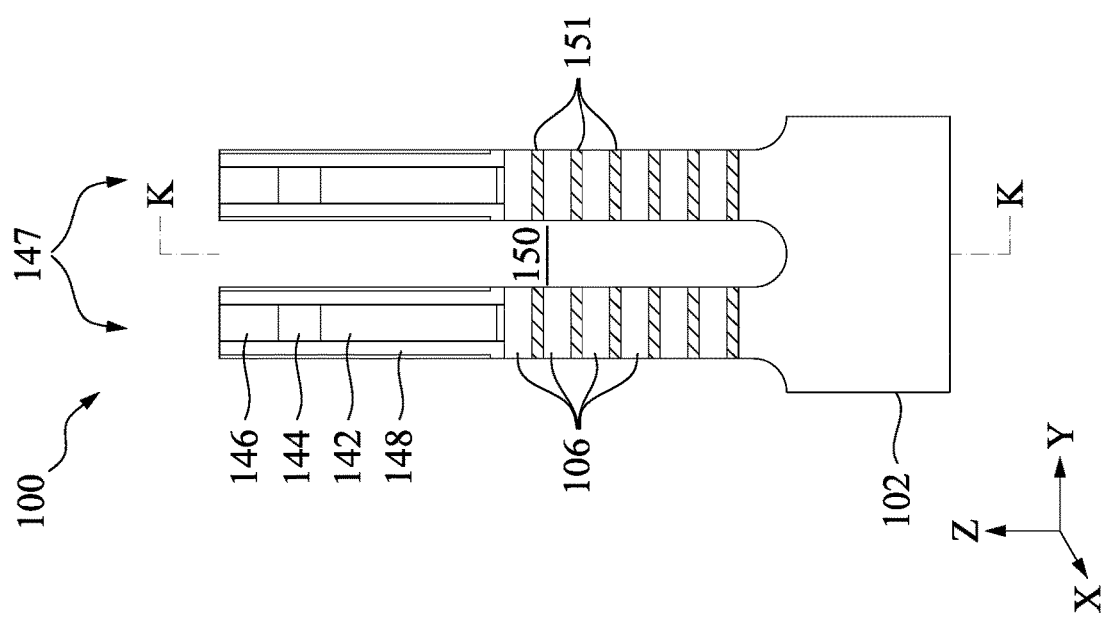

FIG. 2K is an X-view of the integrated circuit 100, in accordance with some embodiments. FIG. 2K corresponds to the second X-view taken along cut lines K from FIG. 2J. The view of FIG. 2K illustrates the hybrid fin structures 133 between which source/drain regions 110 will be formed. The shallow trench isolation regions 130 are also visible in the view of FIG. 2K.

Figure 2M:
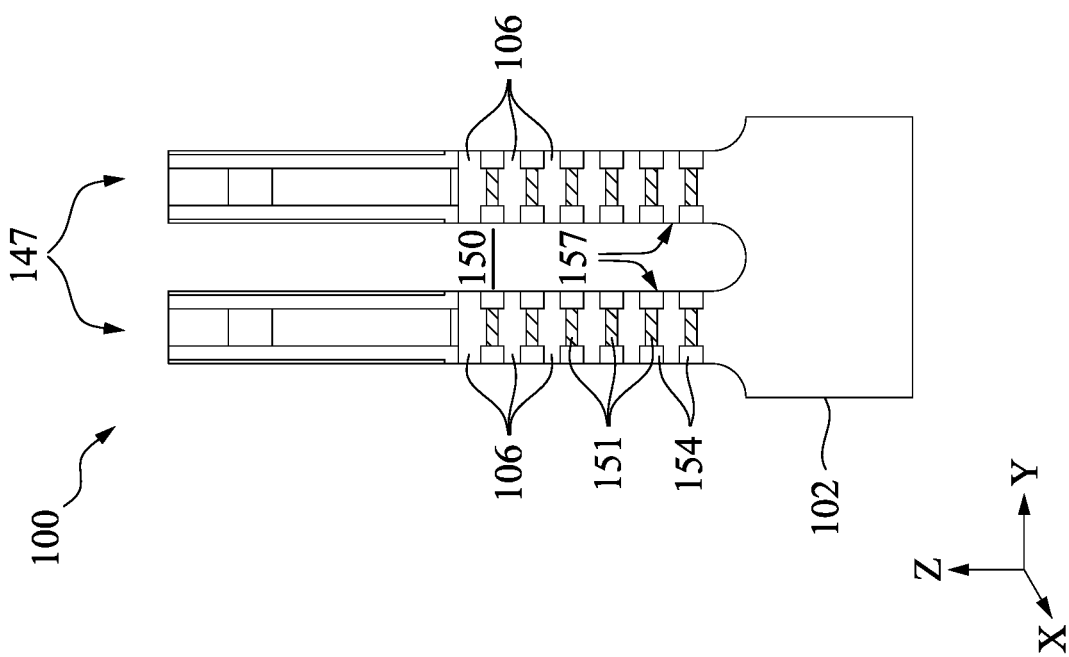
Figure 2L:
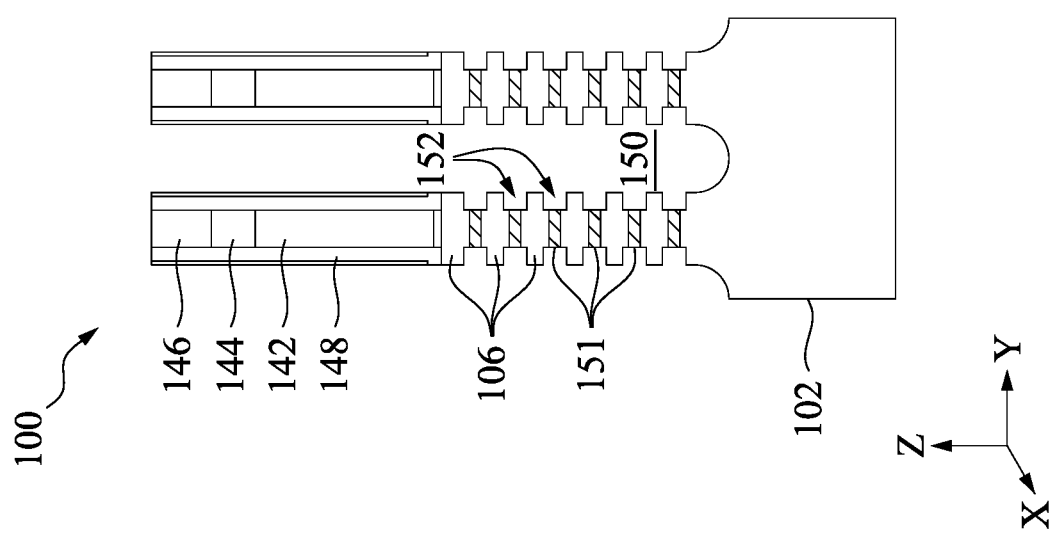

FIG. 2L is a Y-view of the integrated circuit 100, in accordance with some embodiments. In FIG. 2L an etching process has been performed to form recesses 152 in the sacrificial semiconductor nanostructures 151 with respect to the semiconductor nanostructures 106. The etching process can be performed by a chemical bath that selectively etches the sacrificial semiconductor nanostructures 151 with respect to the semiconductor nanostructures 106. The etching process is timed so that the sacrificial semiconductor nanostructures 151 are recessed but not entirely removed. The recessing process is utilized to enable the formation of an inner spacer layer between the semiconductor nanostructures 106 at the locations where the sacrificial semiconductor nanostructures 151 have been recessed FIG. 2M is a Y-view of the integrated circuit 100, in accordance with some embodiments. In FIG. 2M, inner spacers 154 has been deposited between the semiconductor nanostructures 106. The inner spacers 154 are formed in the recesses 152. The inner spacers 154 can be deposited by an ALD process, a CVD process, or other suitable processes. In one example, the inner spacers 154 includes silicon nitride, SiO2, SiCON etc.

The trench 150 has first and second sidewalls 157. The first side wall 157 may correspond to the left side of the trench 150. The second side wall 157 may correspond to the right side of the trench 150. The semiconductor nanostructures 106 under the left dummy gate 147 make up a portion of the left side wall 157 of the trench 150. The semiconductor nanostructures 106 under the right dummy gate 147 make up a portion of the right side wall 157 of the trench 150.

Figure 2O:
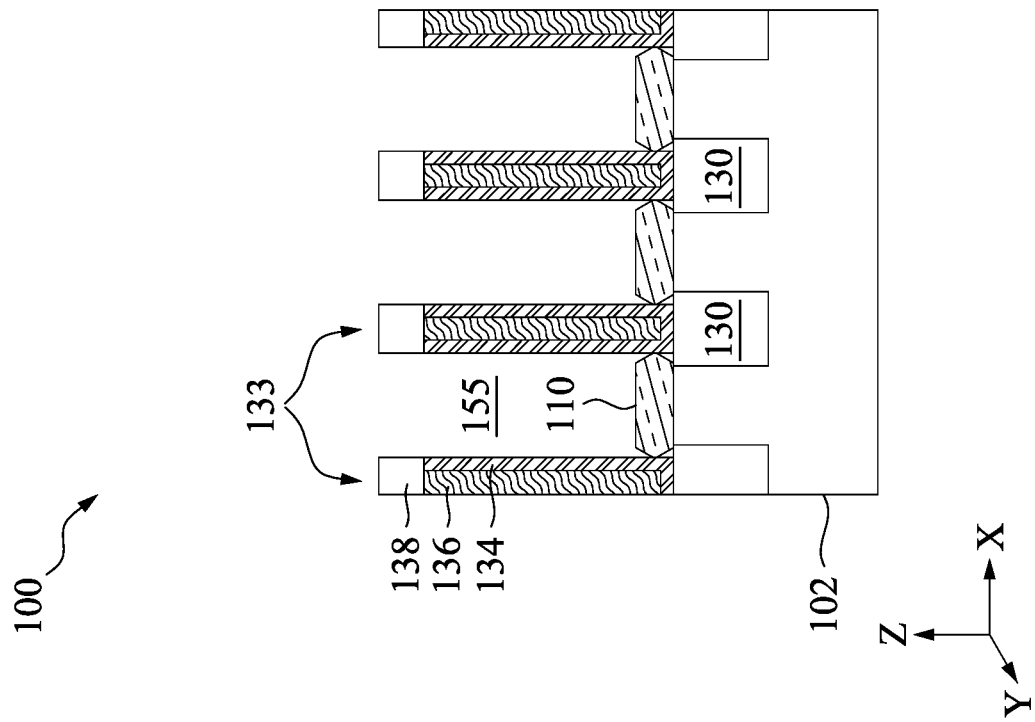
Figure 2N:
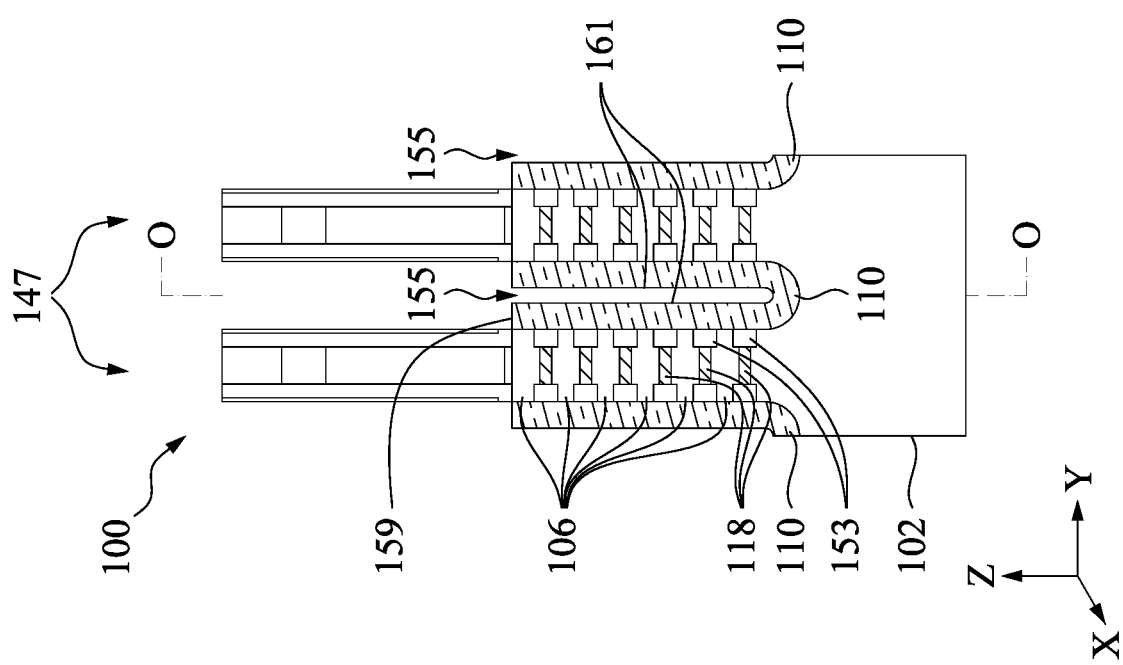

FIG. 2N is an X-view of the integrated circuit 100, in accordance with some embodiments. In FIG. 2N source/drain regions 110 have been formed. The source/drain regions 110 include semiconductor material. The source/drain regions 110 can be epitaxially grown from the semiconductor nanostructures 106 and from the substrate 102. The source/drain regions 110 can be doped with N-type dopants species in the case of N-type transistors. The source/drain regions 110 can be doped with P-type dopant species in the case of P-type transistors. The doping can be performed in-situ during the epitaxial growth. The source/drain regions 110 can have a uniform thickness of between 2 nm and 10 nm. In some cases, the source/drain regions 110 may be thicker on the bottom of the trenches 150 than on the sidewalls of the trenches 150. In some cases, the source/drain regions 110 may be between one and 10 times thicker on the bottom of the trenches 150 than on the sidewalls of the trenches 150. The source/drain regions 110 are in direct contact with the semiconductor nanostructures 106.

In some embodiments, the source/drain regions 110 are conformally deposited in the trenches 150. The conformal deposition causes the source/drain regions 110 to be formed with substantially uniform thickness on the sidewalls of the trenches 150 and on the substrate 102 at the bottom of the trenches 150. The duration of the conformal deposition process is selected to ensure that the trenches 150 are not entirely filled. Instead, a gap 155 remains between vertical portions of the source/drain regions 110. The width of the gap 155 in the Y direction is between 1 nm and 10 nm. The depth of the gap 155 in the Z direction is between 10 nm and 100 nm. The depth of the gap 155 in the Z direction is based, in part, on the number of semiconductor nanostructures 106 utilized for the transistors 104. A larger number of semiconductor nanostructures 106 will result in a deeper trench 150 and a correspondingly deeper gap 155. The source/drain regions 110 and the U-shaped cross-section as shown in FIG. 2N. The source/drain regions 110 can have different dimensions, shapes, materials, and deposition processes than described above without departing from the scope of the present disclosure.

The central source/drain region 110 is positioned on both sidewalls 157 of the trench 150. Furthermore, the source/drain region 110 has a top surface 159 and side surfaces 161. The side surfaces 161 define and bound the central gap 155.

FIG. 2O is an X-view of the integrated circuit 100 taken along cut lines O of FIG. 2N, in accordance with some embodiments. The view of FIG. 2O illustrates the source/drain regions 110 at the bottom of the trenches 150 between adjacent hybrid fin structures 133.

Figure 2Q:
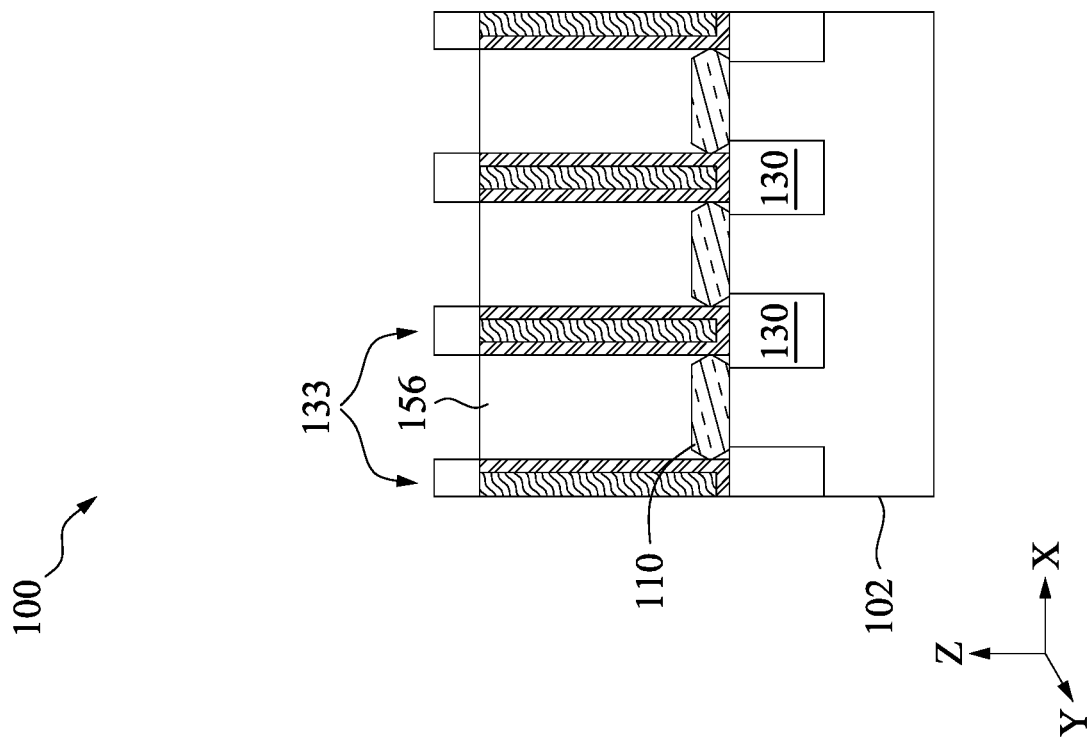
Figure 2P:
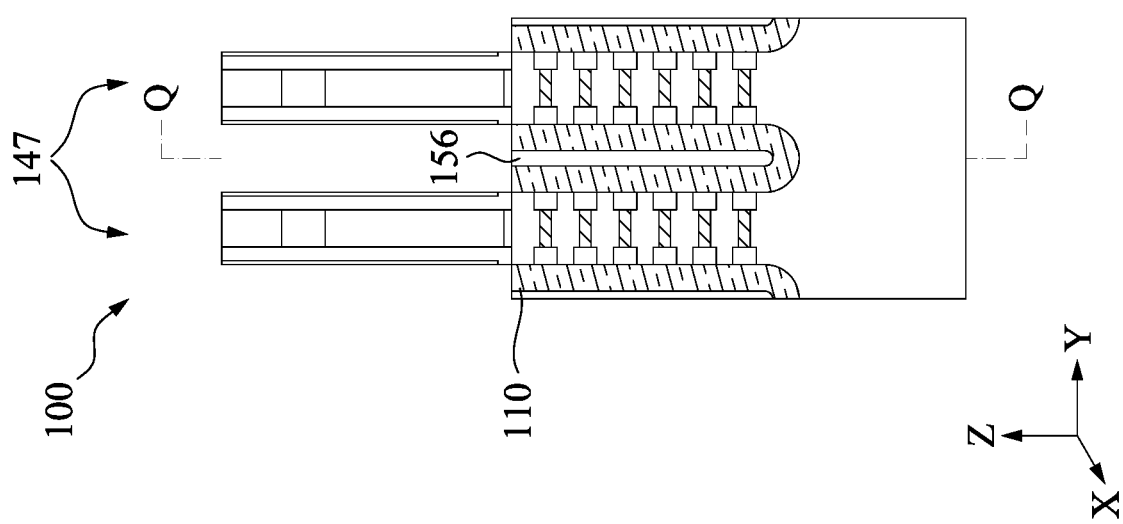

FIG. 2P is a Y-view of the integrated circuit 100, in accordance with some embodiments. In FIG. 2P, a dummy material 156 has been formed in the gaps 155 between adjacent portions of the source/drain regions in the trenches 150. The dummy material 156 can include aluminum oxide. The dummy material 156 may correspond to a dielectric material that will be replaced by silicide 112, as will be described in more detail below. The dummy material 156 may be deposited by CVD, ALD, PVD, or other deposition processes. Other materials and processes can be utilized for the dummy material 156 without departing from the scope of the present disclosure.

FIG. 2Q is an X-view of the integrated circuit 100 taken along cut lines Q of FIG. 2P, in accordance with some embodiments. FIG. 2Q illustrates the dielectric material 156 between hybrid fin and adjacent hybrid fin structures 133.

Figure 2S:
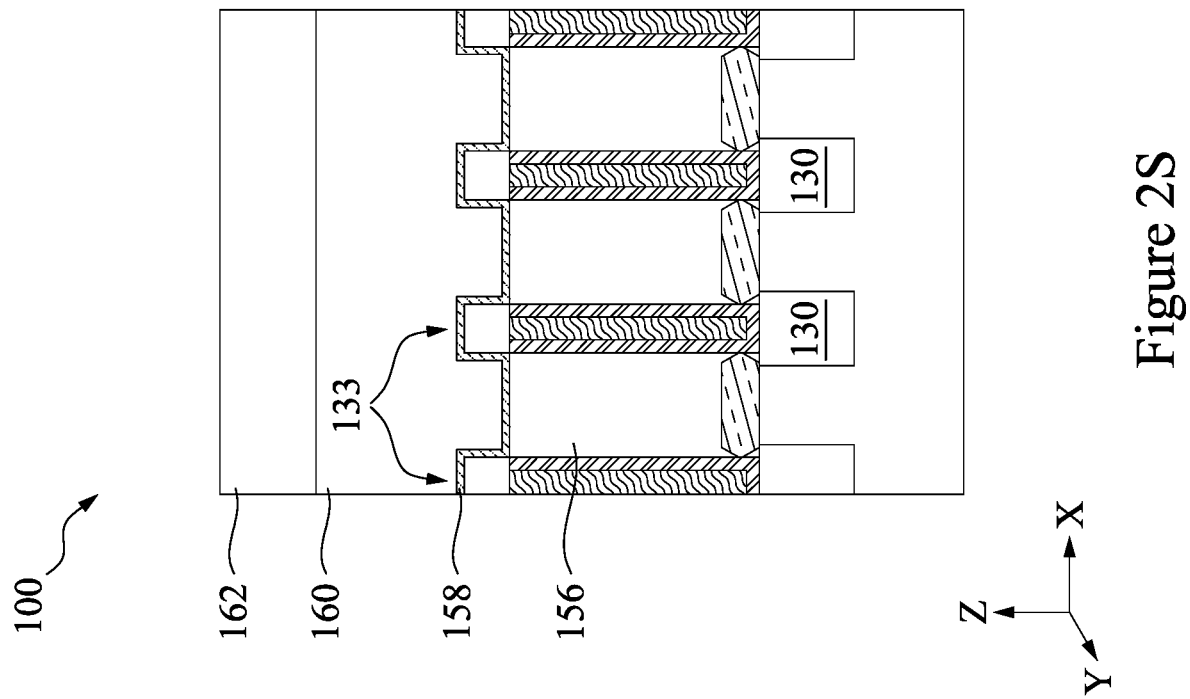
Figure 2R:
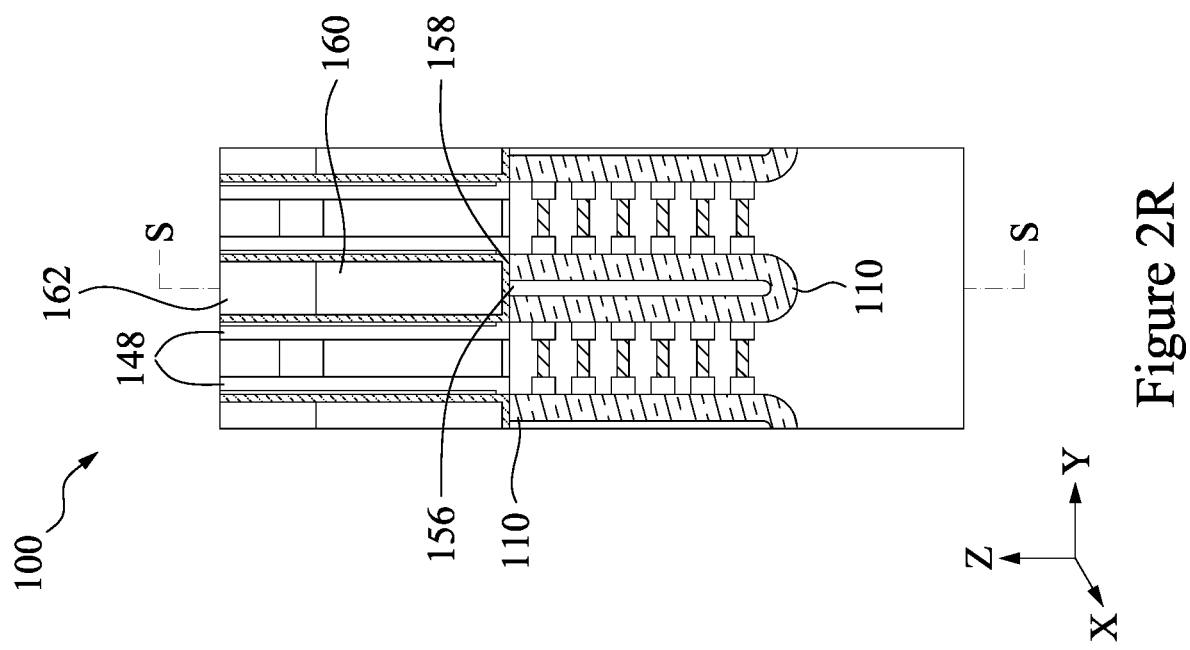

FIG. 2R as is a Y-view of the integrated circuit 100, in accordance with some embodiments. A dielectric layer 158 has been deposited on sidewalls of the gate spacer layers 148 and on top of the source/drain regions 110 and the dielectric material 156. The dielectric layer 158 can include silicon nitride or another suitable material and can be deposited by ALD, CVD, or PVD. A dielectric layer 160 has been deposited on the dielectric layer 158. A dielectric layer 160 can include silicon oxide or another suitable material and can be deposited by ALD, CVD, or PVD. The dielectric layer 162 has been deposited on the dielectric layer 158 and 160. The dielectric layer 162 can include silicon nitride, SiCON, or other suitable dielectric materials can be deposited by ALD, CVD, or PVD. Other materials and deposition processes can be utilized for the dielectric layers 158, 160, and 162 without departing from the scope of the present disclosure.

FIG. 2S is an X-view of the integrated circuit 100 taken along cut lines X of FIG. 2R, in accordance with some embodiments. The view of FIG. 2S illustrates that the dielectric layers 158, 160, and 162 have been deposited on the hybrid fin structures 133.

Figure 2U:
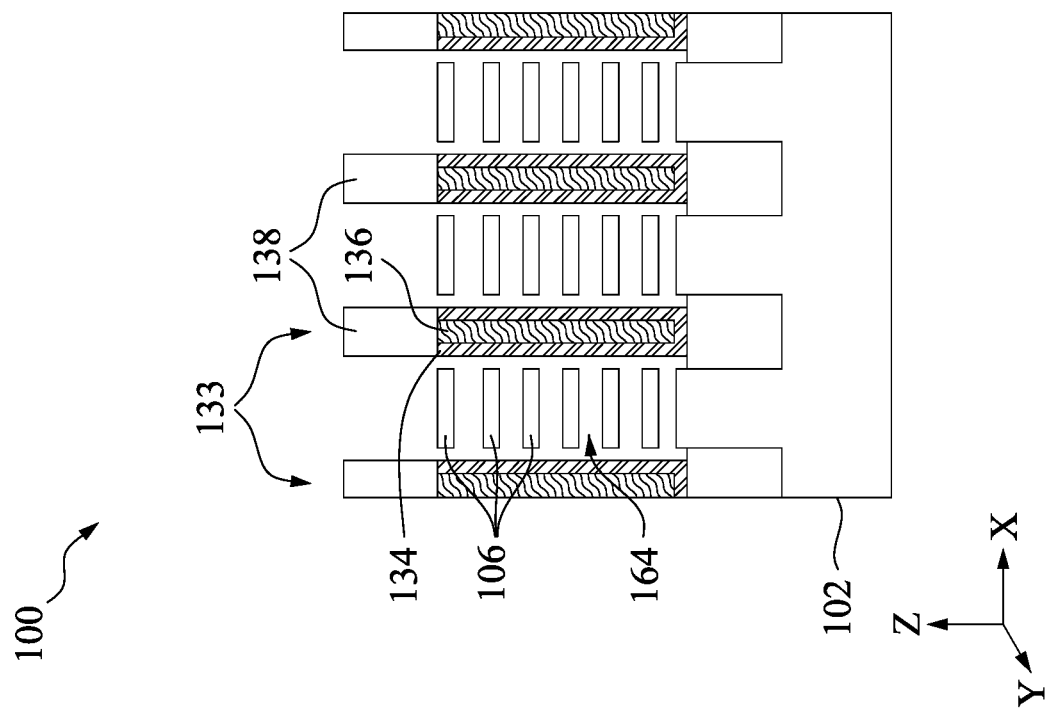
Figure 2T:
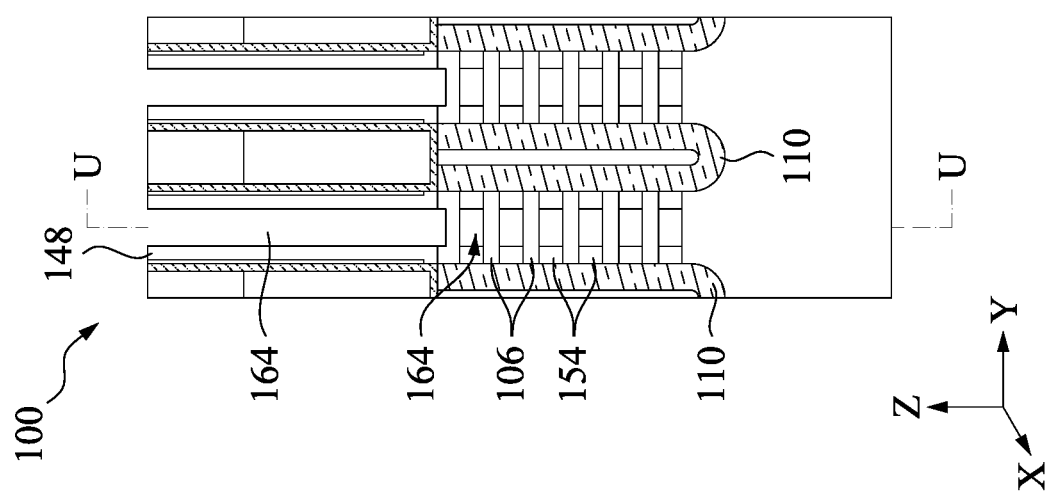

FIG. 2T is a Y-view of the integrated circuit 100, in accordance with some embodiments. In FIG. 2T, the dummy gates 147 have been removed. The removal of the dummy gates 147 leaves the gate spacers 148. The removal of the dummy gates 147 can be accomplished and multiple etching steps. The multiple etching steps may first remove the dielectric layer 146, then the dielectric layer 144, then the polysilicon layer 142, then the dielectric layer 140. Various other processes can be performed to remove the dummy gate structures 147 without departing from the scope of the present disclosure.

In FIG. 2T, the sacrificial semiconductor nanostructures 151 have been removed. The sacrificial semiconductor nanostructures 151 can be removed after removal of the dummy gates 157. The sacrificial semiconductor nanostructures 151 can be removed with an etching process that selectively etches the sacrificial semiconductor nanostructures 151 with respect to the semiconductor nanostructures 106 and the inner spacers 154. Removal of the dielectric layers 146, 144, 142, 140 and the semiconductor nanostructures 151 result in a void 164 above the nanostructures 106 and between the semiconductor nanostructures 106. The cladding layer 132 may also be removed while removing the sacrificial semiconductor nanostructures 151. Alternatively, the cladding layer 132 may be removed in a separate etching process. Various other processes can be utilized to remove the sacrificial semiconductor nanostructures 151 without departing from the scope of the present disclosure.

FIG. 2U corresponds to an X-view of the integrated circuit 100 taken along cut lines U from FIG. 2T. The view of FIG. 2U illustrates the void 164 extending between sacrificial semiconductor nanostructures 106.

Figure 2W:
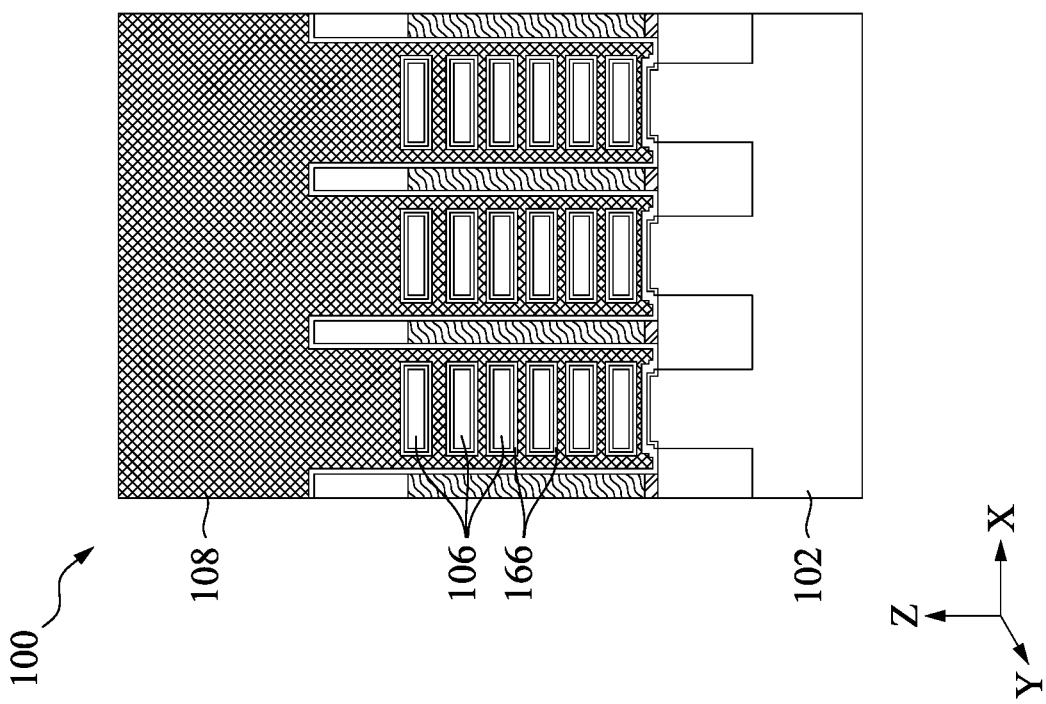
Figure 2V:
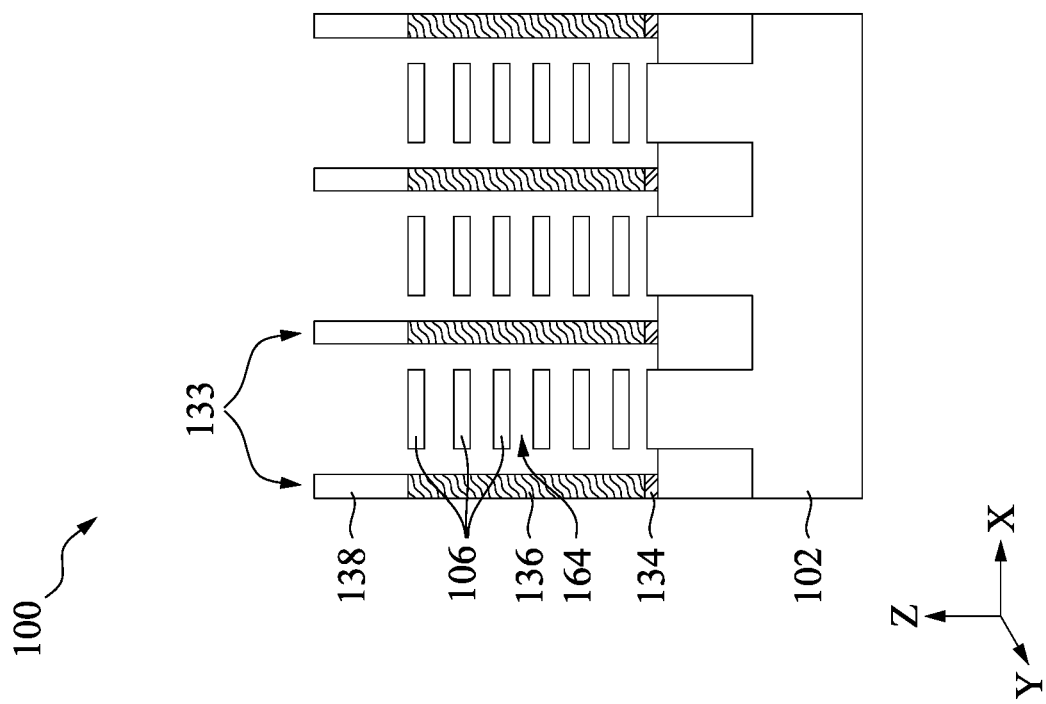

FIG. 2V corresponds to the X-view of FIG. 2U, in accordance with some embodiments. In FIG. 2V, an etching processes been performed to widen the void 164 along the X direction. The etching process can include reducing the width of the hybrid fin structures 133 by thinning the dielectric layer 138, substantially removing the dielectric layer 134, and thinning the dielectric layer 136. The dielectric layer 134 remains only directly below the dielectric layer 136. The etching process can include patterning a mask on the hybrid fin structures 133 and etching the hybrid fin structures 133 in the presence of the mask. Other processes can be utilized to widen the voids 164 without departing from the scope of the present disclosure.

FIG. 2W is an X-view of the integrated circuit 100, in accordance with some embodiments. In FIG. 2W, a gate dielectric 166 has been deposited on the exposed surfaces of the semiconductor nanostructures 106. The gate dielectric 166 may include multiple dielectric layers. For example, the gate dielectric 166 may include an interfacial dielectric layer that is in direct contact with the semiconductor nanostructures 106. The gate dielectric 166 may include a high-K gate dielectric layer positioned on the interfacial dielectric layer. Together, the interfacial dielectric layer and the high-K gate dielectric layer form a gate dielectric for the gate all around nanostructure transistors.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the nanostructures 106 for gate metals, as will be explained in more detail below. Other materials, deposition processes, and thicknesses can be utilized for the interfacial dielectric layer without departing from the scope of the present disclosure.

The high-K gate dielectric layer and the interfacial dielectric layer physically separate the semiconductor nanostructures 106 from the gate metals that will be deposited in subsequent steps. The high-K gate dielectric layer and the interfacial dielectric layer isolate the gate metals from the semiconductor nanostructures 106 that correspond to the channel regions of the transistors.

The high-K gate dielectric layer includes one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In some embodiments, the high-K gate dielectric layer is formed using a highly conformal deposition process such as ALD in order to ensure the formation of a gate dielectric layer having a uniform thickness around each semiconductor nanostructure 106. In some embodiments, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

After deposition of the gate dielectric 166, a gate electrode 108 is formed by depositing a gate metal in the voids 164. The gate electrode 108 surrounds the semiconductor nanostructures 106. In particular, the gate electrode 108 is in contact with the gate dielectric 166. The gate electrode 108 is positioned between semiconductor nanostructures 106. In other words, the gate electrode 108 is positioned all around the semiconductor nanostructures 106. For this reason, the transistors formed in relation to the semiconductor nanostructures 106 are called gate all around transistors.

Although the gate electrode 108 is shown as a single metal layer, in practice the gate electrode 108 may include multiple metal layers. For example, the gate electrode 108 may include one or more very thin work function layers in contact with the gate dielectric 166. The thin work function layers can include titanium nitride, tantalum nitride, or other conductive materials suitable for providing a selected work function for the transistors. The gate electrode 108 can further include a gate fill material that corresponds to the majority of the gate electrode 108. The gate fill material can include cobalt, tungsten, aluminum, or other suitable conductive materials. The layers of the gate electrode 108 can be deposited by PVD, ALD, CVD, or other suitable deposition processes.

Figure 2X:
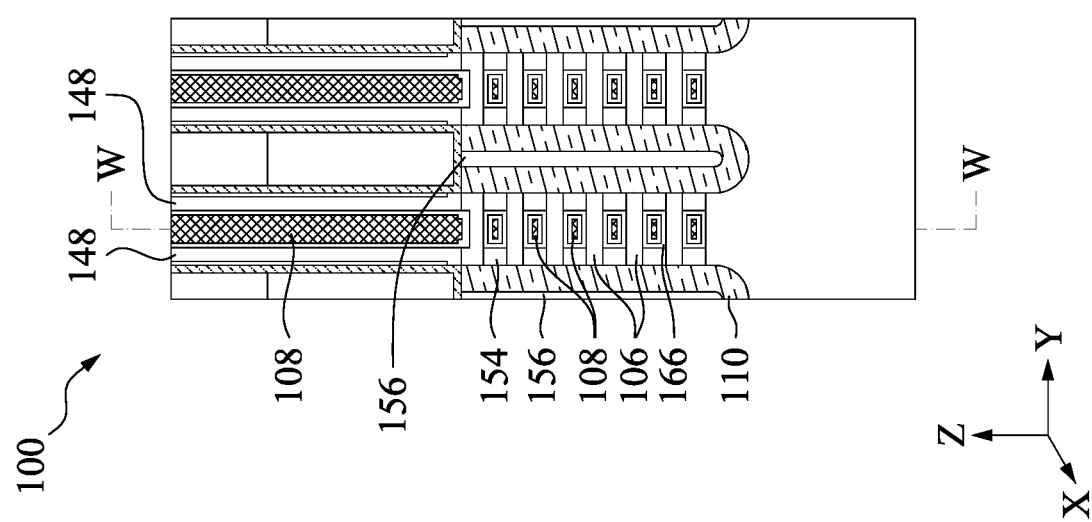

FIG. 2X is a Y-view of the integrated circuit 100 at the stage of processing of FIG. 2W, in accordance with some embodiments. FIG. 2X illustrates the cut line W from which the view of FIG. 2W is taken. FIG. 2X illustrates the gate electrode 108 between the gate spacers 148 and between the semiconductor nanostructures 106 and the inner spacers 154.

Figure 2Z:
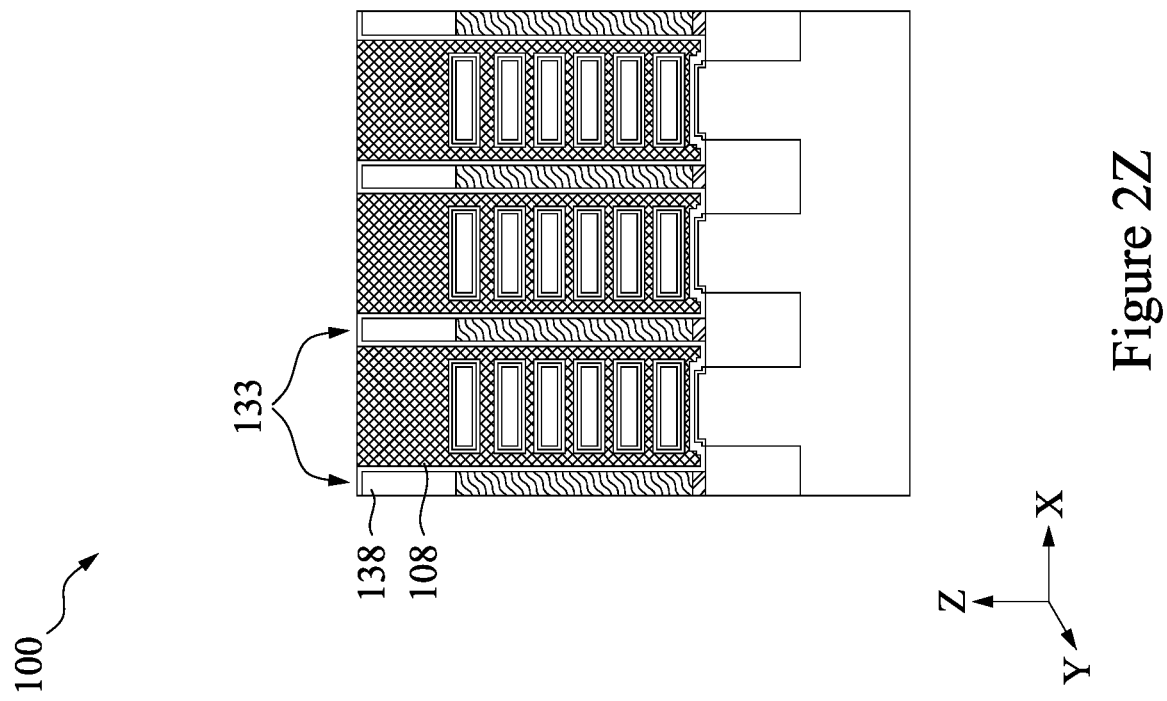
Figure 2Y:
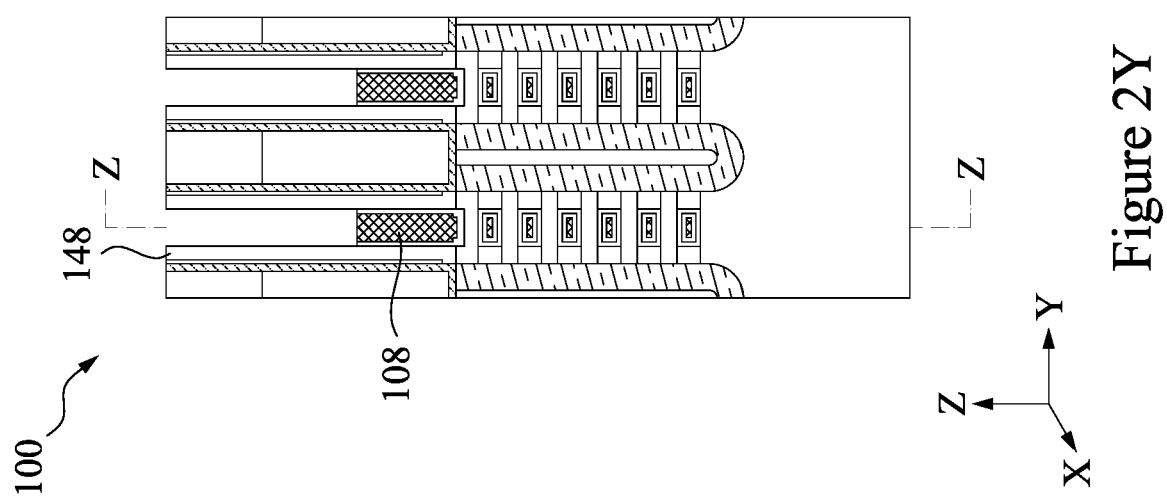

FIG. 2Y is a Y-view of the integrated circuit 100, in accordance with some embodiments. In FIG. 2Z an etching process has been performed to recess the gate electrode 108. In particular, the gate electrode 108 is recessed such that the top surface of the gate electrode 108 is below a top surface of the gate spacer 148. The gate electrode 108 can be recessed by a timed etching process or by other suitable processes.

FIG. 2Z is an X-view of the integrated circuit 100 taken along cut lines Z of FIG. 2Y, in accordance with some embodiments. FIG. 2Z illustrates that the gate electrode 108 is recessed to a level of the hybrid fins 133. The hybrid fins 133 can act as an etch stop for the gate electrode 108. Alternatively, the hybrid fins 133 can be recessed with the gate electrode 108. The recessing of the gate electrodes 108 has the effect of electrically isolating gate electrodes of different transistors from each other.

While FIG. 2Z illustrates that the gate electrode 108 of adjacent transistors are electrically isolated from each other by the hybrid fin structures 133. However, the gate electrode 108 of two or more transistors can be electrically connected to each other. In one example, a photolithography process may be performed to remove the dielectric layer 138 at selected locations prior to depositing the gate electrode 108. After the deposition of the gate electrode 108, the gate electrode will fill the locations from which the dielectric layer 138 was removed, thereby electrically connecting the gate electrode of two adjacent transistors.

In one embodiment, after the stage of processing shown in FIG. 2Z, a metal layer can be deposited on the top surfaces of the gate electrode 108 and the hybrid fin structures 133. A photolithography process can then be performed to pattern the metal layer so that the remaining portions of the metal layer extend across selected hybrid fin structures 133, electrically connecting the gate electrode 108 of two adjacent transistors. Various processes and structures can be utilized to connect the gate electrode 108 of various transistors without departing from the scope of the present disclosure.

Figure 3B:
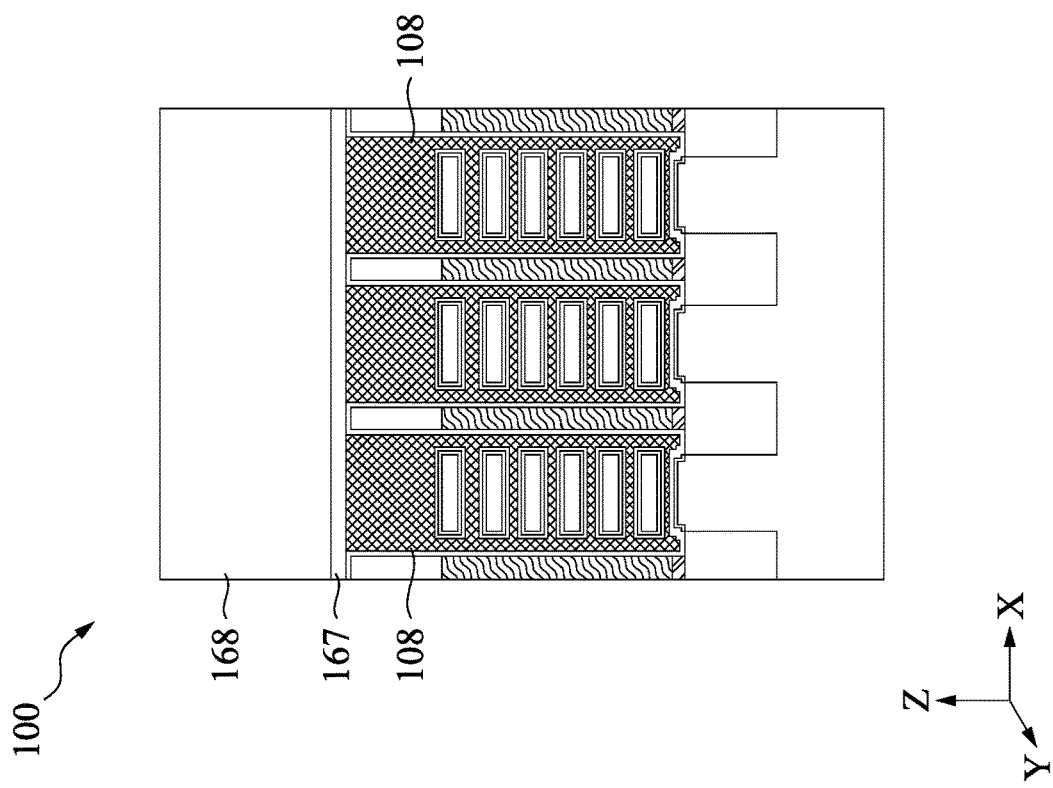
Figure 3A:
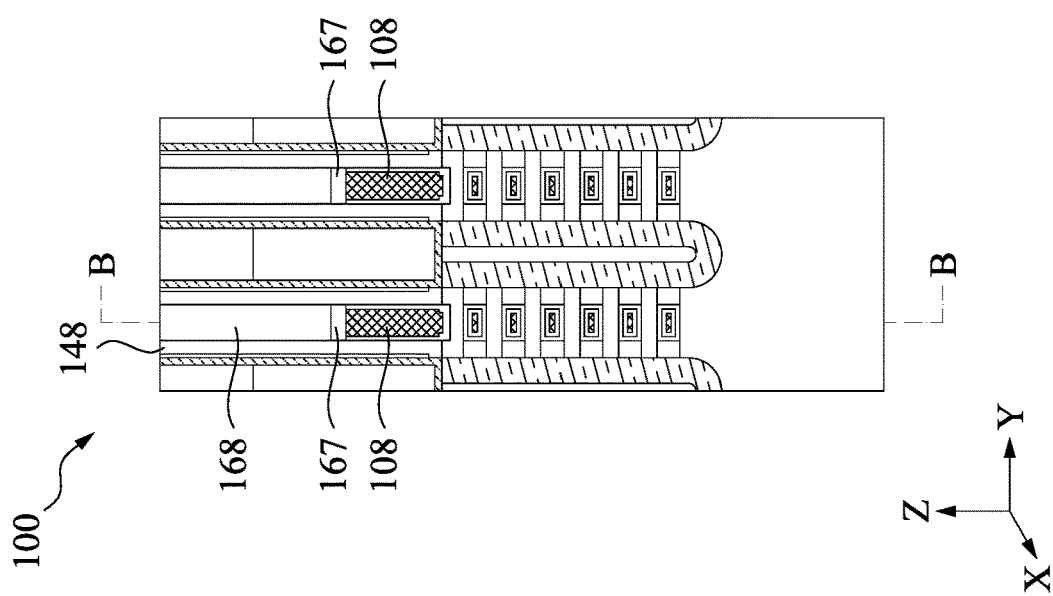

FIG. 3A is a Y-view of the integrated circuit 100, in accordance with some embodiments. In FIG. 3A, a metal layer 167 has been deposited on the gate electrodes 108. The metal layer 167 can include tungsten, aluminum, titanium, copper, gold, tantalum, or other suitable conductive materials. The metal layer 167 can be deposited by ALD, PVD, or CVD. Other materials and deposition processes can be utilized for the metal layer 167. In FIG. 3A a cap layer 168 has been deposited on top of the metal layer 167. The cap layer 168 can include one or more of SiCN, SiN, or SICON. The cap layer 168 can be deposited by CVD, ALD, or other suitable processes.

FIG. 3B is an X-view of the integrated circuit 100 taken along cut lines B of FIG. 3A, in accordance with some embodiments. FIG. 3B illustrates that the metal layer 167 can electrically connect the gate electrodes 108. Alternatively, the metal layer 167 may not be present so that the gate electrodes 108 remain isolated. In some cases, the metal layer 167 may be patterned to electrically connect some gate electrodes 108 without electrically connecting other gate electrodes 108.

Figure 3D:
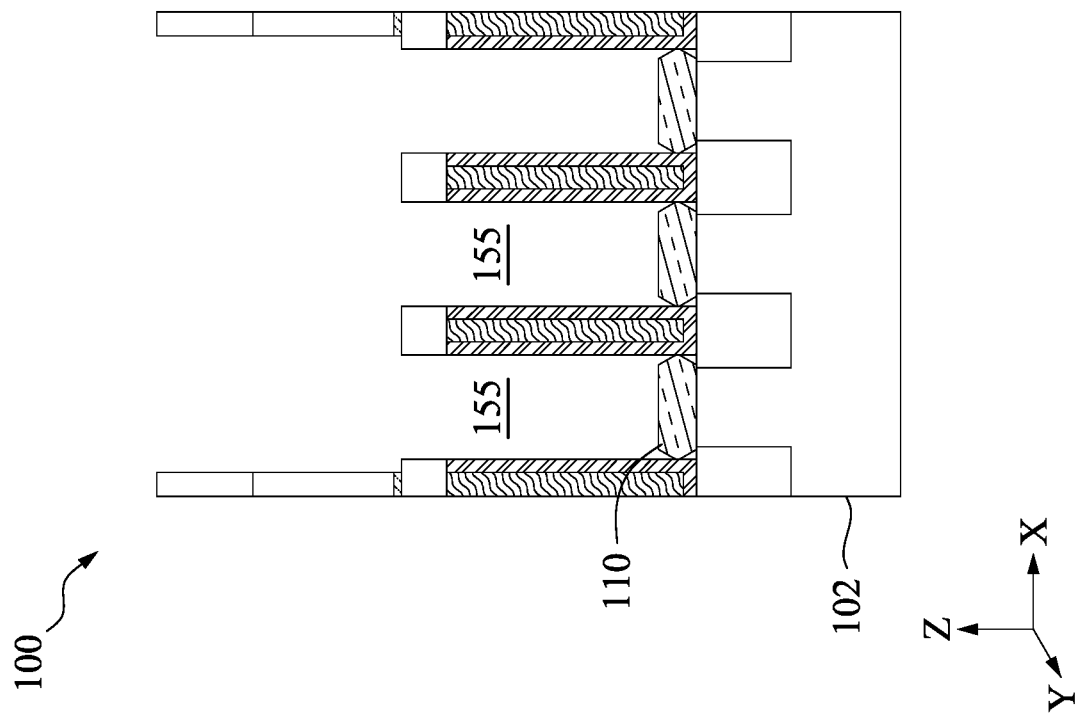
Figure 3C:
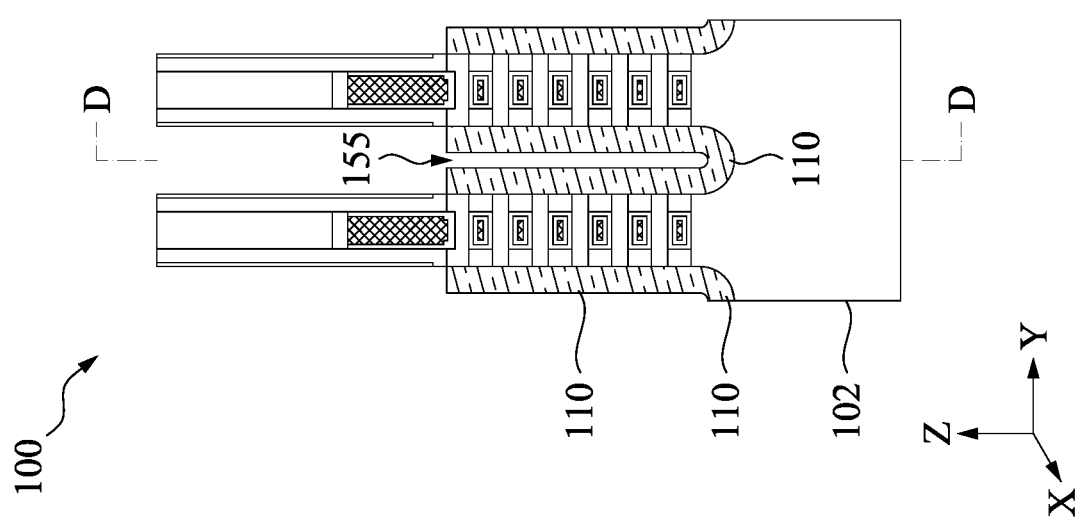

FIG. 3C is a Y-view of the integrated circuit 100, in accordance with some embodiments. In FIG. 3C, the dielectric layers 158, 160, 162, have been removed above the source regions 110. The dielectric material 156 has been removed from the gap 155 between adjacent portions of the source regions 110. The removal of these materials can be accomplished by photolithography processes including patterning a mask and exposing the regions at which the dielectric layers 156, 158, 160, and 162 will be removed. One or more etching processes can then be carried out to remove the dielectric layers 156, 158, 160, and 162. Alternatively, the dummy material 156 may include organic polymer material that is sensitive to UV radiation or other thermal processes. In this case, the dummy material 156 may be removed via UV radiation that breaks down the dielectric layer 156. Various other processes can be utilized for removing the dielectric layer 156 without departing from the scope of the present disclosure.

FIG. 3D is an X-view of the integrated circuit 100 taken along cut lines D of FIG. 3C, in accordance with some embodiments. FIG. 3D illustrates the gaps 155 between adjacent portions of the source regions 110 after removal of the dielectric layers 156, 158, 160, and 162.

Figure 3F:
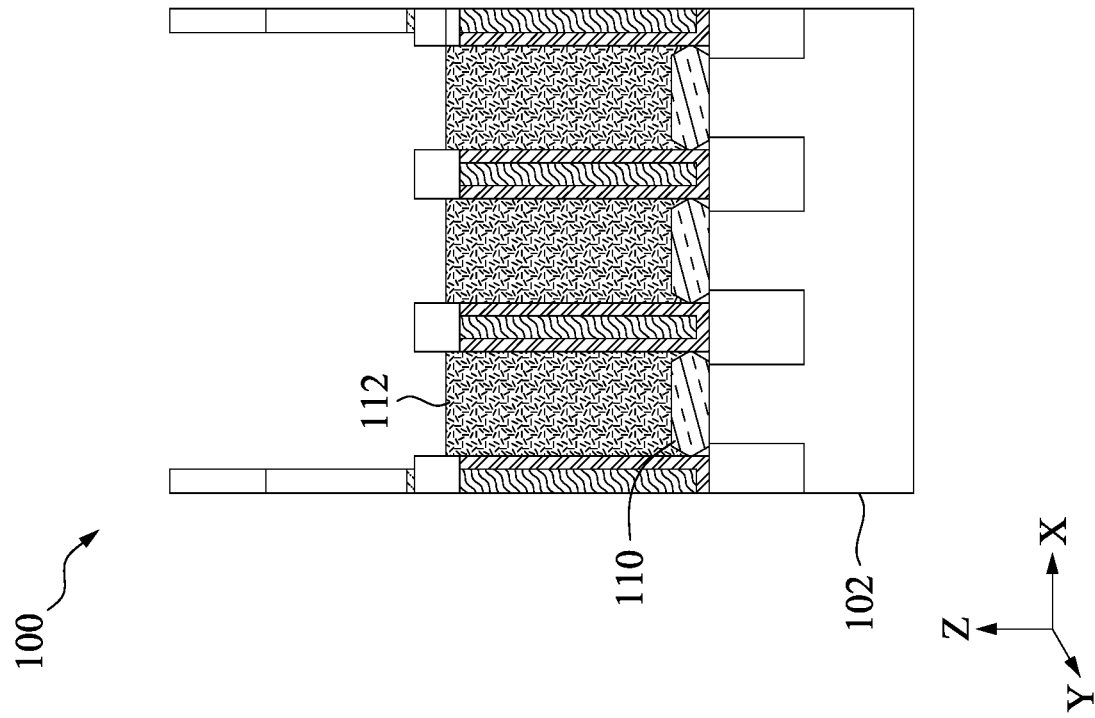
Figure 3E:
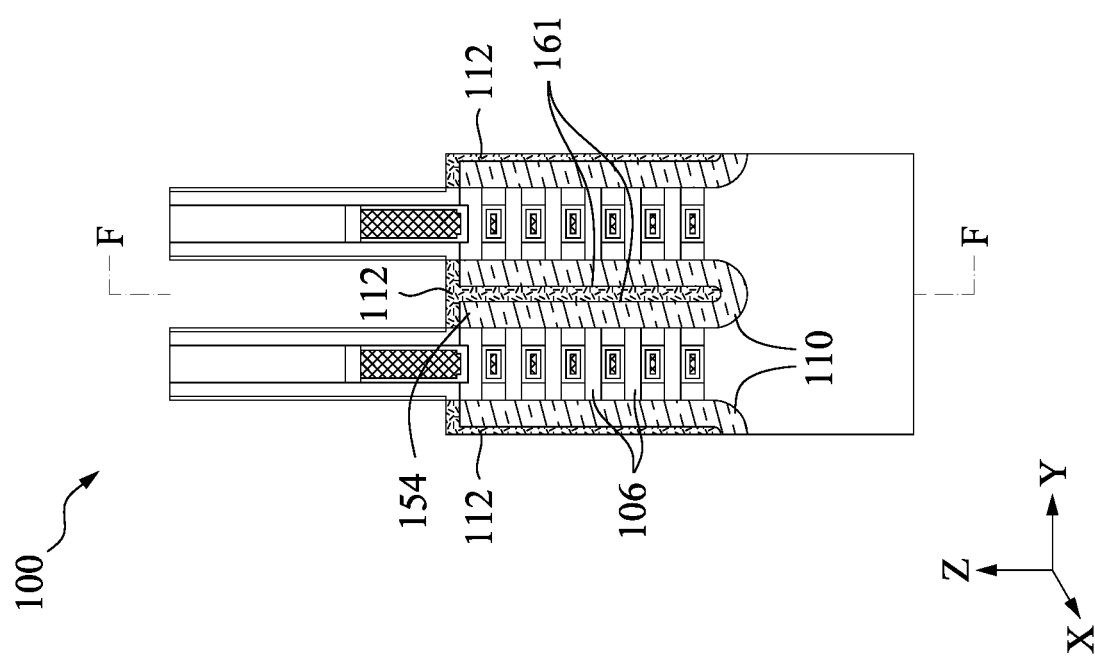

FIG. 3E is a Y-view of an integrated circuit 100, in accordance with some embodiments. In FIG. 3E a silicide 112 has been formed on the source regions 110. The silicide 112 is formed on top of the source/drain regions 110 and in the gaps 155 between adjacent portions of the source/drain regions 110. The silicide 112 extends downward along sidewalls 161 of the source/drain regions 110 and is positioned on the top surfaces 159 of the source/drain regions 110 and at the bottom of the gaps 155.

The silicide 112 can be formed on the source/drain regions 110. In an example in which the source/drain regions 110 include silicon, the silicide 112 can include nickel silicide, tungsten silicide, titanium silicide, or other silicides. The silicide 112 can be grown by performing a high-temperature annealing process in the presence of the metal and the silicon from which the silicide 112 is formed. The result of the silicide growth process is that silicide 112 grows from all exposed surfaces of the source/drain regions 110. The silicide 112 can include other materials and deposition processes without departing from the scope of the present disclosure.

The silicide 112 extends downward alongside the source/drain regions 110. In some embodiments, the downward extending finger or portion of the silicide 112 extends far enough downward that a line drawn from the lowest semiconductor nanostructure 106 in the Y direction will contact the silicide 112. The result is that electrical currents only at the cross a short distance of high resistance source/drain material before encountering the highly conductive silicide 112. Further details regarding the benefits of the silicide 112 will be discussed below. The silicide 112 may be termed a stringing silicide.

In some embodiments, the silicide 112 has a thickness between 1 nm and 10 nm. The thickness of the silicide corresponds to the Y dimension of the downward extending portion of the silicide 112 in the gap between the source/drain regions 110 and to the vertical thickness of the silicide 112 on top of the source/drain regions 110. The vertical depth of the downward extending portion of the silicide 112 can be between 1 nm and 100 nm, depending on the depth of the lowest semiconductor nanostructure 106. The larger the number of semiconductor nanostructures 106, the greater the depth of the silicide 112 in the Z direction. In the example of FIG. 3E, the silicide 112 has a T-shape. This is because a portion of the silicide 112 forms on top of the source/drain regions 110 while another portion of the silicide 112 extends downward alongside the source/drain regions 110. The silicide 112 can have other dimensions and shapes without departing from the scope of the present disclosure.

FIG. 3F is an X-view of the integrated circuit 100 taken along cut lines F of FIG. 3E, in accordance with some embodiments. The view of FIG. 3F illustrates the silicide 112 in the gap 155 on top of the bottom portion of the source/drain regions 110. The silicide 112 may have a width in the X direction between 5 nm and 30 nm, though other dimensions can be utilized without departing from the scope of the present disclosure.

Figure 3H:
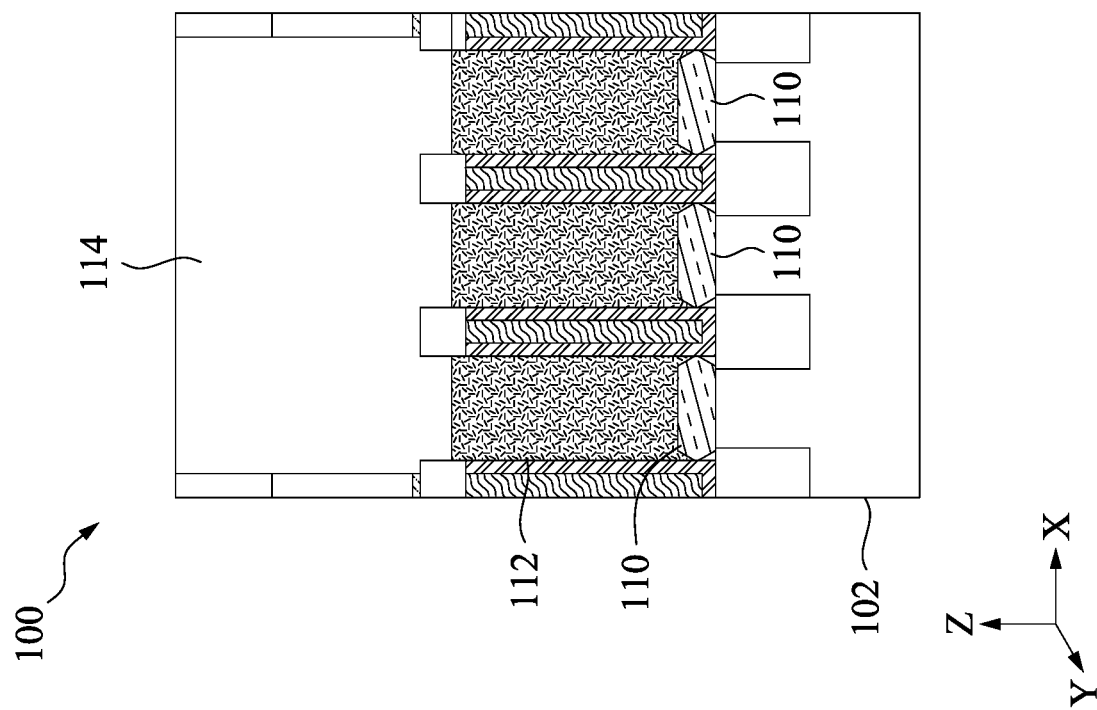
Figure 3G:
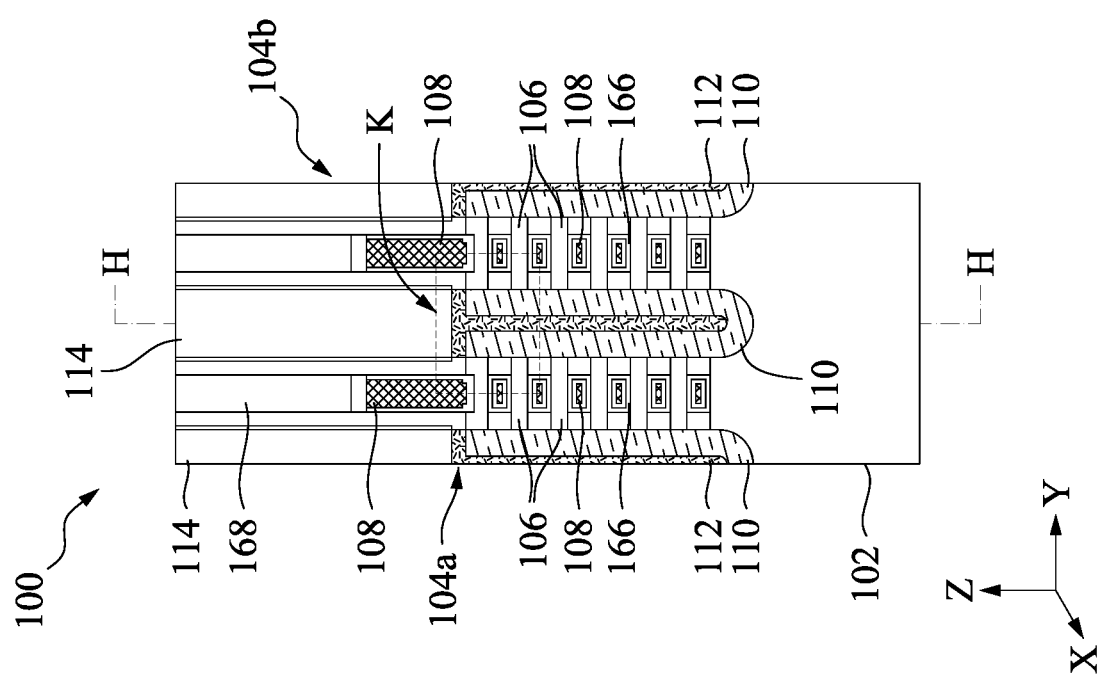

FIG. 3G is a Y-view of the integrated circuit 100, in accordance with some embodiments. In FIG. 3G, source and drain contacts 114 have been formed on the silicide 112. The source and drain contacts 114 can include conductive material such as tungsten, cobalt, copper, titanium, aluminum, or other suitable conductive materials by which voltages can be applied to the source/drain regions 110. The source and drain contacts 114 can be formed by PVD, CVD, ALD, or other suitable deposition processes. Other materials and deposition processes can be utilized for the source and drain contacts 114 without departing from the scope of the present disclosure.

In FIG. 3G, processing of the transistors 104 is complete. FIG. 3G illustrates a first transistor 104a and a second transistor 104b. The first transistor 104a includes the semiconductor nanostructures 106 and the gate electrode 108 on the left side. The second transistor 104b includes the semiconductor nanostructures 106 and the gate electrode 108 on the right side. The first and second transistors 104a and 104b share a central source/drain region 110. The source/drain region 110 on the left is a source/drain region 110 of the transistor 104a. The source/drain region 110 on the right is a source/drain region 110 of the transistor 104b.

The gate all around transistors 104 functions by applying biasing voltages to the gate electrode 108 and to the source and drain contacts 114. The biasing voltages cause a channel current to flow through the semiconductor nanostructures 106 between the source/drain regions 110. Accordingly, the semiconductor nanostructures 106 corresponds to channel regions of the gate all around transistors 104.

The formation of the source/drain regions 110 and the downward extending silicide 112 result in various benefits. As can be seen in FIG. 3G, the semiconductor nanostructures 106 are arranged in a vertical stack above the substrate 102. In one example, when a transistor 104 is enabled, current flows from a source/drain contact 114 through the silicide 112, through the source/drain region 110, through each of the semiconductor nanostructures 106, through the other source/drain region 110, through the other silicide 112, to the other source/drain contact 114.

Current that flows through the bottom semiconductor nanostructure 106 has a longer path than current that flows through the top semiconductor nanostructure 106. In a situation in which the silicide 112 does not extend downward along the lateral edge of the source/drain regions 110, the current that flows through the bottom semiconductor nanostructure 106 with take a relatively long path through the source/drain regions 110. The source/drain regions 110 are not as conductive as the silicide 112. Accordingly, a longer path through the source/drain regions 106 corresponds to a larger electrical resistance, greater power dissipation, and greater heat generation. However, the transistor 104 of FIG. 3G includes silicide 112 that extends downward along the lateral edge of the source/drain regions 110. The result is that there is a relatively small distance between the lowest semiconductor nanostructures 106 and the silicide 112. Because the silicide 112 is highly conductive compared to the source/drain regions 110, current that flows through the lowest nanostructures 106 will primarily flow through the path of least resistance downward along the silicide 110 and then laterally to the lowest nanostructures 106. This reduces the overall resistance, power dissipation, and heat generation in comparison to a situation in which the silicide 112 is positioned only and the tops of the source/drain regions 110.

FIG. 3G illustrates six semiconductor nanostructures 106. However, the configuration of the silicide 112 enables the use of more semiconductor nanostructures 106 without undue electrical resistance and corresponding power dissipation and heat generation. Accordingly, the transistors 104 can include larger numbers of semiconductor nanostructures 106 than shown in FIG. 3G. However, the transistors 104 can include fewer or more semiconductor nanostructures 106 than shown in FIG. 3G without departing from the scope of the present disclosure.

FIG. 3H is an X-view of the integrated circuit 100 taken along cut lines H of FIG. 3G, in accordance with some embodiments. FIG. 3H illustrates the source/drain contacts 114 in contact with the silicide 112 for multiple source/drain regions 110. Alternatively, the source/drain contacts 114 can be patterned to electrically isolate the source/drain regions 110 of various transistors 104 from each other.

Figure 3I:
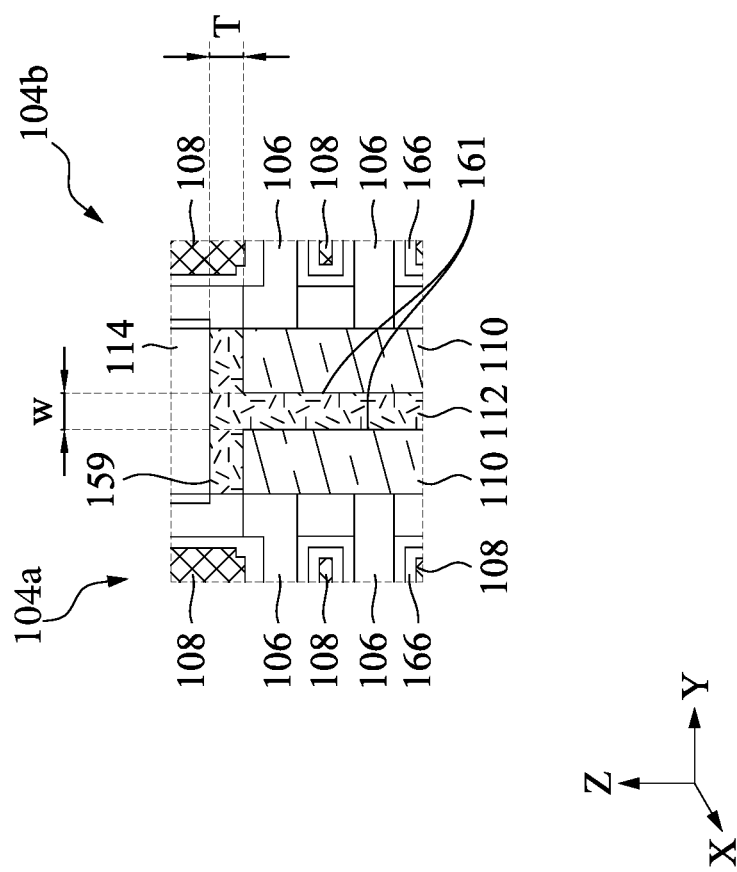

FIG. 3I is an enlarged view of a portion of the transistors 104a and 104b of FIG. 3G, in accordance with some embodiments. The silicide 112 has a width W and a thickness T. As described previously, the width of the silicide can be between 1 nm and 10 nm. The thickness T can be between 2 nm and 10 nm. While in some cases, source/drain 110 can have a uniform thickness such that the sidewalls and bottom are substantially the same thickness, in other cases the bottom of the source/drain region 110 may have a thickness between 1 and 10 times the thickness of the sidewalls of the source/drain region. Other widths and thicknesses can be utilized without departing from the scope of the present disclosure.

Figure 4:
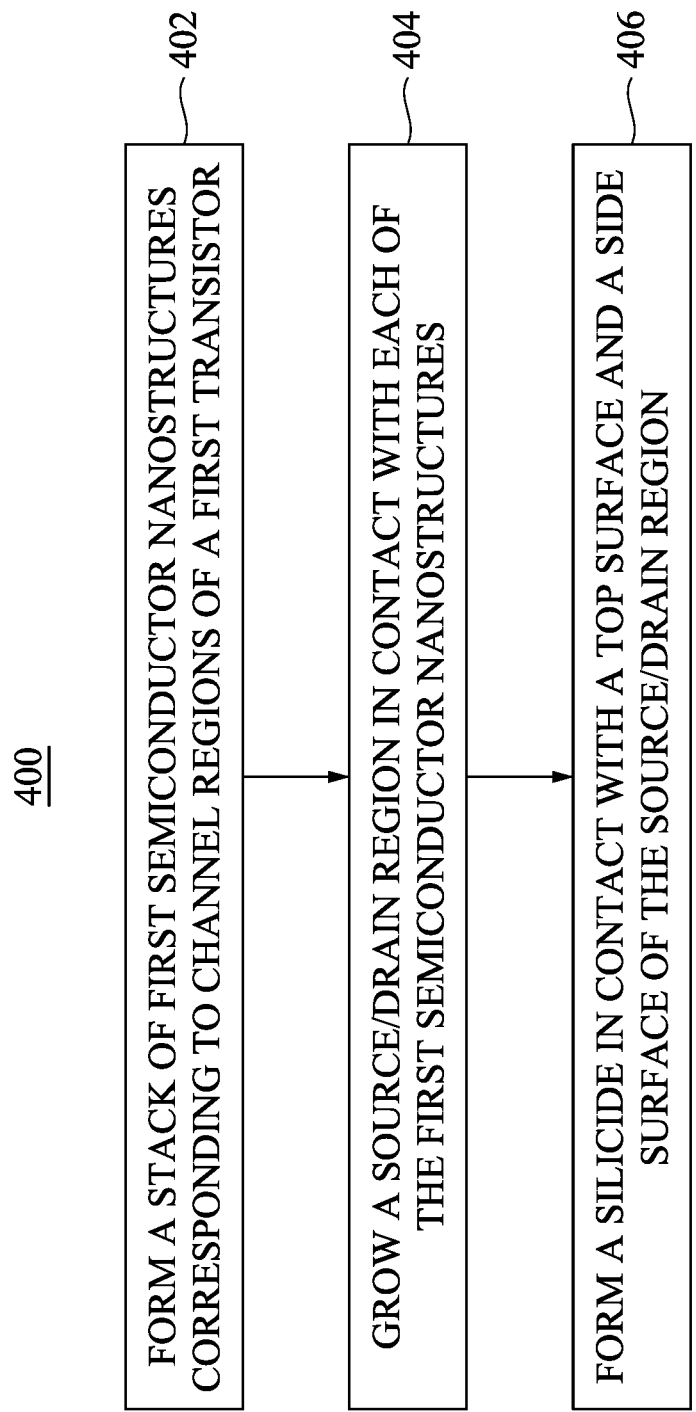
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1-3I. At 402, the method 400 includes forming a stack of first semiconductor nanostructures corresponding to channel regions of a first nanostructure transistor. One example of a first nanostructure transistor is the transistor 104 of FIG. 1. One example of first semiconductor nanostructures are the semiconductor nanostructures 106 of FIG. 1. At 404, the method 400 includes forming a source/drain region in contact with each of the first semiconductor nanostructures and having a sidewall. One example of a source/drain region is the source/drain region 110 of FIG. 1. At 406, the method 400 includes forming a silicide in contact with a top surface and a sidewall of the source/drain region and extending lower than at least one of the semiconductor nanostructures. One example of a silicide is the silicide 112 of FIG. 1.

Some embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions in contact with the nanostructures. A silicide is formed on the source/drain regions. Source/drain contacts are formed on the silicide. The silicide and the source/drain contacts extend downward into slots formed in the source/drain regions, rather than being positioned only on the top of the source/drain regions. Because the silicide and the source/drain contacts extend downward into the source/drain regions, there is a relatively small distance between each nanostructure and the highly conductive source/drain contacts.

The configuration of the source/drain regions and the source/drain contacts provides several benefits. First, the electrical resistance between the lowest nanostructures and the source/drain contacts is greatly reduced with respect to configurations in which the silicide and the source/drain contacts are formed only at the top of the source/drain regions, resulting in reduced power consumption. Second, a large number of nanostructures can be formed without negatively impacting the electrical resistance between lower nanostructures and the source/drain contacts. With larger numbers of nanostructures, currents can be conducted through nanostructure transistors without generating excessive amounts of heat. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

Figure 5A:
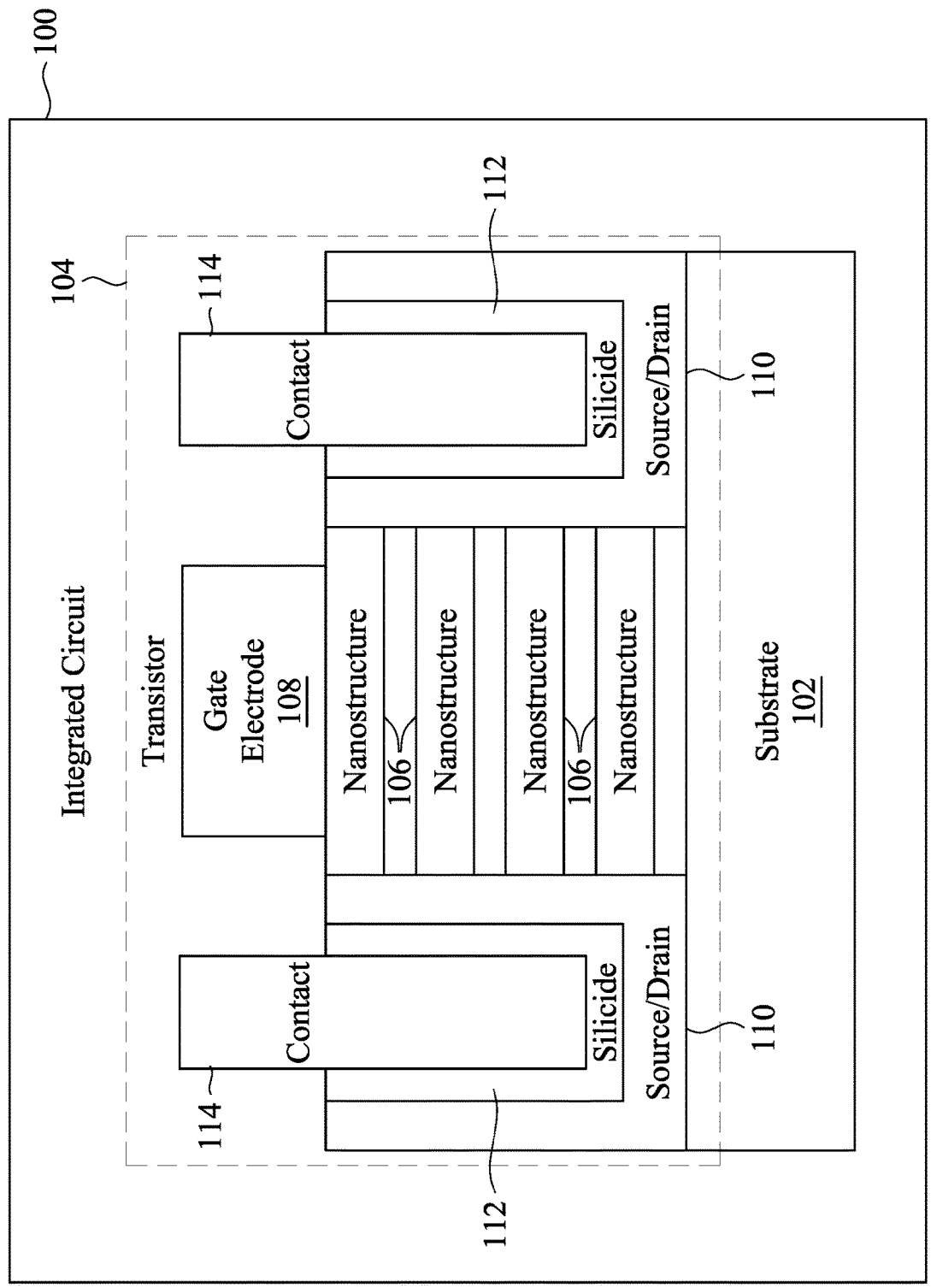
FIGS. 5A and 5B are block diagrams of an integrated circuit 100, in accordance with some embodiments.

FIG. 5A is a block diagram of an integrated circuit 100, in accordance with some embodiments. The integrated circuit 100 includes a semiconductor substrate 102. The integrated circuit also includes a transistor 104 above the semiconductor substrate 102. As set forth in more detail below, the integrated circuit 100 utilizes silicides and source/drain contacts that extend downward into source/drain regions, or into slots formed in the source/drain regions, to improve the performance of the transistor 104.

The transistor 104 includes semiconductor nanostructures 106, a gate electrode 108, and source/drain regions 110. A silicide 112 is in contact with the source/drain regions 110. Source/drain contacts 114 are in contact with the silicide 112. The semiconductor nanostructures 106 act as channel regions of the transistor 104. The transistor 104 can be operated by applying voltages to the gate electrode 108 and the source/drain contacts 114 in order to enable or prevent current flowing through the semiconductor nanostructures 106 between the source/drain regions 110.

The semiconductor nanostructures 106 each extend between the source/drain regions 110. The semiconductor nanostructures 106 may include semiconductor nanostructures. Alternatively, the semiconductor nanostructure 106 can include nanowires of other types of nanostructure. The transistor 104 may be termed a nanostructure transistor.

The semiconductor nanostructures 106 can include a monocrystalline semiconductor material such as silicon, silicon germanium, or other semiconductor materials. The semiconductor nanostructures 106 may be an intrinsic semiconductor material or may be a doped semiconductor material. The semiconductor nanostructures may include nanostructures, nanowires, or other types of nanostructures.

The gate electrode 108 includes one or more conductive materials. The gate electrode 108 can include one or more of tungsten, aluminum, titanium, tantalum, copper, gold, or other conductive materials. The gate electrode 108 can surround the nanostructures 106 such that each semiconductor nanostructure 106 extends through the gate electrode 108 between the source/drain regions 110. Though not shown in FIG. 5A, a gate dielectric surrounds the nanostructures 106 and acts as a dielectric sheath between the nanostructures 106 and the gate electrode 108. Accordingly, the transistor 104 may be considered a gate all around nanostructure transistor. While examples illustrated herein primarily utilize gate all around transistors, other types of transistors can be utilized without departing from the scope of the present disclosure.

The transistor 104 includes source/drain regions 110. There is a respective source/drain region 110 on each end of the semiconductor nanostructures 106. The left source/drain region 110 physically connects to the left ends of the semiconductor nanostructures 106. The right source/drain region 110 physically connects to the right ends of the semiconductor nanostructures 106. The source/drain regions 110 can include semiconductor material such as silicon or silicon germanium doped with N-type dopants species or P-type dopant species depending on the type of the transistor 104.

Though not shown in FIG. 5A, the transistor 104 includes inner spacers. The inner spacers are dielectric regions that physically separate the gate electrode 108 from the source/drain regions 110. In this way, the source/drain regions 110 cannot become shorted with the gate electrode 108. The inner spacers can include silicon nitride, SiCN, SiOCN, or other suitable dielectric materials.

The silicide 112 acts as an interface between the semiconductor material of the source/drain region 110, and the metal of the source/drain contacts 114. The silicide 112 includes both the semiconductor material of the source/drain region 110 and a metal. As such, the silicide 112 may include nickel silicide, titanium silicide, copper silicide, or other types of silicide. The silicide 112 is highly conductive compared to the source/drain regions 110. Further details of the silicide 112 will be discussed below.

The source/drain contacts 114 are metal plugs or conductive vias by which voltages are applied to the source/drain regions 110. The source/drain contacts 114 can include tungsten, aluminum, titanium, copper, or other suitable conductive materials. The source/drain contacts 114 are positioned on the silicide 112 and extend deep into the source/drain regions 110. The source/drain contacts 114 are in direct contact with the silicide 112. Accordingly, the source/drain contacts 114 apply voltages to the source/drain regions 110 via the silicide 112. Similarly, currents flow between the source/drain contacts 114 and the source/drain regions 110 via the silicide 112.

The semiconductor nanostructures 106 are arranged in a vertical stack above the substrate 102. Accordingly, the semiconductor nanostructures 106 may be referred to as stacked channels. A vertically lowest nanostructure 106 corresponds to the semiconductor nanostructure 106 closest to the substrate 102. A vertically highest nanostructure 106 is closest to the source/drain contacts 114. In one example, when the transistor 104 is enabled, current flows from the source/drain contact 114 on the right, through the silicide 112 on the right, through the source/drain region 110 on the right, through each of the semiconductor nanostructures 106, through the source/drain region 110 on the left, through the silicide 112 on the left, to the source/drain contact 114 on the left.

Figure 5B:
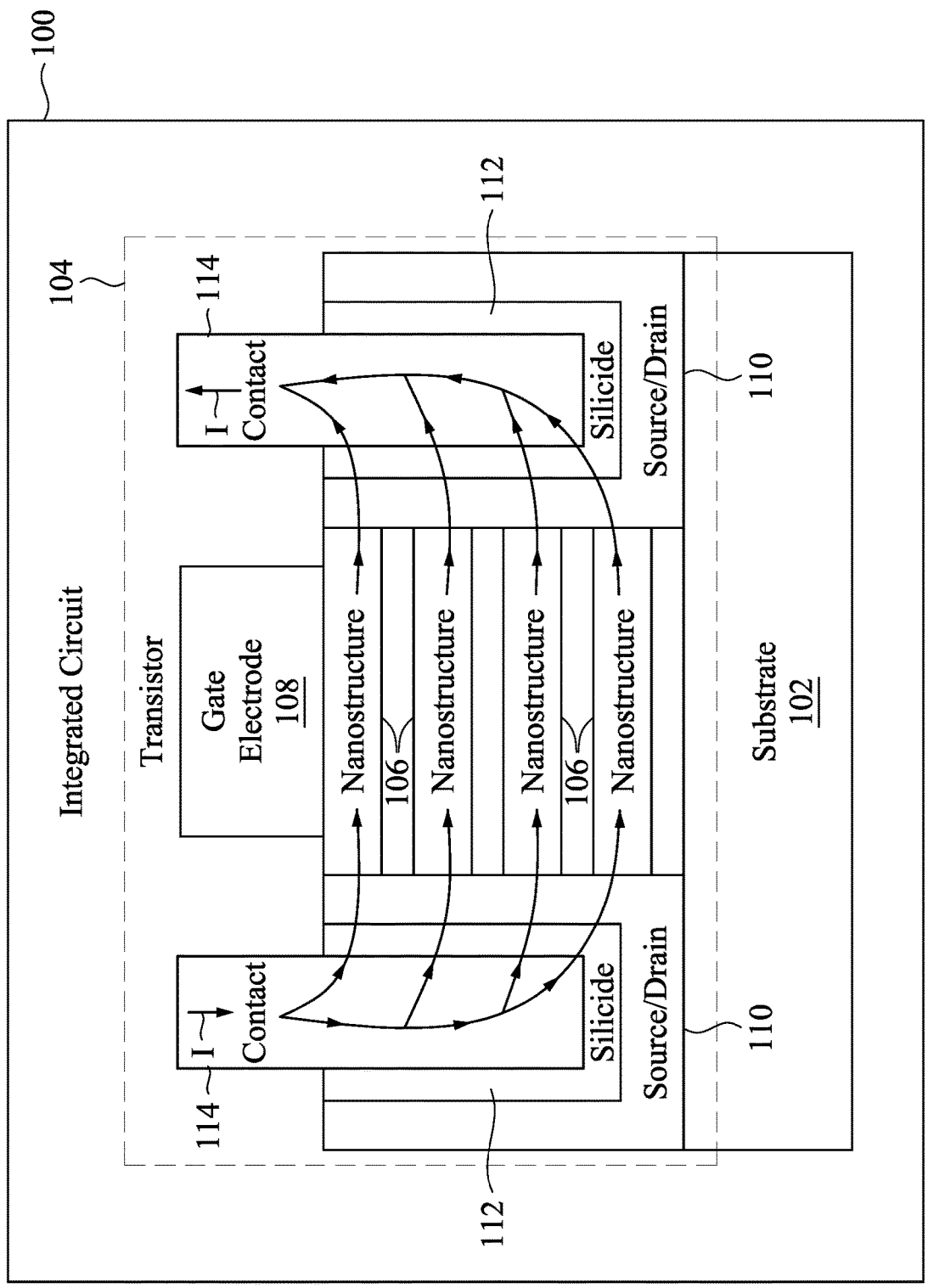

FIG. 5B corresponds to the block diagram of FIG. 5A in an operational state, in accordance with some embodiments. In FIG. 5B, voltages have been applied between the gate electrode 112 and the source/drain regions 114 in a way that enables a current Ito flow through the transistor 104. In the example of FIG. 5B, the current I flows from the left source/drain contact, through the left silicide 112, through the left source/drain region 110, and into the semiconductor nanostructures 106. The current flows through the semiconductor nanostructures 106 through the right source/drain 110, to the right silicide 112, and into the right source/drain contact 114.

FIG. 5B illustrates that a portion of the total current I flows through each of the semiconductor nanostructures 106. Current that flows through the bottom semiconductor nanostructure 106 has a longer path than current than the current that flows through the top semiconductor nanostructure 106. In a situation in which the silicide 112 and the source/drain contact 114 do not extend downward into the source/drain regions 110, the current that flows through the bottom semiconductor nanostructure 106 will take a relatively long path through the source/drain regions 110. The source/drain regions 110 are not as conductive as the silicide 112 and the source/drain contacts 114. Accordingly, a longer path through the source/drain regions 110 corresponds to a larger electrical resistance, greater power dissipation, and greater heat generation. However, the transistor 104 of FIGS. 5A and 5B includes silicide 112 and source/drain contacts 114 that extend vertically downward into the source/drain region 110. The result is that there is a relatively small distance between the lowest semiconductor nanostructures 106 and the source/114 drain contact. Because the source/drain contact 114 is highly conductive compared to the source/drain regions 110, current that flows through the lowest nanostructures 106 will primarily flow through the path of least resistance downward through the source/drain contact 114 and then laterally to the lowest nanostructures 106. This reduces the overall resistance, power dissipation, and heat generation in comparison to a situation in which the silicide 112 and the source/drain contact 114 are positioned only and the tops of the source/drain regions 110.

FIGS. 5A and 5B illustrate four semiconductor nanostructures 106. However, the configuration of the source/drain regions 110, the silicide 112, and the source/drain contacts 114 enables the use of more semiconductor nanostructures 106 without undue electrical resistance and corresponding power dissipation and heat generation. Accordingly, the transistor 104 can include larger numbers of semiconductor nanostructures 106 than shown in FIGS. 5A and 5B. However, the transistor 104 can include fewer or more semiconductor nanostructures 106 than shown in FIGS. 5A and 5B without departing from the scope of the present disclosure.

In some embodiments, the source/drain regions 110 are each formed in a trench. After formation of the source/drain regions 110, a trench or slot is formed in the source/drain regions 110. The slot causes the source/drain region 110 to have somewhat of a U shape, as can be seen in FIGS. 5A and 5B. After formation of the slot in the source/drain regions 110, the silicide is formed 112 in a conformal growth process. The duration of the conformal growth process is selected to ensure that the silicide 112 does not entirely fill the slot or trench in the source/drain regions 110. Other processes can be utilized for forming the source/drain regions 110 and the silicide 112 without departing from the scope of the present disclosure.

After formation of the silicide 112, the source/drain contacts 114 are formed in the remaining portions of the slot or trench in the source/drain regions 110. The source/drain contacts 114 fill the slot or trench in the source/drain regions 110. Accordingly, the source/drain contacts 114 extend downward into the source/drain regions 110. As set forth previously, this downward extension of the source/drain contacts 114 into the source/drain regions 110 results in a large reduction in resistance between the source/drain contacts 114 and the lowest semiconductor nanostructures 106.

Figure 6B:
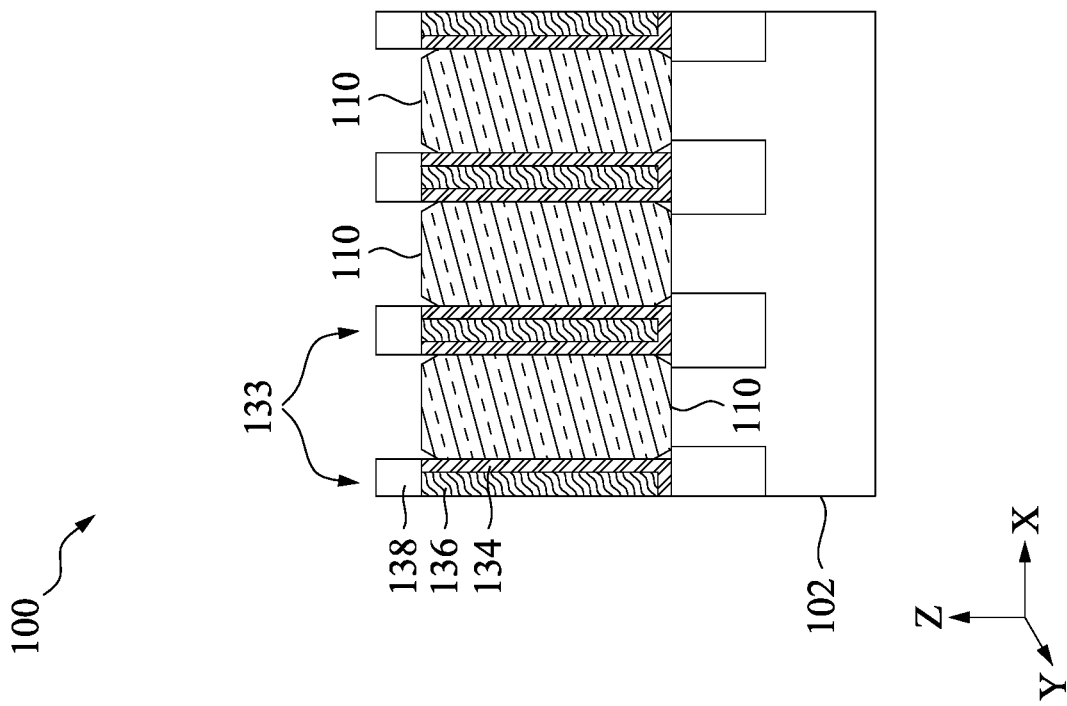
FIGS. 6A-6S are cross-sectional views of an integrated circuit, at various stages of processing, in accordance with some embodiments.
Figure 6A:
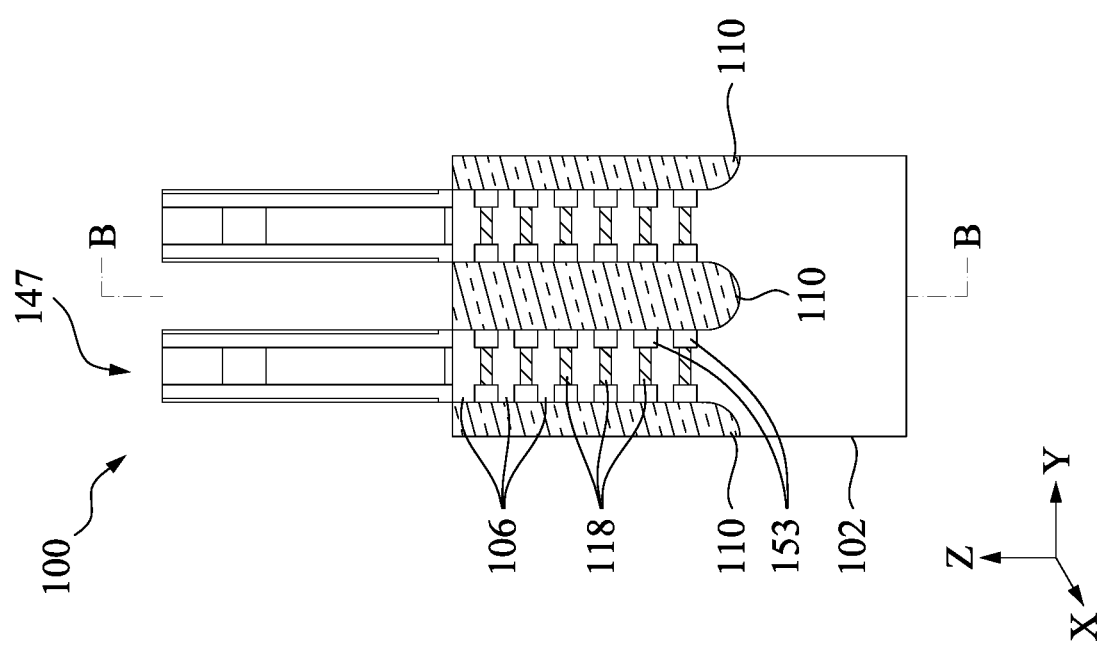
Figure 6D:
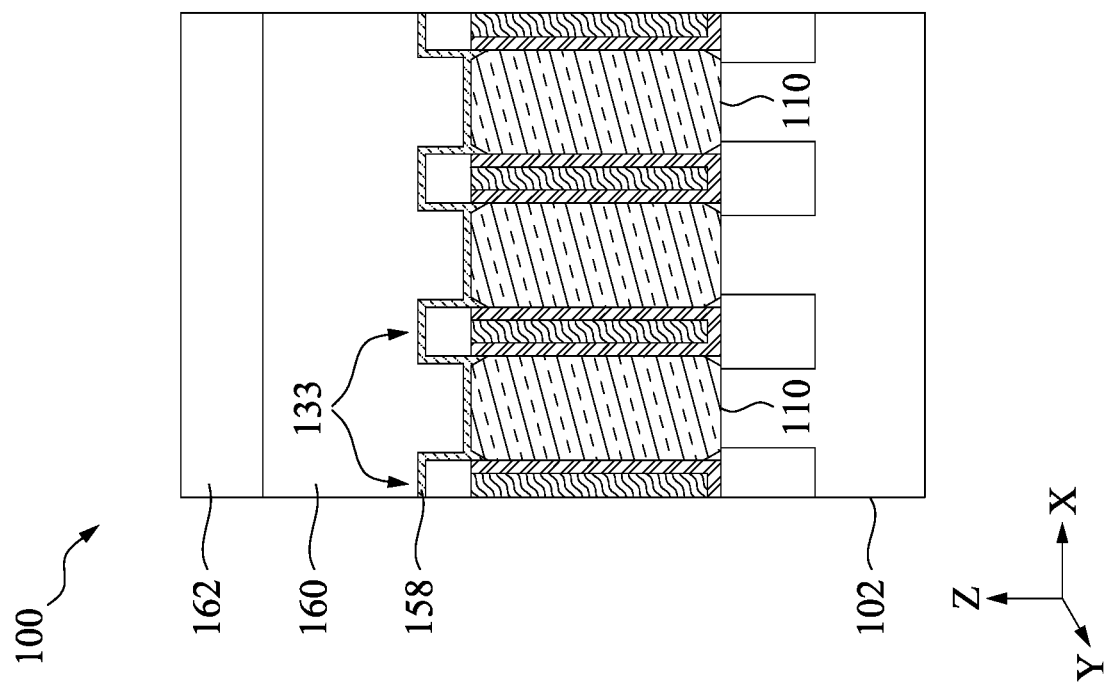
Figure 6C:
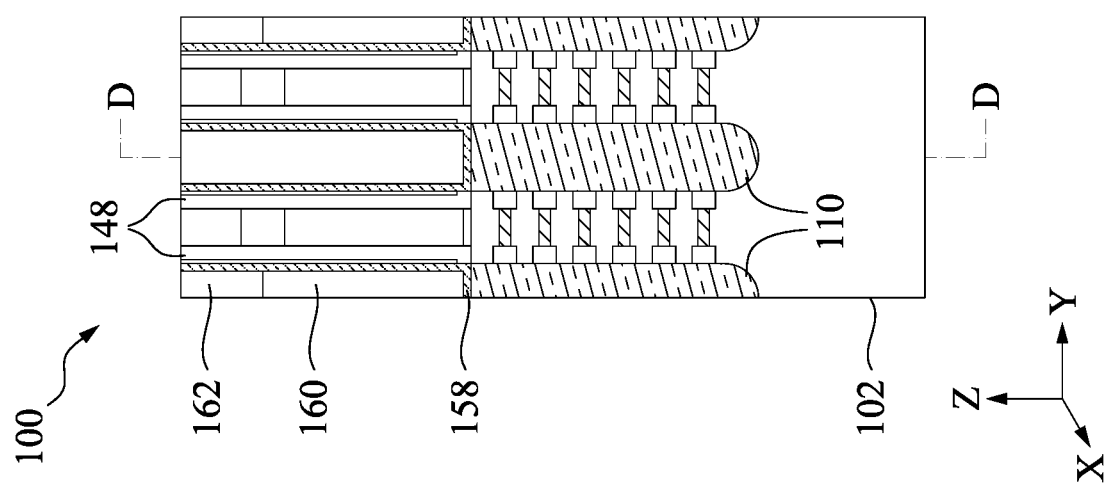
Figure 6F:
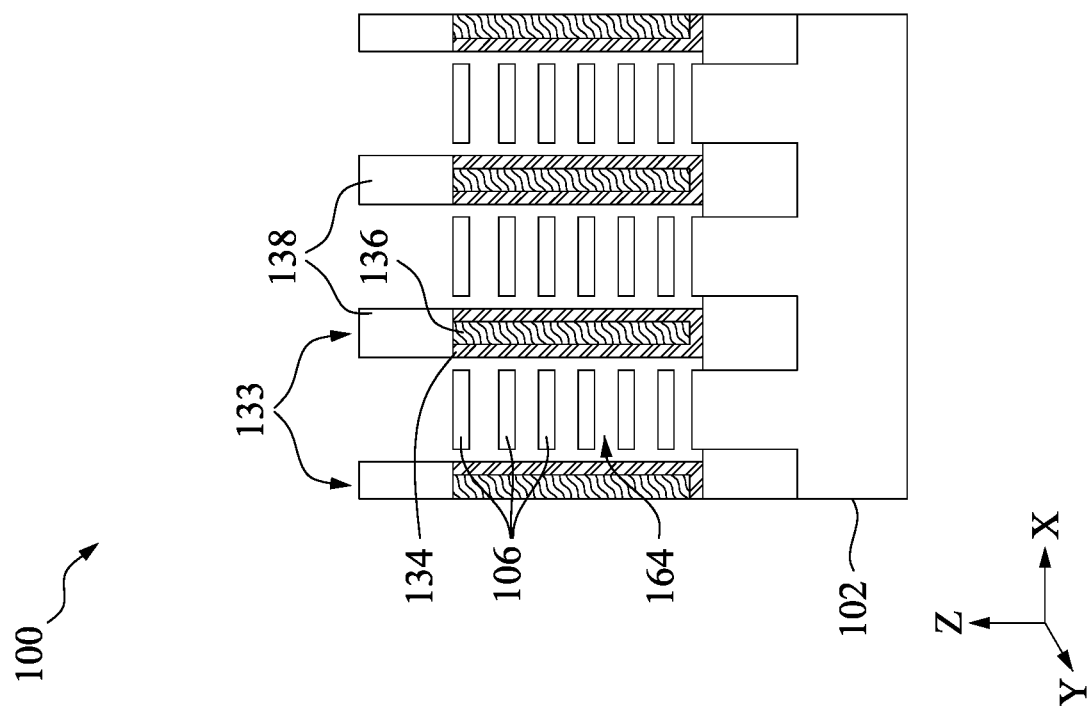
Figure 6E:
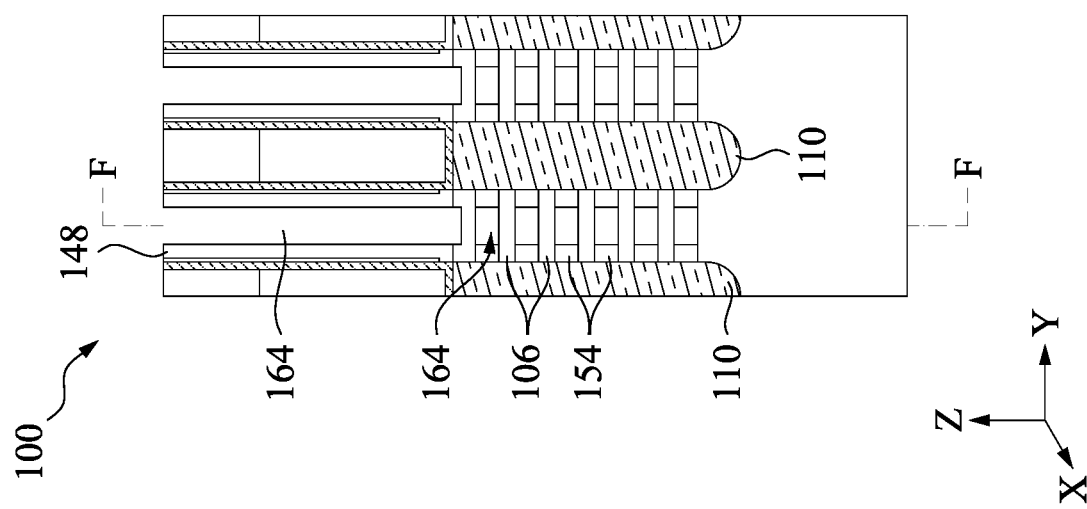
Figure 6H:
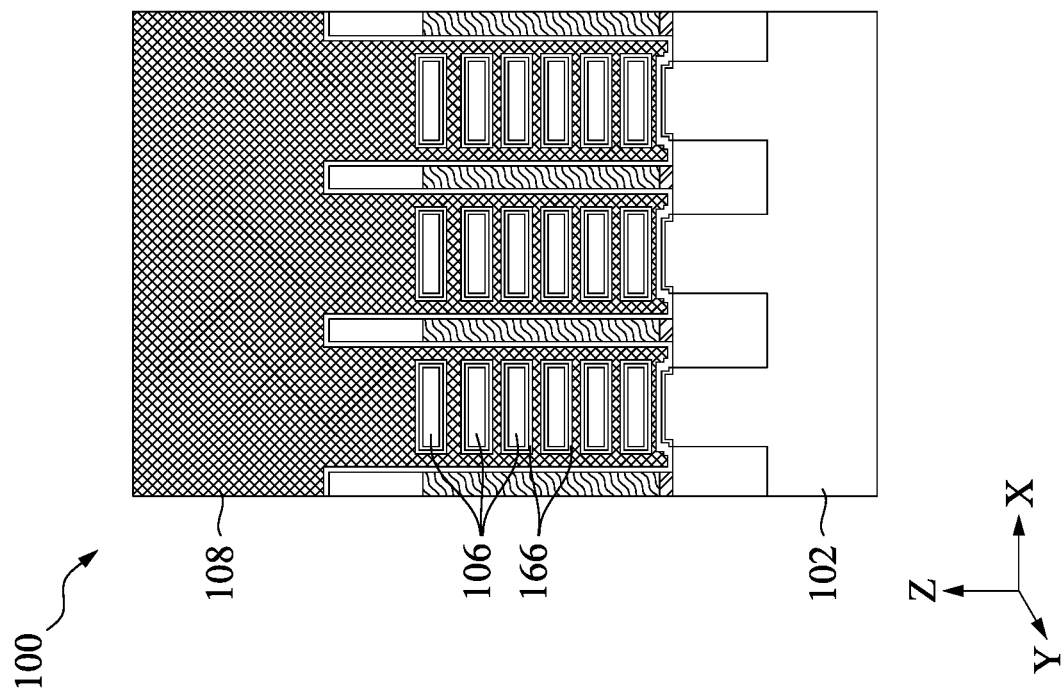
Figure 6G:
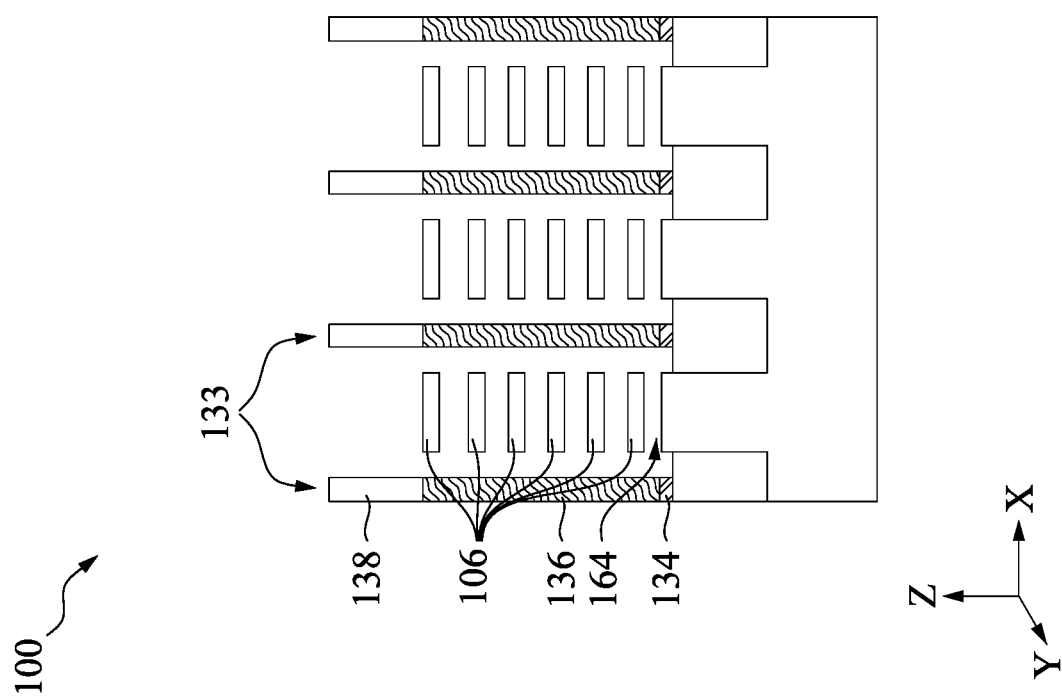
Figure 6I:
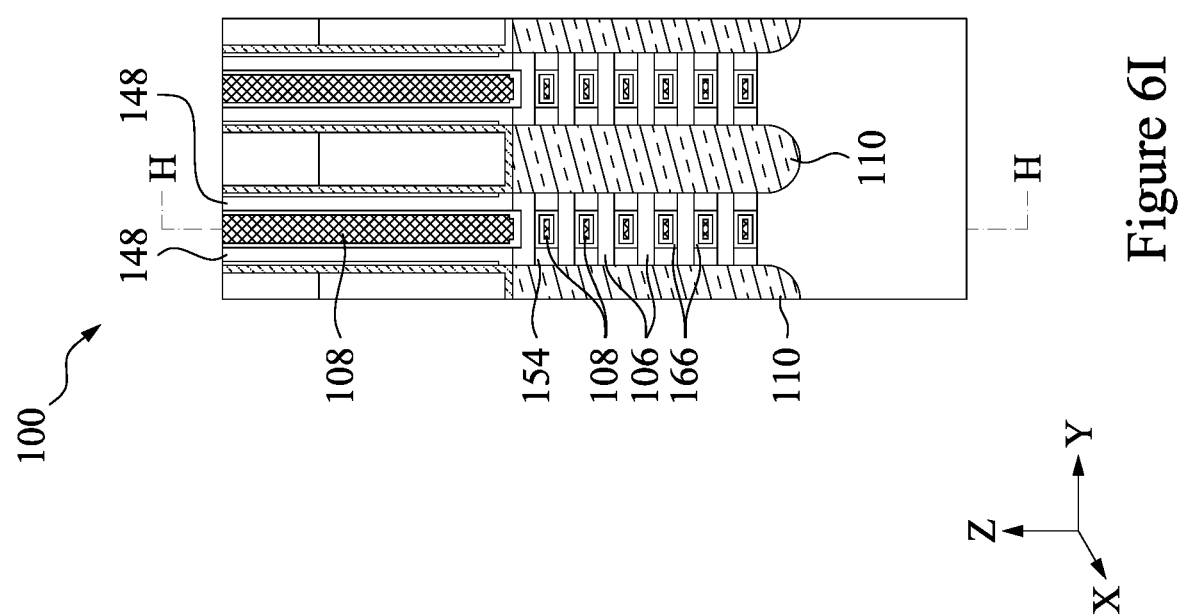
Figure 6K:
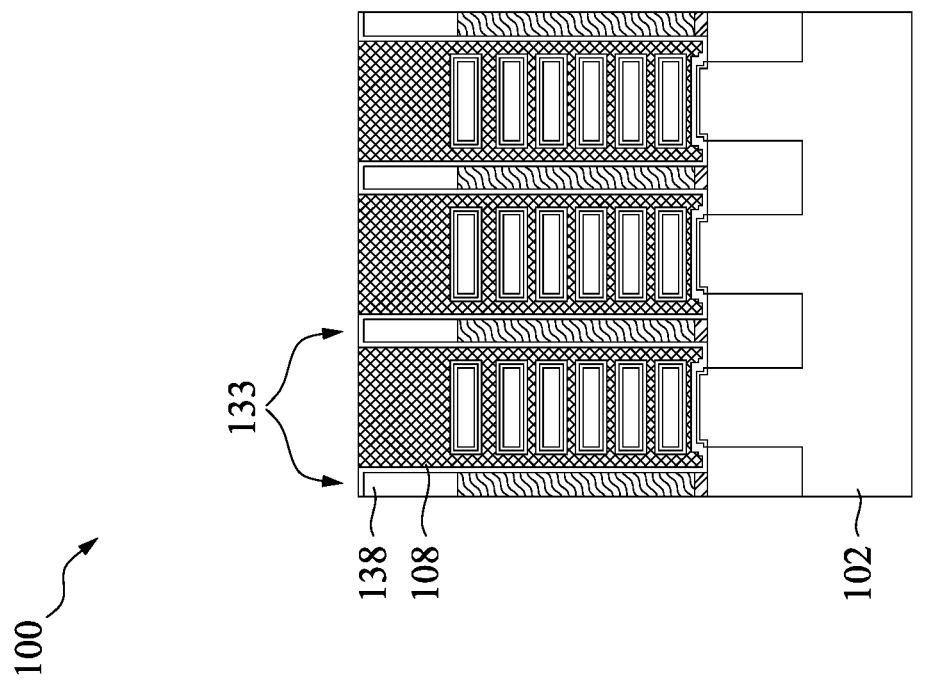
Figure 6J:
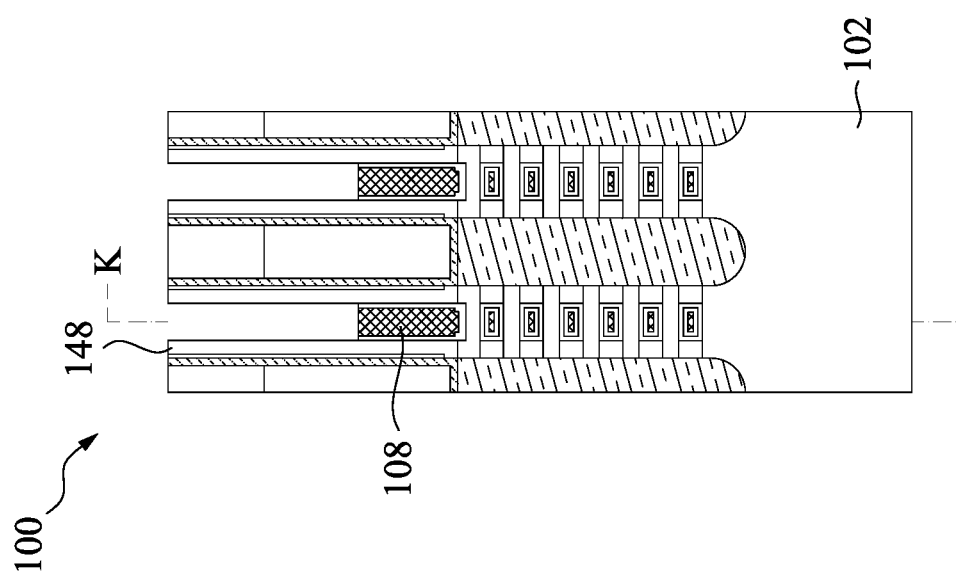
Figure 6M:
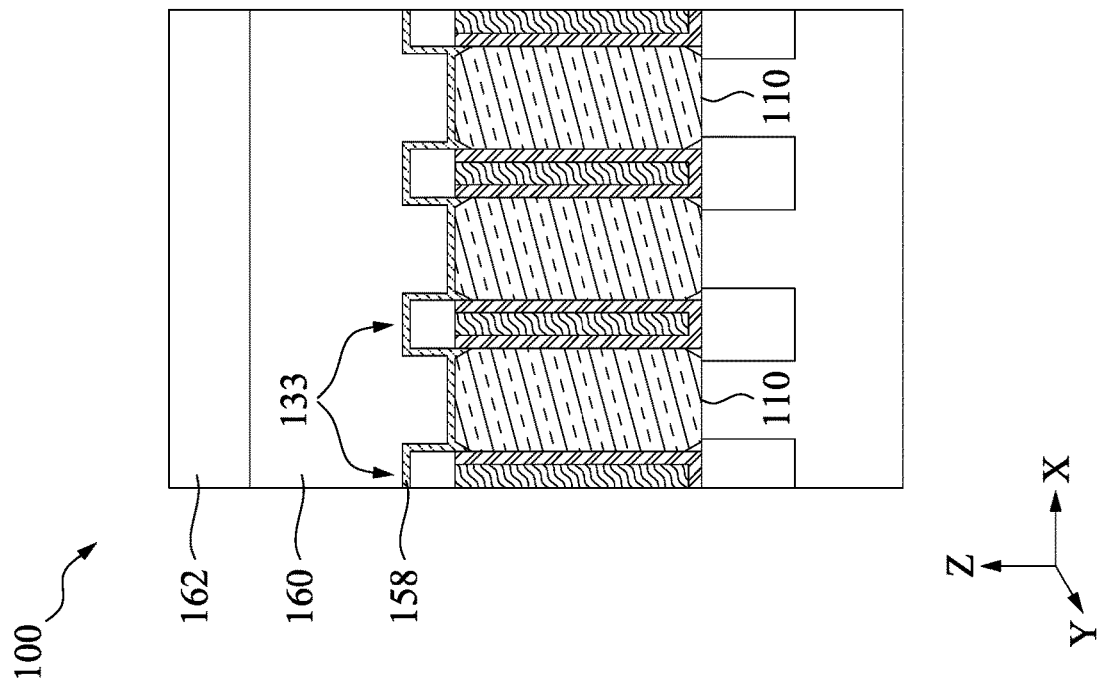
Figure 6L:
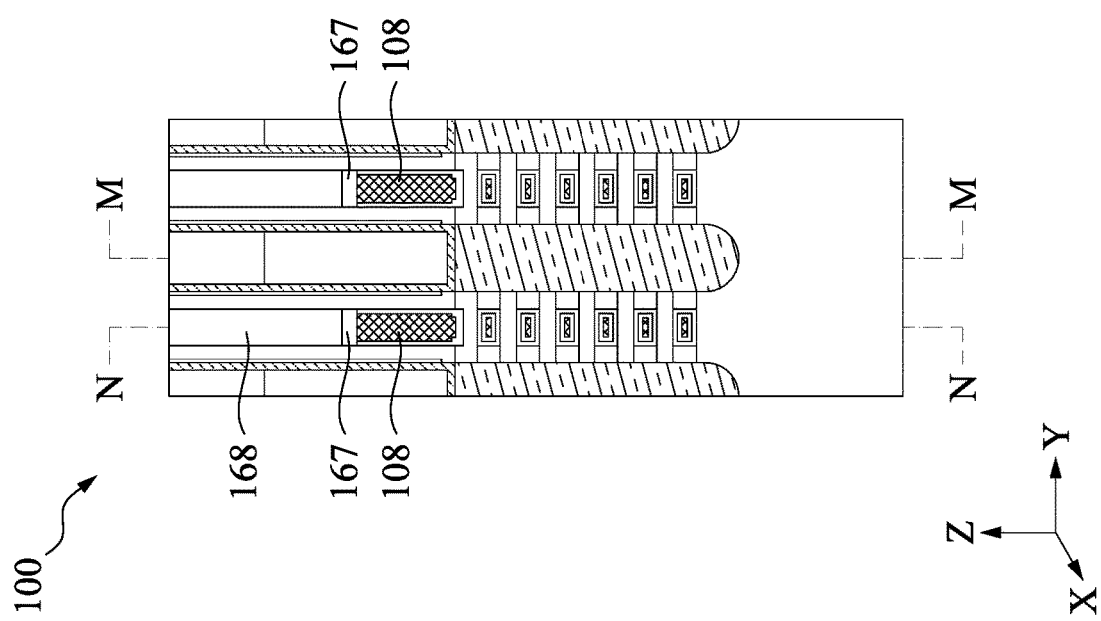
Figure 6N:
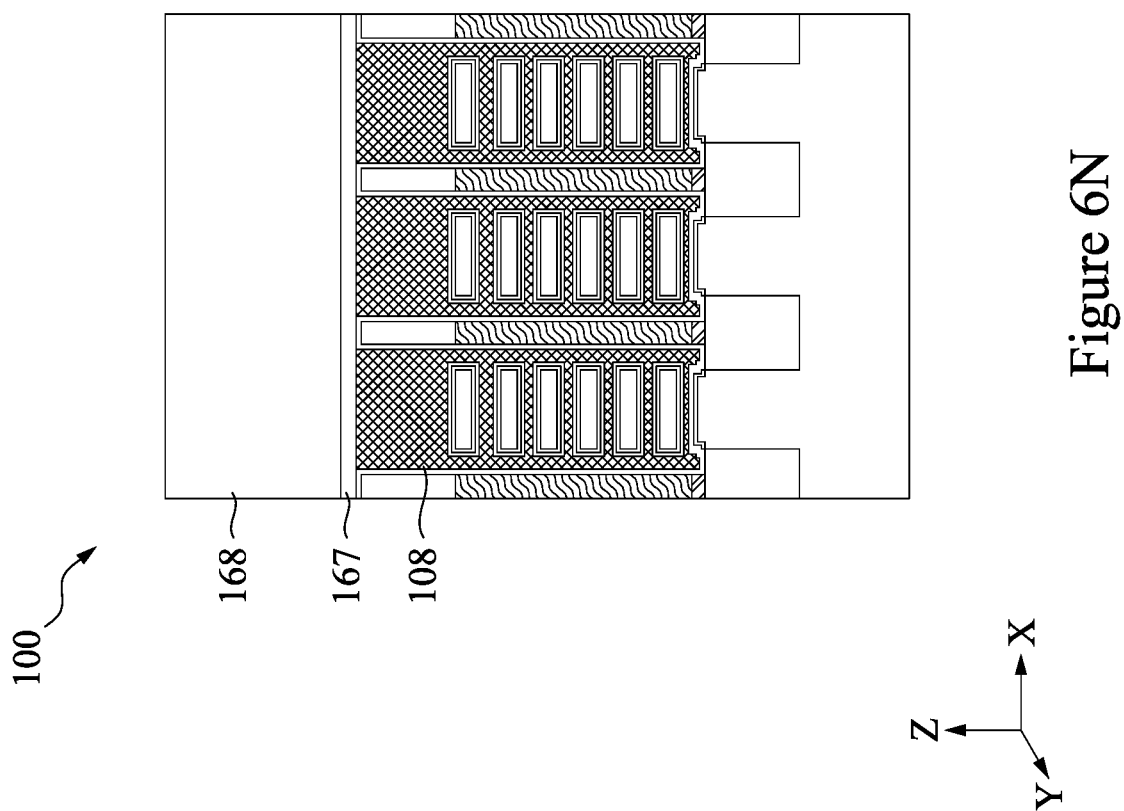
Figure 6P:
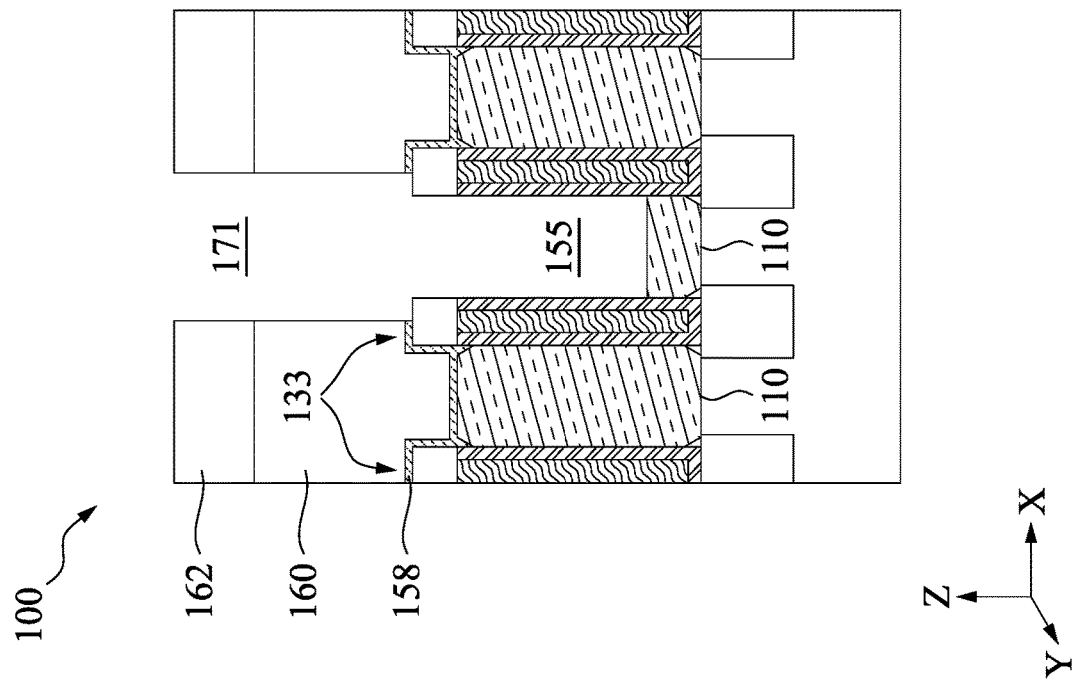
Figure 6O:
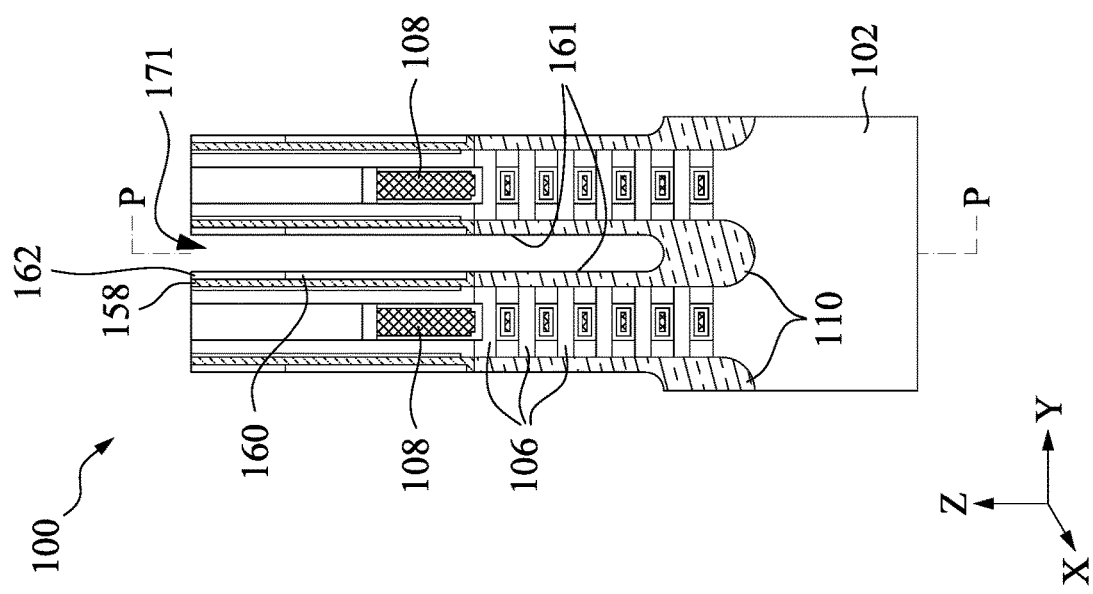
Figure 6R:
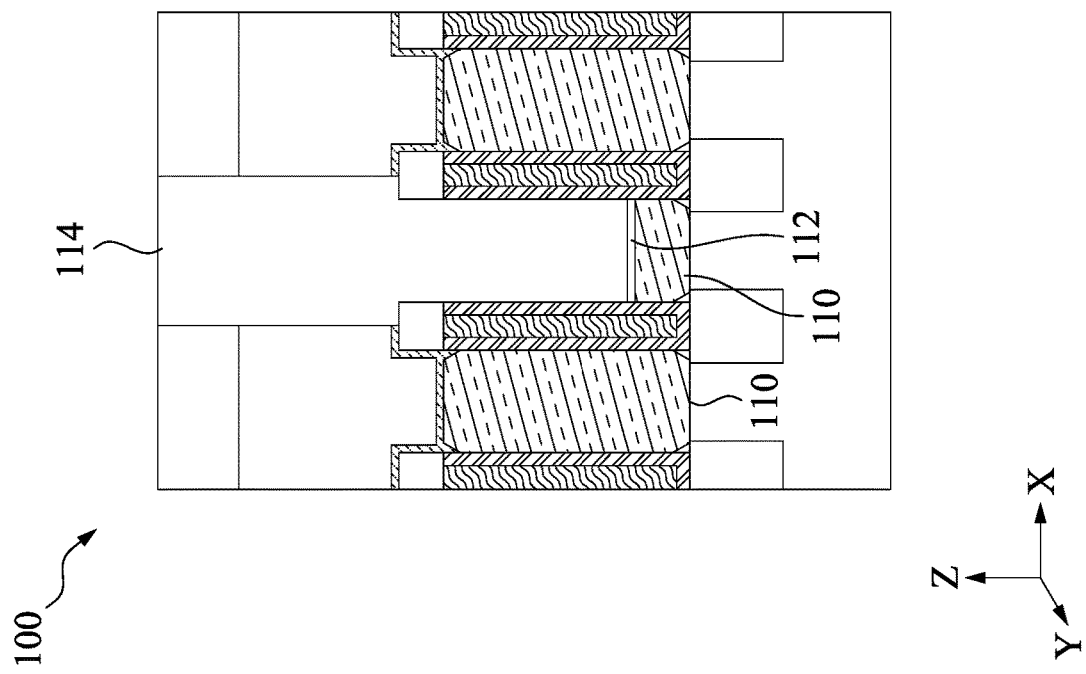
Figure 6Q:
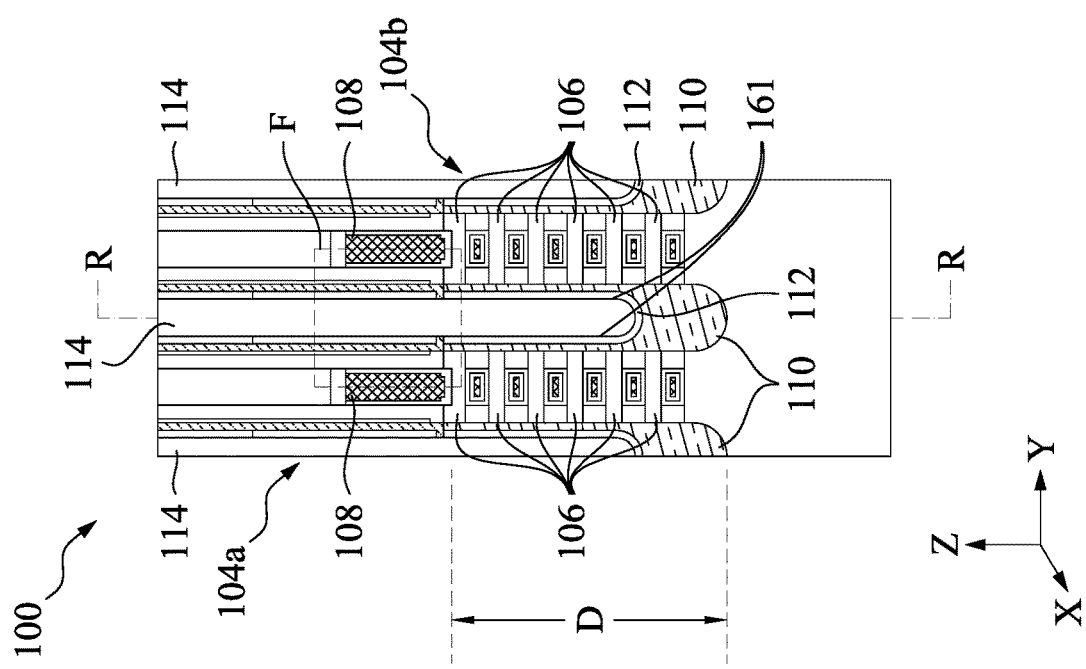
Figure 6S:
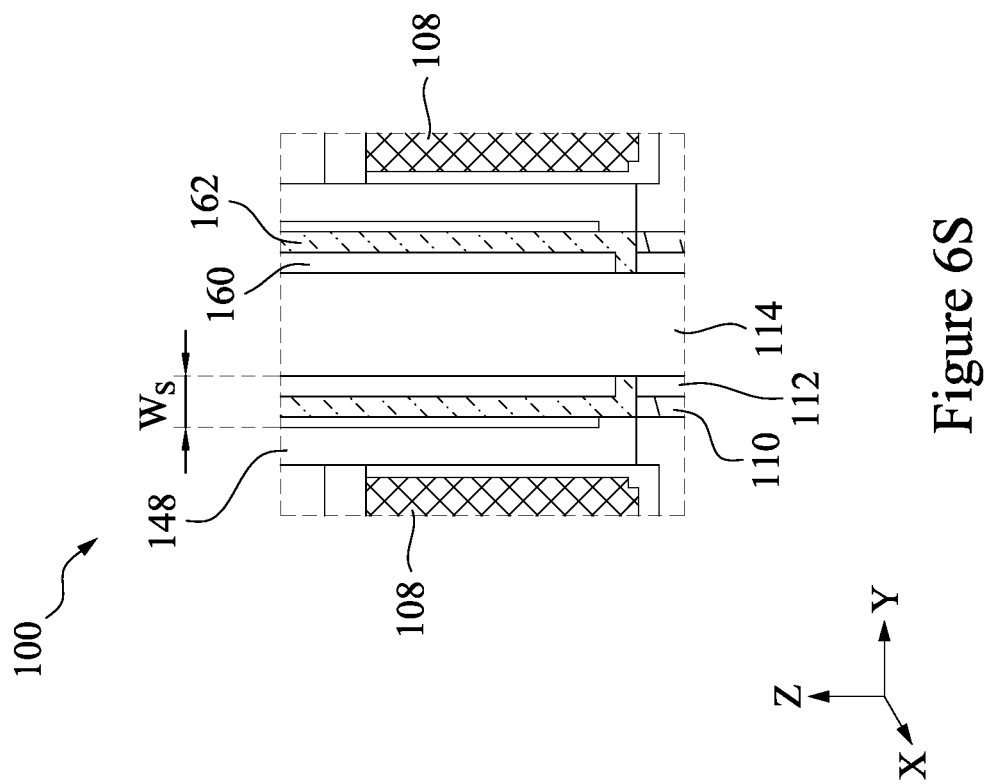

FIGS. 6A-6S illustrate a process for forming an integrated circuit 100, in accordance with some embodiments. FIG. 6A represents a processing step that takes place after the stage of processing shown in FIG. 2M. The integrated circuit 100 of FIGS. 6A-6S may utilize, as a foundation, the same processes described in relation to FIGS. 2A-2M before departing from them. FIG. 6A is an X-view of the integrated circuit 100, in accordance with some embodiments. In FIG. 6A source/drain regions 110 have been formed. The source/drain regions 110 include a semiconductor material. The semiconductor material can include a monocrystalline semiconductor material. The semiconductor material can include Si, SiGe, or other semiconductor materials.

The source/drain regions 110 can be epitaxially grown from the semiconductor nanostructures 106 and from the substrate 102. The source/drain regions 110 can be doped with N-type dopants species in the case of N-type transistors. The source/drain regions 110 can be doped with P-type dopant species in the case of P-type transistors. The doping can be performed in-situ during the epitaxial growth. The source/drain regions 110 can have different dimensions, shapes, materials, and deposition processes than described above without departing from the scope of the present disclosure.

FIG. 6B is an X-view of the integrated circuit 100 taken along cut lines B of FIG. 6A, in accordance with some embodiments. The view of FIG. 6B illustrates the source/drain regions 110 in the trenches 150 between adjacent hybrid fin structures 133.

FIG. 6C as is a Y-view of the integrated circuit 100, in accordance with some embodiments. A dielectric layer 158 has been deposited on sidewalls of the gate spacer layers 148 and on top of the source/drain regions 110, the hybrid fin structure 133 and the high-K dielectric layer 138. The dielectric layer 158 can include silicon nitride or another suitable material and can be deposited by ALD, CVD, or PVD. A dielectric layer 160 has been deposited on the dielectric layer 158. A dielectric layer 160 can include silicon oxide or another suitable material and can be deposited by ALD, CVD, or PVD. The dielectric layer 162 has been deposited on the dielectric layer 158. The dielectric layer 162 can include silicon nitride, SiCON, or other suitable dielectric materials can be deposited by ALD, CVD, or PVD. Other materials and deposition processes can be utilized for the dielectric layers 158, 160, and 162 without departing from the scope of the present disclosure.

FIG. 6D is an X-view of the integrated circuit 100 taken along cut lines D of FIG. 6C, in accordance with some embodiments. The view of FIG. 6D illustrates that the dielectric layers 158, 160, and 162 have been deposited on the hybrid fin structures 133.

FIG. 6E is a Y-view of the integrated circuit 100, in accordance with some embodiments. In FIG. 6E, the dummy gates 147 have been removed. The removal of the dummy gates 147 leaves the gate spacers 148. The removal of the dummy gates 147 can be accomplished and multiple etching steps. The multiple etching steps may first remove the dielectric layer 146, then the dielectric layer 144, then the polysilicon layer 142, then the dielectric layer 140. The result is that a void 164 is formed in place of the dummy gates 147. Various other processes can be performed to remove the dummy gate structures 147 without departing from the scope of the present disclosure.

In FIG. 6E, the sacrificial semiconductor nanostructures 151 have been removed. The sacrificial semiconductor nanostructures 151 can be removed after removal of the dummy gates 147. The sacrificial semiconductor nanostructures 151 can be removed with an etching process that selectively etches the sacrificial semiconductor nanostructures 151 with respect to the semiconductor nanostructures 106 and the inner spacers 154. Removal of the sacrificial semiconductor nanostructures 151 extends the void 164 between the semiconductor nanostructures 106. Various other processes can be utilized to remove the sacrificial semiconductor nanostructures 151 without departing from the scope of the present disclosure.

FIG. 6F corresponds to an X-view of the integrated circuit 100 taken along cut lines F from FIG. 6E. The view of FIG. 6F illustrates the void 164 extending between sacrificial semiconductor nanostructures 106.

FIG. 6G corresponds to the X-view of FIG. 6F, in accordance with some embodiments. In FIG. 6G, an etching processes been performed to widen the void 164 along the X direction. The etching process can include reducing the width of the hybrid fin structures 133 by thinning the dielectric layer 138, substantially removing the dielectric layer 134, and thinning the dielectric layer 136. The dielectric layer 134 remains only directly below the dielectric layer 136. The etching process can include patterning a mask on the hybrid fin structures 133 and etching the hybrid fin structures 133 in the presence of the mask. Other processes can be utilized to widen the voids 164 without departing from the scope of the present disclosure.

FIG. 6H is an X-view of the integrated circuit 100, in accordance with some embodiments. In FIG. 6H, a gate dielectric 166 has been deposited on the exposed surfaces of the semiconductor nanostructures 106. The gate dielectric 166 may can be formed substantially as described in relation to FIG. 2W.

After deposition of the gate dielectric 166, a gate electrode 108 is formed by depositing a gate metal in the voids 164. The gate electrode 108 can be formed substantially as described in relation to FIG. 2W.

Although the gate electrode 108 is shown as a single metal layer, in practice the gate electrode 108 may include multiple metal layers. For example, the gate electrode 108 may include one or more very thin work function layers in contact with the gate dielectric 166. The thin work function layers can include titanium nitride, tantalum nitride, or other conductive materials suitable for providing a selected work function for the transistors. The gate electrode 108 can further include a gate fill material that corresponds to the majority of the gate electrode 108. The gate fill material can include cobalt, tungsten, aluminum, or other suitable conductive materials. The layers of the gate electrode 108 can be deposited by PVD, ALD, CVD, or other suitable deposition processes.

FIG. 6I is a Y-view of the integrated circuit 100 at the stage of processing of FIG. 6H, in accordance with some embodiments. FIG. 6I illustrates the cut line H from which the view of FIG. 6H is taken. FIG. 6I illustrates the gate electrode 108 between the gate spacers 148 and between the semiconductor nanostructures 106 and the inner spacers 154.

FIG. 6J is a Y-view of the integrated circuit 100, in accordance with some embodiments. In FIG. 6J an etching process has been performed to recess the gate electrode 108. In particular, the gate electrode 108 is recessed such that the top surface of the gate electrode 108 is below a top surface of the gate spacer 148. The gate electrode 108 can be recessed by a timed etching process or by other suitable processes.

FIG. 6K is an X-view of the integrated circuit 100 taken along cut lines K of FIG. 6J, in accordance with some embodiments. FIG. 6K illustrates that the gate electrode 108 is recessed to a level of the hybrid fins 133. The hybrid fins 133 can act as an etch stop for the gate electrode 108. Alternatively, the hybrid fins 133 can be recessed with the gate electrode 108. The recessing of the gate electrodes 108 has the effect of electrically isolating gate electrodes of different transistors from each other.

FIG. 6L is a Y-view of the integrated circuit 100, in accordance with some embodiments. In FIG. 6N, a metal layer 167 has been deposited on the gate electrodes 108. The metal layer 167 can include tungsten, aluminum, titanium, copper, gold, tantalum, or other suitable conductive materials. The metal layer 167 can be deposited by ALD, PVD, or CVD. Other materials and deposition processes can be utilized for the metal layer 167. In FIG. 6L a cap layer 168 has been deposited on top of the metal layer 167. The cap layer 168 can include one or more of SiCN, SiN, or SICON. The cap layer 168 can be deposited by CVD, ALD, or other suitable processes.

FIG. 6M is an X-view of the integrated circuit 100 taken along cut lines M of FIG. 6L, in accordance with some embodiments. FIG. 6M illustrates the source/drain regions 110 filling the trenches 150. FIG. 6M also illustrates the dielectric layers 158, 160, and 162 on the source/drain regions 110.

FIG. 6N is an X-view of the integrated circuit 100 taken along cut lines N of FIG. 6L, in accordance with some embodiments. FIG. 6N illustrates that the metal layer 167 can electrically connect the gate electrodes 108. Alternatively, the metal layer 167 may not be present so that the gate electrodes 108 remain isolated. In some cases, the metal layer 167 may be patterned to electrically connect some gate electrodes 108 without electrically connecting other gate electrodes 108.

FIG. 6O is a Y-view of the integrated circuit 100, in accordance with some embodiments. In FIG. 6O, a trench 171 has been etched in the dielectric layers 158, 160, and 162 between adjacent gate electrodes 108. The etching process retains a selected width of the dielectric layers 158, 160, and 162. The width is selected so that a sufficient width of source/drain material remains on the sidewalls 157 of the trench 150 that was previously performed. In some embodiments, the width may be between 2 nm and 15 nm. The etching process can include a single etching step or multiple etching steps. The etching steps etch anisotropically in the downward direction. The etching steps can include wet etches, dry etches, or other types of etching processes.

In FIG. 6O, a slot 155 or trench is formed in the source/drain region 110. The slot 155 or trench can be formed by performing an etching process after etching the dielectric layers 158, 160, and 162 as described above. The slot or trench 155 may be considered as an extension of the trench 171 into the source/drain region 110. The etching process for the slot 155 is an anisotropic etching process that etches in the downward direction. The etching process to form the slot 155 or trench in the source/drain regions can include a timed etch. The timed etch has a duration selected to ensure that a portion of the source/drain region 110 remains on the substrate 102.

The etching processes described in relation to FIG. 6O can be performed in conjunction with a photolithography process. The photolithography process patterns a mask on the integrated circuit 100. The pattern of the mask exposes portions of the dielectric layer 162. After the mask has been formed, the etching process to remove the dielectric layers 162, 160, and 158 is performed in the presence of the mask. The etching of the source/drain region 110 to form the slot 155 may also be performed in the presence of the mask. Alternatively, the mask may be removed and the source/drain regions 110 may be etched using the remaining portions of the dielectric layers 158, 160, and 162 as a mask.

The depth of the trench or slot 155 in the source/drain region 110 may be between 1 nm and 100 nm. The depth of the trench or slot 155 is based, in part, on the number of semiconductor nanostructures 106 that are present. For larger numbers of semiconductor nanostructures 106, the slot 155 or trench can be formed to a greater depth. Other processes or dimensions can be utilized performing the trench 171 and the slot 155 without departing from the scope of the present disclosure.

FIG. 6P is an X view of the integrated circuit 100 of FIG. 6O, in accordance with some embodiments. The view of FIG. 6O is taken along cut lines P from FIG. 6O. FIG. 6P illustrates that the patterning process to define the trenches 171 does not form the trenches 171 above every source/drain region 110. Instead, the pattern of the mask is selected so that slots or trenches 155 are formed in some source/drain regions 110 but not in others. Alternatively, the slots or trenches 155 may be formed in all source/drain regions 110.

FIG. 6Q is a Y-view of an integrated circuit 100, in accordance with some embodiments. In FIG. 6Q a silicide 112 has been formed on the source regions 110. The silicide 112 is formed on the exposed surfaces on the source/drain regions 110 and in the slots 155 between adjacent portions of the source/drain regions 110. The silicide 112 extends downward along sidewalls 161 of the source/drain regions 110 and is positioned on the bottom of the slots 155.

The silicide 112 can be formed on the source/drain regions 110. In an example in which the source/drain regions 110 include silicon, the silicide 112 can include nickel silicide, copper silicide, tungsten silicide, titanium silicide, or other silicides. The silicide 112 can be grown by performing a high-temperature annealing process in the presence of the metal and the silicon from which the silicide 112 is formed. The result of the silicide growth process is that silicide 112 grows from all exposed surfaces of the source/drain regions 110. The silicide 112 can include other materials and deposition processes without departing from the scope of the present disclosure.

The silicide 112 extends downward alongside the source/drain regions 110. In some embodiments, the downward extending finger or portion of the silicide 112 extends far enough downward that a line drawn from the lowest semiconductor nanostructure 106 in the Y direction will contact the silicide 112. The result is that electrical currents only at the cross a short distance of high resistance source/drain material before encountering the highly conductive silicide 112. Further details regarding the benefits of the silicide 112 will be discussed below.

In some embodiments, the silicide 112 has a thickness between 2 nm and 10 nm. The thickness of the silicide corresponds to the Y dimension of the downward extending portion of the silicide 112 in the slot between the source/drain regions 110 and to the vertical thickness of the silicide 112 on top of the source/drain regions 110. The vertical depth of the downward extending portion of the silicide 112 can be between 1 nm and 100 nm, depending on the depth of the slot 155. The larger the number of semiconductor nanostructures 106, the greater the depth of the silicide 112 in the Z direction. In the example of FIG. 6Q, the silicide 112 has a U-shape. The Figures illustrate that the slot 155 does not extend as deep as the lowest semiconductor nanostructure 106. However, in some embodiments the slot 155 can extend to a depth equal to or greater than the depth of the lowest semiconductor nanostructure 106. In these cases, the silicide 112 extends to a depth greater than or equal to the depth of the lowest semiconductor nanostructure 106. This is because the silicide 112 is formed conformally on the source/drain region 110. The silicide 112 can have other dimensions and shapes without departing from the scope of the present disclosure.

In FIG. 6Q, source and drain contacts 114 have been formed on the silicide 112 in the slot 155. The source and drain contacts 114 can include conductive material such as tungsten, cobalt, copper, titanium, aluminum, or other suitable conductive materials by which voltages can be applied to the source/drain regions 110. The source and drain contacts 114 can be formed by PVD, CVD, ALD, or other suitable deposition processes. Other materials and deposition processes can be utilized for the source and drain contacts 114 without departing from the scope of the present disclosure.

The depth to which the source and drain contacts 114 extend is based on the depth of the slot 155 formed in the source/drain region 110 and the thickness of the silicide 112. The greater the depth of the slot 155, the deeper the extension of the source/drain contacts 114. In some embodiments, the source/drain contacts 114 may extend to a depth that is between 20% and 70% of the depth of the source/drain regions 110. In other words, the slot 155 may extend a distance from the top of the source/drain region 110 equal to between 20% and 70% of the total extent of the source/drain region 110 in the Z direction. This distance may be sufficient to ensure that the resistance between the lower semiconductor nanostructures 106 and the source/drain contacts 114 is sufficiently small. This distance may, in turn, be sufficient to ensure that there is low power dissipation in heat generation in the transistor 104.

The downward extent of the source/drain contacts 114 may depend on the number of semiconductor nanostructures 106. The larger the number of semiconductor nanostructures 106, the greater the downward extent of the source/drain contacts 114. In some cases, the source/drain contacts 114 may extend to a depth greater than or equal to the lowest semiconductor nanostructure 106.

In FIG. 6Q, processing of the transistors 104 is complete. FIG. 6Q illustrates a first transistor 104a and a second transistor 104b. The first transistor 104a includes the semiconductor nanostructures 106 and the gate electrode 108 on the left side. The second transistor 104b includes the semiconductor nanostructures 106 and the gate electrode 108 on the right side. The first and second transistors 104a and 104b share a central source/drain region 110. The source/drain region 110 on the left is a source/drain region 110 of the transistor 104a. The source/drain region 110 on the right is a source/drain region 110 of the transistor 104b.

The gate all around transistors 104 functions by applying biasing voltages to the gate electrode 108 and to the source and drain contacts 114. The biasing voltages cause a channel current to flow through the semiconductor nanostructures 106 between the source/drain regions 110. Accordingly, the semiconductor nanostructures 106 corresponds to channel regions of the gate all around transistors 104.

The formation of the source/drain regions 110 and the downward extending silicide 112 and source/drain contacts 114 result in various benefits. As can be seen in FIG. 6Q, the semiconductor nanostructures 106 are arranged in a vertical stack above the substrate 102. In one example, when a transistor 104 is enabled, current flows from a source/drain contact 114 through the silicide 112, through the source/drain region 110, through each of the semiconductor nanostructures 106, through the other source/drain region 110, through the other silicide 112, to the other source/drain contact 114.

Current that flows through the bottom semiconductor nanostructure 106 has a longer path than current that flows through the top semiconductor nanostructure 106. In a situation in which the silicide 112 and the source/drain contact 114 does not extend downward along the lateral edge of the source/drain regions 110, the current that flows through the bottom semiconductor nanostructure 106 will take a relatively long path through the source/drain regions 110. The source/drain regions 110 are not as conductive as the silicide 112 and the source/drain contact 114. Accordingly, a longer path through the source/drain regions 110 corresponds to a larger electrical resistance, greater power dissipation, and greater heat generation. However, the transistor 104 of FIG. 6Q includes silicide 112 that extends downward along the lateral edge of the source/drain regions 110. The result is that there is a relatively small distance between the lowest semiconductor nanostructures 106 and the silicide 112. Because the silicide 112 is highly conductive compared to the source/drain regions 110, current that flows through the lowest nanostructures 106 will primarily flow through the path of least resistance downward through the source/drain contact 114 and then laterally through the silicide 112 and the source/drain region 110 to the lowest nanostructures 106. This reduces the overall resistance, power dissipation, and heat generation in comparison to a situation in which the silicide 112 and the source/drain contact 114 are positioned only and the tops of the source/drain regions 110.

FIG. 6Q illustrates six semiconductor nanostructures 106 in each transistor 104. However, the configuration of the source/drain contact 114 enables the use of more semiconductor nanostructures 106 without undue electrical resistance and corresponding power dissipation and heat generation. Accordingly, the transistors 104 can include larger numbers of semiconductor nanostructures 106 than shown in FIG. 6Q. However, the transistors 104 can include fewer or more semiconductor nanostructures 106 than shown in FIG. 6Q without departing from the scope of the present disclosure.

FIG. 6R is an X-view of the integrated circuit 100 taken along cut lines R of FIG. 6R, in accordance with some embodiments. The view of FIG. 6R illustrates the silicide 112 and the source/drain contact 114 in the slot 155 on top of the bottom portion of the source/drain regions 110. The source/drain contact 114 may have a width in the X direction between 5 nm and 20 nm, though other dimensions can be utilized without departing from the scope of the present disclosure.

FIG. 6S is an enlarged view of a portion of the transistors 104a and 104b of FIG. 6Q, in accordance with some embodiments. The remaining portions of the dielectric layers 158, 160, and 162 a width Ws. The width Ws can be between 2 nm and 15 nm. In other words, the distance between the source/drain contact 114 and the gate spacer 148 can be between 2 nm and 15 nm. The total width of the source/drain contact 114 can be between 5 nm and 20 nm, depending on the width Ws. The width Ws can be selected to ensure that a sufficient lateral width of the source/drain region 110 remains to allow formation of the silicide 112. Other widths can be utilized without departing from the scope of the present disclosure.

Figure 7:
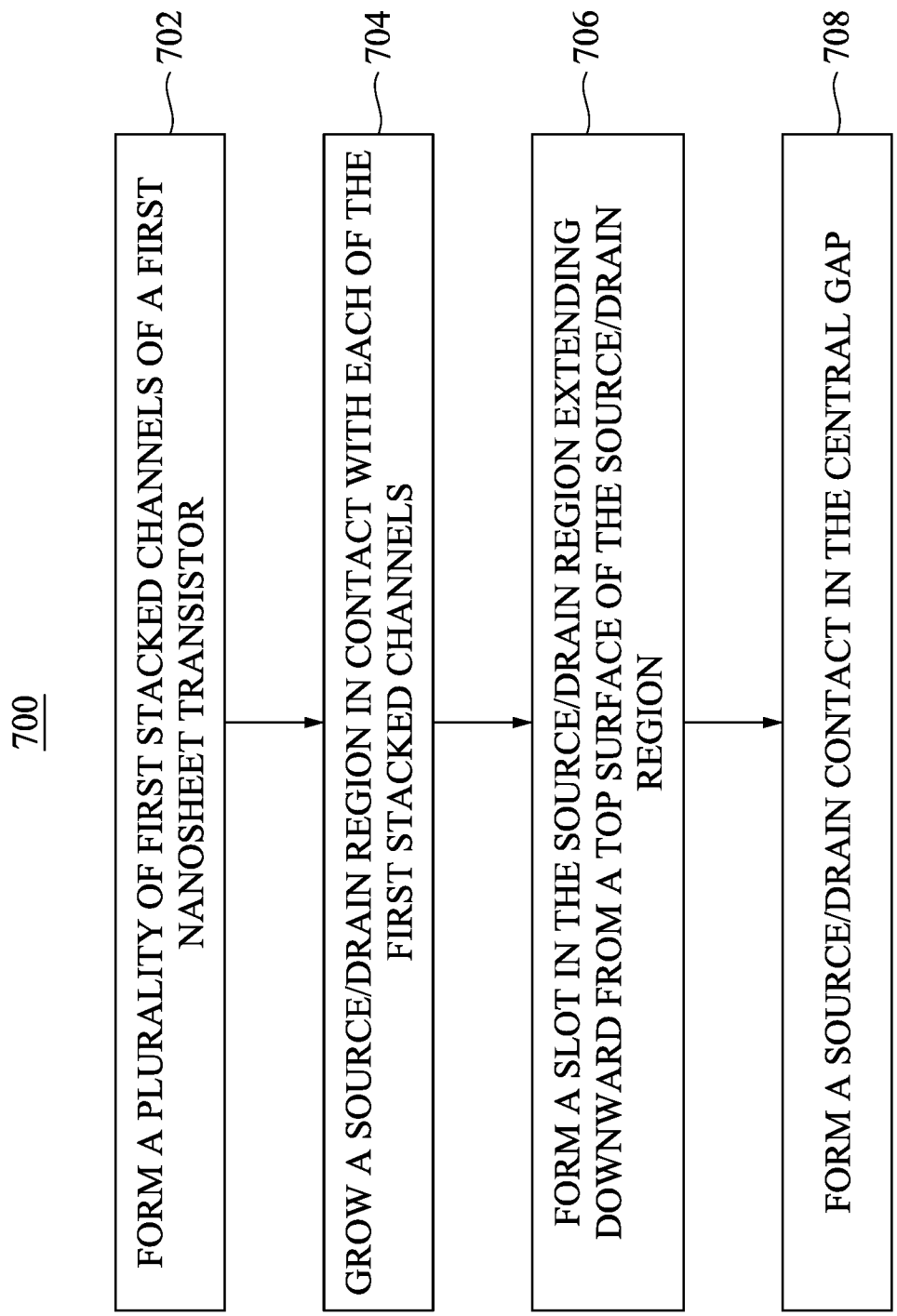
FIG. 7 is a flow diagram of a process for forming an integrated circuit, in accordance with some embodiments.

FIG. 7 is a flow diagram of a method 700 for forming an integrated circuit, in accordance with some embodiments. The method 700 can utilize processes, structures, or components described in relation to FIGS. 5A-6S. At 702, the method 700 includes forming a plurality of first stacked channels of a first nanostructure transistor. One example of a first nanostructure transistor is the transistor 104 of FIG. 5A. One example of first stacked channels are the semiconductor nanostructure 106 of FIG. 5A. At 704, the method 700 includes growing a source/drain region in contact with each of the first stacked channels. One example of a source/drain region is the source/drain region 110 of FIG. 5A. At 706, the method 700 includes forming a slot in the source/drain region. One example of a slot is the slot 155 of FIG. 6O. At 708, the method 700 includes forming a source/drain contact in the slot. The bottom of the source/drain contact in the slot is lower than at least one of the first stacked channels. One example of a source/drain contact is the source/drain contact 114 of FIG. 5A.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions in contact with the nanostructures. A silicide is formed on the source/drain regions. Source/drain metallizations contact the silicide. The silicide extends downward along the lateral surfaces of the source/drain regions, rather than being positioned only on the top of the source/drain regions. Because the silicide extends downward along the source/drain regions, there is a relatively small distance between each nanostructure and the silicide.

The configuration of the source/drain regions and the silicide provides several benefits. First, the electrical resistance between the lowest nanostructures and the silicide is greatly reduced with respect to configurations in which the silicide is formed only at the top of the source/drain regions, resulting in reduced power consumption. Second, a large number of nanostructures can be formed without negatively impacting the electrical resistance between lower nanostructures and the silicide. With larger numbers of nanostructures, currents can be conducted through nanostructure transistors without generating excessive amounts of heat. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

In some embodiments, an integrated circuit includes a substrate and a first nanostructure transistor. The first nanostructure transistor includes a plurality of first stacked channels, a source/drain region in contact with the first semiconductor nanostructures and having a sidewall, and a silicide on a sidewall of the source/drain region and extending lower than at least one of the first channels.

In one embodiment, a method includes forming a stack of first semiconductor nanostructures corresponding to channel regions of a first nanostructure transistor, forming a source/drain region in contact with each of the first semiconductor nanostructures and having a sidewall, and forming a silicide in contact with a top surface and a sidewall of the source/drain region and extending lower than at least one of the semiconductor nanostructures.

In one embodiment, a device includes a first transistor having a plurality of first semiconductor nanostructures corresponding to channel regions of the first transistor. The integrated circuit includes a second transistor including a plurality of second semiconductor nanostructures corresponding to channel regions of the second transistor. The integrated circuit includes a source/drain region in contact with the first semiconductor nanostructures and the second semiconductor nanostructures. The integrated circuit includes a silicide in contact with the source/drain region and positioned between at least one of the first semiconductor nanostructures and one of the second semiconductor nanostructures.

In some embodiments, an integrated circuit includes a substrate and a first transistor including a plurality of first stacked channels over the substrate. The first transistor also includes a source/drain region in contact with each of the first stacked channels and including a slot extending downward from a top surface of the source/drain region. The first transistor includes a source/drain contact extending into a slot in the source/drain region.

In some embodiments, a method includes forming a plurality of first stacked channels of a first nanostructure transistor and growing a source/drain region in contact with each of the first stacked channels. The method includes forming a slot in the source/drain region and forming a source/drain contact in the slot, wherein a bottom of the source/drain contact in the slot is lower than at least one of the first stacked channels.

In some embodiments, an integrated circuit includes a first transistor having a plurality of first semiconductor nanostructures corresponding to channel regions of the first transistor. The integrated circuit includes a second transistor including a plurality of second semiconductor nanostructures corresponding to channel regions of the second transistor. The integrated circuit includes a source/drain region in contact with the first semiconductor nanostructures and the second semiconductor nanostructures and defining a slot between the first and second semiconductor nanostructures. The integrated circuit includes a source/drain contact in the slot and having a bottom that is lower than at least one of the first semiconductor nanostructures and at least one of the second semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a substrate; and a first nanostructure transistor including:
 a plurality of first stacked channels;
 a source/drain region in contact with the first semiconductor nanostructures and having a sidewall;
 a gate electrode above the first stacked channels;
 a gate spacer layer on a sidewall of the gate electrode above the stacked channels;
 a source/drain contact having a sidewall extending lower than at least one of the first channels; and
 a silicide having a first portion in contact with a sidewall of the source/drain region and the sidewall of the source/drain contact and extending lower than at least one of the first channels, and a second portion on a top surface of the source/drain region and in contact with a sidewall of the gate spacer layer.

2. The integrated circuit of claim 1, wherein the silicide extends lower than all of the first channels.

3. The integrated circuit of claim 1, wherein the source/drain region has a U shape.

4. The integrated circuit of claim 3, wherein the silicide has a T shape.

5. The integrated circuit of claim 3, wherein the source/drain contact extends lower than at least two of the first channels.

6. The integrated circuit of claim 1, further comprising a second nanostructure transistor including a plurality of second stacked channels, wherein the source/drain region is in contact with the second stacked channels.

7. The integrated circuit of claim 6, wherein the silicide is positioned between the first and second semiconductor nanostructures.

8. The integrated circuit of claim 1, wherein source/drain region and the silicide define a central gap and the source/drain contact fills the central gap.

9. A method, comprising:
 forming a stack of first semiconductor nanostructures corresponding to channel regions of a first nanostructure transistor;
 forming a source/drain region in contact with each of the first semiconductor nanostructures and having a sidewall;
 forming a gate spacer layer above the stack of first semiconductor nanostructures; and
 forming a silicide having a first portion in contact with a top surface of the source/drain region and in contact with a sidewall of the gate spacer layer and a second portion in contact with a sidewall of the source/drain region and extending lower than at least one of the semiconductor nanostructures;
 forming a source/drain contact having a first portion in contact with the first portion of the silicide and a second portion in contact with the second portion of the silicide; and
 forming a gate electrode above the stack of first semiconductor nanostructures adjacent to the gate spacer layer.

10. The method of claim 9, further comprising forming the source/drain region with a conformal deposition process.

11. The method of claim 10, further comprising forming the source/drain region with a central gap, wherein the sidewall is in the central gap.

12. The method of claim 9, further comprising forming a stack of second semiconductor nanostructures corresponding to channel regions of a second transistor, wherein the source/drain region is a joint source/drain region of the first and second transistors.

13. The method of claim 12, further comprising forming the source/drain region on sidewalls of the second semiconductor nanostructures, the source/drain region defining a central gap between the first semiconductor nanostructures and the second semiconductor nanostructures.

14. The method of claim 13, further comprising depositing the silicide in the central gap.

15. The method of claim 14, wherein the silicide extends downward in the central gap below a lowest one of the first semiconductor nanostructures and a lowest one of the second semiconductor nanostructures.

16. The method of claim 9, wherein the source/drain contact extends lower than at least two of the first semiconductor nanostructures.

17. A device, comprising:
 a first transistor including a plurality of first semiconductor nanostructures corresponding to channel regions of the first transistor;
 a gate spacer layer above the plurality of first semiconductor nanostructures;
 a gate electrode above the plurality of first semiconductor nanostructures adjacent to the gate spacer layer;
 a second transistor including a plurality of second semiconductor nanostructures corresponding to channel regions of the second transistor;
 a source/drain region in contact with the first semiconductor nanostructures and the second semiconductor nanostructures;
 a source/drain contact having a sidewall extending lower than at least one of the first semiconductor nanostructures; and
 a silicide having a first portion in contact with a sidewall of the source/drain region and the sidewall of the source/drain contact and positioned between at least one of the first semiconductor nanostructures and one of the second semiconductor nanostructures and having a second portion in contact with a top surface of the source/drain region and in contact with a sidewall of a gate spacer layer.

18. The device of claim 17, wherein the source/drain contact extends lower than at least two of the first semiconductor nanostructures.

19. The device of claim 17, wherein the silicide is between a lowest one of the first semiconductor nanostructures and a lowest one of the second semiconductor nanostructures.

20. The device of claim 17, comprising a high-K gate dielectric layer between the gate electrode and the gate spacer layer.

* * * * *